United States Patent
Hasegawa et al.

(10) Patent No.: US 6,800,421 B2
(45) Date of Patent: Oct. 5, 2004

(54) METHOD OF FABRICATION OF SEMICONDUCTOR INTEGRATED CIRCUIT DEVICE

(75) Inventors: Norio Hasegawa, Hinode (JP); Toshihiko Tanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 217 days.

(21) Appl. No.: 09/996,762
(22) Filed: Nov. 30, 2001

(65) Prior Publication Data

US 2002/0076654 A1 Jun. 20, 2002

(30) Foreign Application Priority Data

Dec. 14, 2000 (JP) ........................................ 2000-380446

(51) Int. Cl.[7] .................................................. G03C 5/00
(52) U.S. Cl. ........................ 430/311; 430/394; 430/396; 430/397; 430/5
(58) Field of Search ............................ 430/311, 5, 394, 430/396, 397

(56) References Cited

U.S. PATENT DOCUMENTS

| | | | |
|---|---|---|---|
| 4,684,971 A | 8/1987 | Payne ........................... 357/42 |
| 5,376,483 A | 12/1994 | Rolfson .......................... 430/5 |
| 5,378,585 A | 1/1995 | Watanabe .................... 430/176 |
| 5,389,474 A | 2/1995 | Iguchi et al. ................... 430/5 |
| 5,418,092 A | 5/1995 | Okamoto ........................ 430/5 |
| 5,556,724 A | 9/1996 | Tarumoto et al. ............... 430/5 |
| 5,656,397 A | * 8/1997 | Imai et al. ...................... 430/5 |
| 5,741,613 A | 4/1998 | Moon et al. ..................... 430/5 |
| 5,795,685 A | * 8/1998 | Liebmann et al. .............. 430/5 |
| 5,948,872 A | 9/1999 | Kioka et al. .................... 430/5 |
| 5,989,760 A | 11/1999 | Mangat et al. ................ 430/22 |
| 2002/0052088 A1 | * 5/2002 | Okamoto et al. ........... 438/377 |

FOREIGN PATENT DOCUMENTS

JP          5-289307          11/1993 ............. G03F/1/08

* cited by examiner

*Primary Examiner*—John A. McPherson
*Assistant Examiner*—Daborah Chacko-Davis
(74) *Attorney, Agent, or Firm*—Antonelli, Terry, Stout & Kraus, LLP

(57) ABSTRACT

In order to shorten the time needed for fabricating semiconductor integrated circuit devices, a wafer is exposed while a chip area with defects of a mask is covered with a masking blade for light shielding.

40 Claims, 45 Drawing Sheets

RM1: PHOTOMASK
MB: MASKING BLADE
(LIGHT SHIELDING BODY)

METHOD OF FABRICATION OF SEMICONDUCTOR INTEGRATED CIRCUIT DEVICE

BACKGROUND OF THE INVENTION

The present invention relates to a technique for use in fabricating a semiconductor integrated circuit device; and, more particularly, the invention relates to a photolithographic (hereafter simply called lithography) technique for transferring a predetermined pattern onto a semiconductor wafer (hereafter simply called a wafer) by exposure processing using a photomask (hereafter simply called a mask) in the fabrication of semiconductor integrated circuit devices.

In the fabrication of semiconductor integrated circuit devices, a lithographic technique is used as a method of transferring a micropattern onto a wafer. In such a lithographic technique, a projection aligner is mainly used to form a device pattern by transferring a pattern of a mask mounted on the projection aligner to a wafer.

The mask used in the projection exposure method has a structure such that a light shielding pattern comprised of a metal film, such as chromium, is disposed over a transparent mask substrate so as to intercept exposing light. For example, the fabrication process is as follows.

First, a metal film made of chromium, which is to serve as a light shielding film, is disposed over a transparent mask substrate, and a resist film that is photosensitive to electron beams is coated thereon. Subsequently, electron beams are irradiated onto predetermined areas on the resist film by an electron beam lithography system, and the resist film is developed to form a resist pattern. Then, the resist pattern is used as an etching mask to etch the underlying metal film, and thereby a light shielding pattern comprised of the metal film is formed. After the remaining electron beam-sensitive resist film is removed, a mask is fabricated through the inspection process for the pattern on the mask.

However, the mask of this configuration has problems in that costs are increased because of a number of fabricating steps, or work dimensional accuracy is decreased because the light shielding pattern is processed by isotropic etching. As a technique which considers such problems, Japanese Patent Laid-Open No. 289307/1993, for example, discloses a technique in which a light shielding pattern is configured on a mask substrate with a resist film utilizing that a predetermined resist film allows the transmittance to be zero percent to an ArF excimer laser.

Additionally, Japanese Patent Laid-Open No. 100655/1991 discloses a technique in which an aperture is configured by two aperture blades disposed with a light transparent part or light shielding part for shaping laser beam light, the two aperture blades are overlaid for use and thereby defects on a mask are repaired. Furthermore, Japanese Patent Laid-Open No. 142309/1995, for example, discloses a technique in which a product pattern image having a partially chipped part that is generated near edges of a wafer is controlled by a reticle blind for double exposure.

However, the inventors found that there are the following problems in the mask technique which uses a resist film as a light shielding pattern.

More specifically, first, there is a problem in that it has not been sufficiently considered to fabricate a mask efficiently in a short time. For example, in custom products, such as an ASIC (Application Specific IC), the man-hours and the period of time required for product development have become longer with the demand for higher performances are, whereas the obsolescence of existing products occurs quickly and product-life cycles are short. Thus, it is desired to shorten the product development and manufacturing time. Accordingly, an important issue is how a mask for use in manufacturing such products can be fabricated efficiently for a short time.

Secondly, there is a problem that further cost reduction of a mask is not considered adequately. Recently, in semiconductor integrated circuit devices, mask costs have become increasing higher and higher for the following reason. More specifically, the reason is that the field of a mask fabrication apparatus has a small market scale and thus it is unprofitable; development expenses or running costs for a lithography system for forming a pattern on a mask or an inspection system for inspecting the pattern are becoming extravagant with the realization of micropatterning and large scale integration of a pattern formed on a mask; and thus prices for a mask have to be increased in order to collect the costs therefor. Additionally, with increased performances of semiconductor integrated circuit devices, the total number of masks required for manufacturing one semiconductor integrated circuit device tends to increase. Therefore, an important issue is how mask costs can be decreased.

SUMMARY OF THE INVENTION

An object of the invention is to provide a technique that is capable of shortening manufacturing time for semiconductor integrated circuit devices.

A further object of the invention is to provide a technique that is capable of reducing costs for a semiconductor integrated circuit device.

The aforesaid and other purposes and novel features of the invention will be apparent from the description in this specification and the accompanying drawings.

Among the aspects and features of the invention disclosed in this application, a brief summary of representative ones is as follows.

That is, the invention is characterized by the fact that a pattern in a plurality of chip areas of a photomask is transferred onto an internal area of a semiconductor wafer, and chip areas including defects, among the plurality of chip areas of the photomask, are shielded with a light shielding body.

Additionally, the invention is characterized by method which has the steps of: transferring a pattern onto a first semiconductor wafer using a photomask disposed with a light shielding pattern comprised of an organic film having a light shielding property to exposing light in a plurality of chip areas and then inspecting the pattern transferred onto the first semiconductor wafer; and performing exposure so as not to transfer defects onto a second semiconductor wafer even though the photomask having the defects is used, by utilizing a result of the inspection in transferring the pattern onto the second semiconductor wafer using the photomask.

BRIEF DESCRIPTION OF THE DRAWINGS

The teachings of the invention can be readily understood by considering the following detailed description in conjunction with the accompanying drawings, in which:

FIG. 7(a) is a section view taken along line A4—A4 shown in FIG. 7(a), representing a modified example of FIG. 7(b);

DETAILED DESCRIPTION OF THE INVENTION

Figure 1:
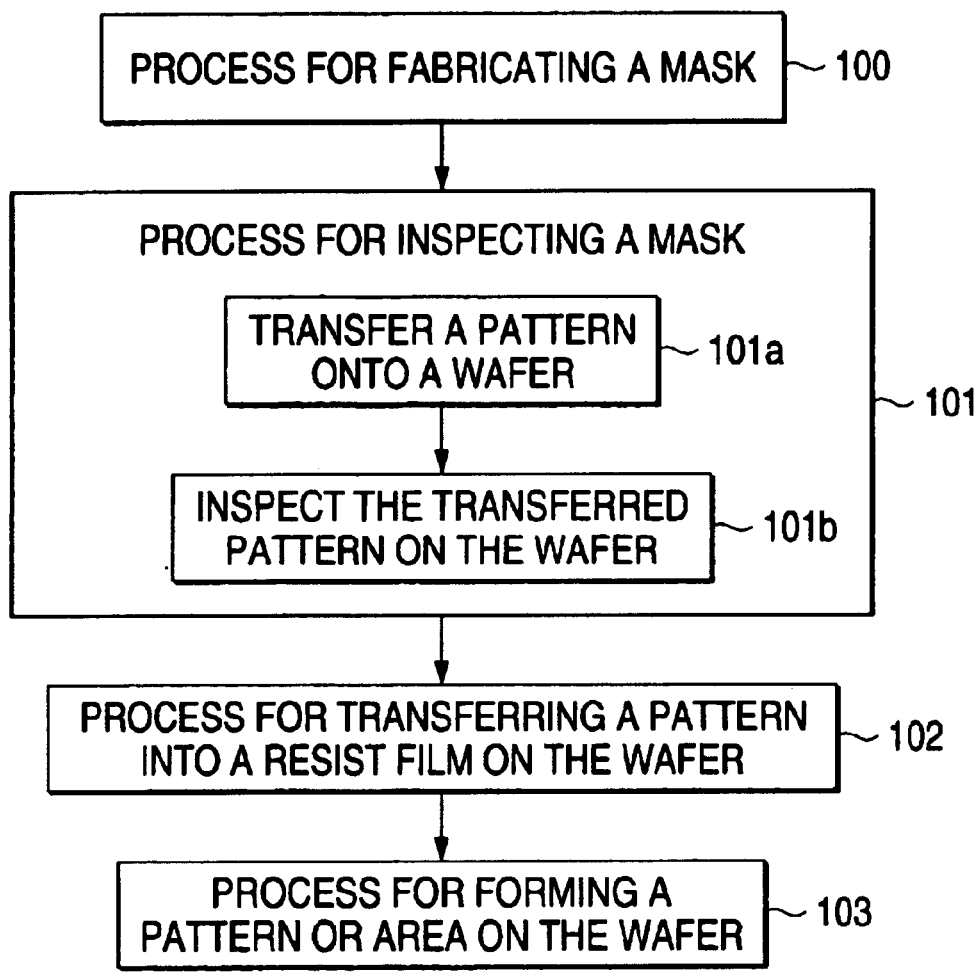
FIG. 1 is a flow chart illustrating one example of a process for fabricating a semiconductor integrated circuit device of one embodiment of the invention.

Prior to describing the invention in detail, the following is a description of the meanings of terms in the application.

1. Mask (Optical mask): it is that a pattern for shielding light or pattern for changing light phases is formed on a mask substrate. It includes a reticle where a pattern a few times greater than an exact size is formed. A first main surface of a mask is a pattern surface where the pattern for shielding light or pattern for changing light phases is formed. A second main surface of a mask is a surface opposite to the first main surface (that is, a back surface).

2. Normal mask: it is a kind of the aforesaid masks. It is called a general mask where a mask pattern is formed of a light shielding pattern comprised of metal and a light transparent pattern on a mask substrate.

3. Resist mask: it is a kind of the aforesaid masks. It is a mask having a light shielding body (a light shielding film, a light shielding pattern and a light shielding area) comprised of an organic film on a mask substrate.

4. A pattern surface of masks (the normal mask and the resist mask) is classified into the following areas. An area where an integrated circuit pattern to be transferred is formed is called an "integrated circuit pattern area" and the outer peripheral area thereof is called a "peripheral area". The integrated circuit pattern area is disposed with a plurality of chip areas.

5. When a "light shielding body", a "light shielding area", a "light shielding film" and a "light shielding pattern" are referred to, it means that they have optical characteristics that transmit light less than 40% of the exposing light irradiated onto the area. Generally, a few percent to less than 30% of light is used. On the other hand, when "transparent", a "transparent film", a "light transparent area" and a "light transparent pattern" are referred to, it means that they have optical characteristics that transmit 60% or greater of exposing light irradiated onto the area. Generally, 90% or greater of light is transmitted.

6. Wafer: it includes a silicon single crystal substrate (generally, it is almost a flat disc), a sapphire substrate, a glass substrate, other insulating, semi-insulating or semiconductor substrates and a composite substrate of these substrates for use in fabricating integrated circuits. Additionally, when a semiconductor integrated circuit device is referred to in the application, it includes not only those fabricated on a semiconductor or insulating substrate, such as a silicon wafer or sapphire substrate, but also those fabricated on other substrates including glass, such as TFTs (Thin-Film-Transistors) and STN (Super-Twisted-Nematic) liquid crystals, except for the case that is particularly excluded.

7. Device surface: it is a main surface of a wafer. It is a surface where device patterns corresponding to a plurality of chip areas are formed thereon by lithography.

8. Transferred pattern: it is a pattern that is transferred onto a wafer by a mask. Specifically, it is a photoresist pattern and a pattern actually formed on a wafer using a photoresist pattern as a mask.

9. Resist pattern: it is called a film pattern in which a photosensitive resin film is patterned by a technique of photolithography. Additionally, this pattern includes a simple resist film having no apertures for appropriate portions.

10. Normal illumination: it is called non-modified illumination. It is called illumination having a relatively uniform light intensity distribution.

11. Modified illumination: it is illumination that reduces illuminance at the center part, including multipole illumination such as oblique illumination, annular illumination, quadrupole illumination and quintet pole illumination, or a super-resolution technique by a pupil filter equivalent thereto.

12. Scanning exposure: it is an exposure method in which a circuit pattern on a mask is transferred onto a desired portion on a wafer by relatively, continuously moving (scanning) a narrow slit-like exposure band in a direction orthogonal to the longitudinal direction of the slit with respect to the wafer and the mask (it may be moved obliquely). A device for conducting the exposure method is called a scanner.

13. Step-and-scan exposure: it is a method for exposing the whole portion to be exposed on a wafer by combining the scanning exposure and stepping exposure. It falls in a subordinate concept of the scanning exposure.

14. Step-and-repeat exposure: it involves repeatedly stepping a wafer with respect to a projection image of a circuit pattern on a mask, and an exposure method of transferring the circuit pattern on the mask onto a desired portion on the wafer. A device for performing the exposure method is called a stepper.

In the following embodiments, thee features of the invention will be described as divided into a plurality of sections or embodiments for convenience, if necessary. However, except when specifically excepted, they are not independent each other, they have a relationship where one is a modified example, detail and supplementary explanation for a part or all of the other.

Additionally, in the following embodiments, when the numerals of elements (including numbers, numeric values, amounts and ranges) are referred to, the invention is not limited to the specific numbers, which may be the specific numbers or above or under, except the case particularly indicated and the case of apparently defining specific numbers in principle.

Furthermore, in the following embodiments, it is needles to say that the components thereof (including element steps) are not necessarily essential, except for the case where this is expressed particularly and the case that is considered to be clearly essential in principle.

Similarly, in the following embodiments, when shapes and physical relationship of the components are referred to, those substantially approximate or analogous to the shapes are to be included, except the case where the contrary is expressed particularly and the case which is clearly not so in principle. It is similar to the numeric values and ranges.

Moreover, in the drawings illustrating the embodiments, parts having the same functions are designated by the same numerals and signs, and a repeat of he description thereof is omitted.

Besides, in the drawings used to illustrate the embodiments, even a plan view may have hatching in light shielding parts (a light shielding film, a light shielding pattern and a light shielding area) and a resist film for ease in understanding the drawings.

Hereafter, the embodiments of the invention will be described with reference to the drawings.

Embodiment 1

FIG. 1 depicts the a flow of a main process for fabricating a semiconductor integrated circuit device according to the invention. In a process 100 for fabricating a mask, a mask for use in transferring various patterns, for fabricating semiconductor integrated circuit devices to be manufactured onto a wafer will be fabricated.

In a subsequent process 101 for inspecting a mask, the acceptability of a pattern on a mask produced in the process 100 for fabricating the mask is inspected. The process 101 includes a process 101a for transferring (exposing) a pattern on a mask into a photoresist (hereafter simply called a resist) film on a wafer and a process 101b for inspecting a resist pattern transferred onto the wafer. That is, in this embodiment, the acceptability of the pattern on the mask is determined by inspecting the resist pattern transferred onto the wafer, not by inspection with a mask inspection system.

More specifically, the resist pattern actually transferred onto the wafer is the object to be inspected. Thereby, the substantial inspection of the pattern can be performed. Thus, the inspection reliability can be improved as compared with the inspection by a mask inspection system. Particularly, determining the acceptability of the pattern on the mask is difficult in a mask having a phase shift pattern particularly because the pattern on the mask sometimes varies from the pattern formed onto the wafer. However, in this embodiment, the actual pattern on the wafer is inspected, and, therefore the acceptability can be determined easily. Accordingly, the yield and reliability of semiconductor integrated circuit devices can be enhanced. Additionally, the reliability of mask inspection can be improved and thus the reinspection of the mask can be reduced. On this account, the mask fabrication time can be shortened and the development and manufacturing time of semiconductor integrated circuit devices can be shortened. Furthermore, an expensive mask inspection system can be eliminated and the costs for reinspection can be reduced or curtailed. Therefore, mask costs can be reduced and costs for a semiconductor integrated circuit device can be curtailed. Moreover, a technique of inspecting the acceptability of a pattern on a mask by checking a pattern transferred onto a wafer is described in Japanese Patent Application No. 316965/2000 (filed on Oct. 17, 2000) by the inventors of the application.

Subsequently, in a process 102 for transferring a pattern into a resist film on a wafer, the resist film on the wafer is exposed using the mask with the inspection results obtained in the mask inspecting process being considered. Thereby, a pattern on the mask is transferred into the resist film. In this embodiment, even though the mask has defects, the pattern is transferred onto the wafer so as not to transfer the defects onto the wafer. As an exposure system used at this time, a stepper or a scanner can be used. Besides, normal illumination or modified illumination may be used.

Subsequently, in a process 103 for forming a pattern or area on the wafer, the resist pattern formed on the wafer by exposure processing is used as an etching mask or impurity introducing mask, for example. Thereby, a pattern or area is formed on the wafer. As for this pattern, there is a line pattern such as wiring or an electrode or a hole pattern, such as a contact hole or through hole. In addition, as for the area, there is a well or semiconductor area.

Next, one example of masks used in the embodiment will be described with reference to FIGS. 2(a) to 17. The mask used in the embodiment is a reticle for transferring an original picture of an integrated circuit pattern at one to ten times an actual size, for example, onto a wafer through a reduced projection system. Here, a mask for use in transferring a line pattern onto a wafer is exemplified. However, the technical concept of the invention is not limited thereto, which mask can be adapted variously; for example, it can be adapted to a mask for use in transferring the hole pattern, for example. Additionally, the case of disposing four chip areas on a mask is shown here. The same pattern is disposed in each chip area in each mask. However, the number of chip areas formed on one mask is not defined thereto, which number can be modified variously. For example, it may be two or three, as will be described later.

Figure 2:
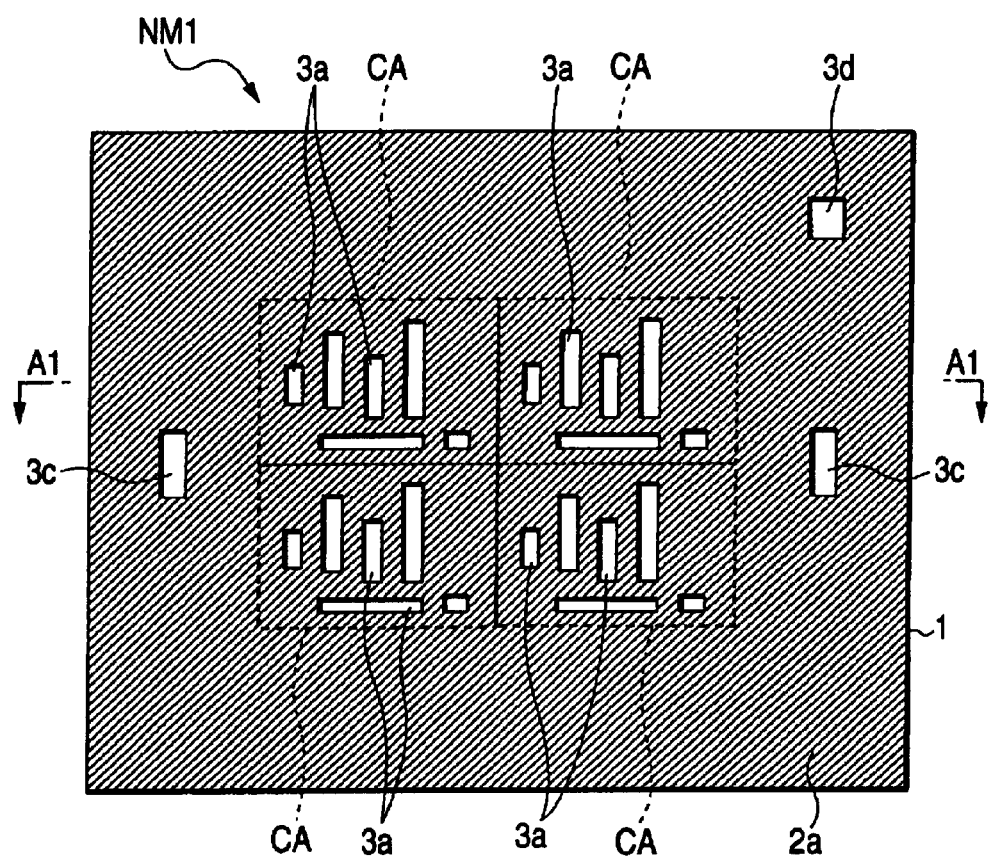
FIG. 2(a) is a plan view of a photomask for use in the process for fabricating the semiconductor integrated circuit device shown in FIG. 1.
FIG. 2(b) is a section view taken along line A1—A1 shown in FIG. 2(a)
Figure 2:
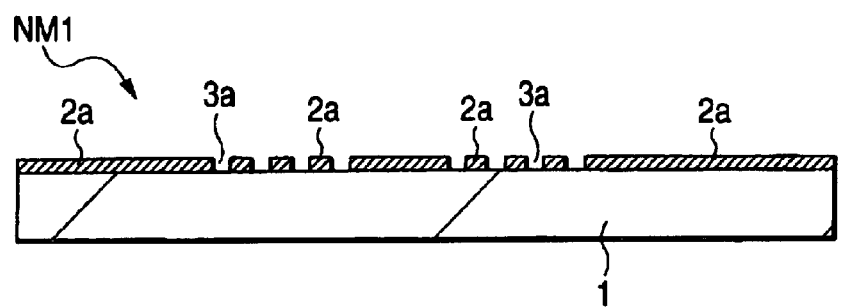
Figure 3:
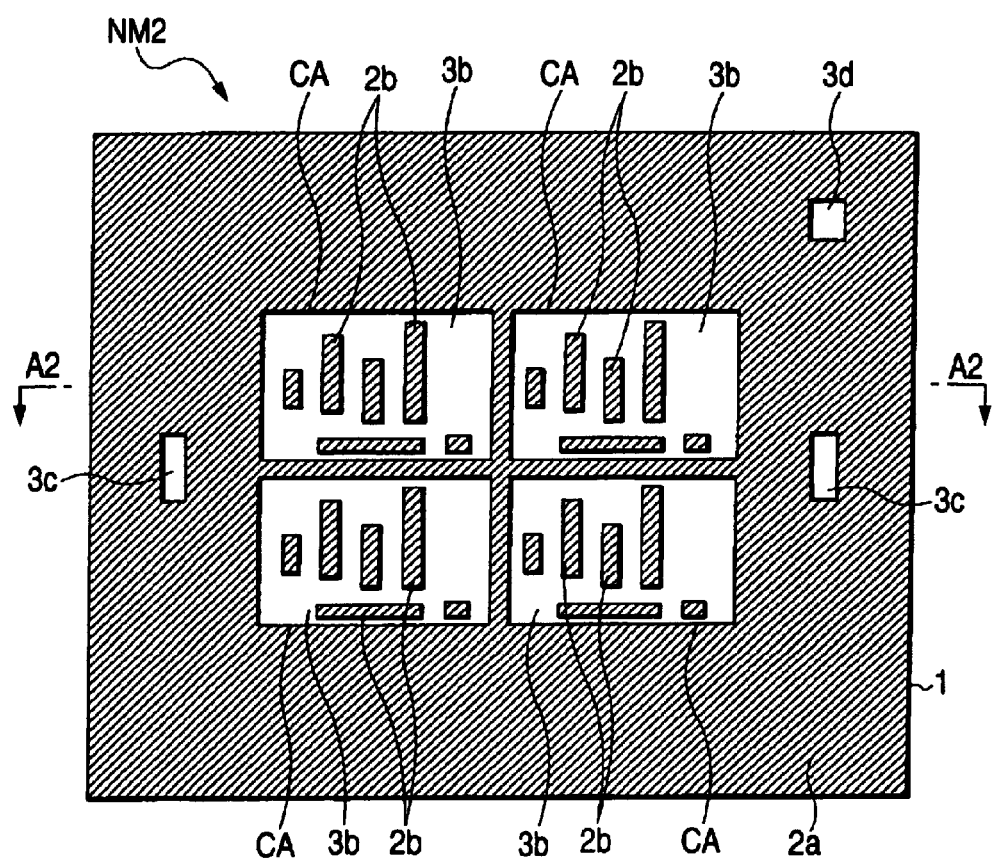
FIG. 3(a) is a plan view of a photomask for use in the process for fabricating the semiconductor integrated circuit device shown in FIG. 1.
FIG. 3(b) is a section view taken along line A2—A2 shown in FIG. 3(a)
Figure 3:
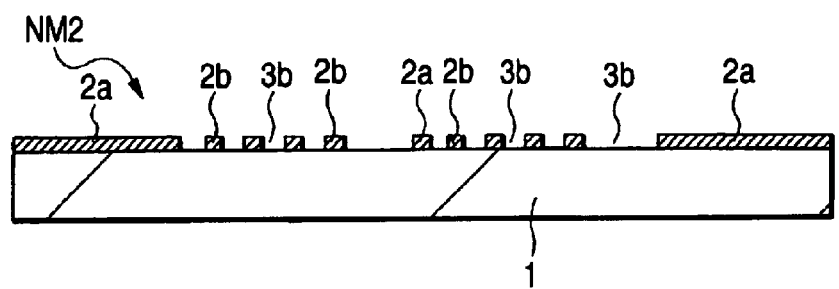
Figure 4:
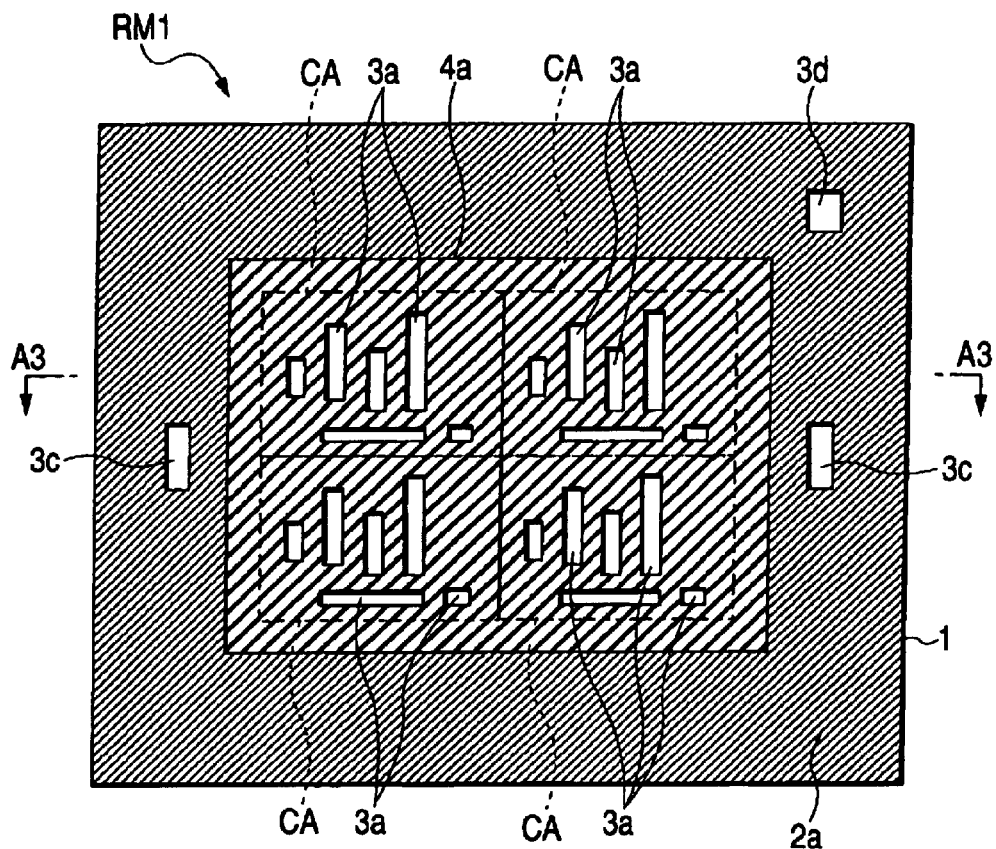
FIG. 4(a) is a plan view of a photomask for use in the process for fabricating the semiconductor integrated circuit device shown in FIG. 1.
FIG. 4(b) is a section view taken along line A3—A3 shown in FIG. 4(a)
FIG. 4(c) is a section view taken along line A3—A3 shown in FIG. 4(a), representing a modified example of FIG. 4(b)
Figure 4:
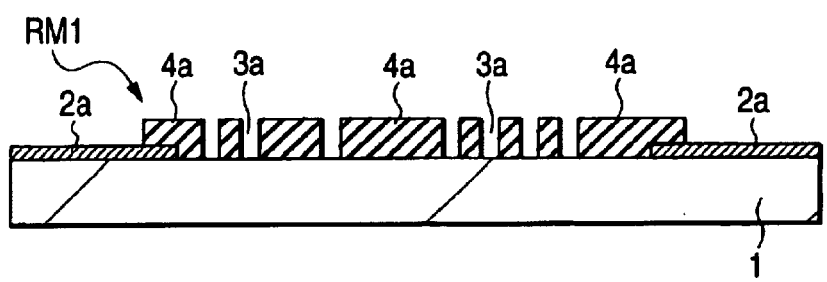
Figure 4:
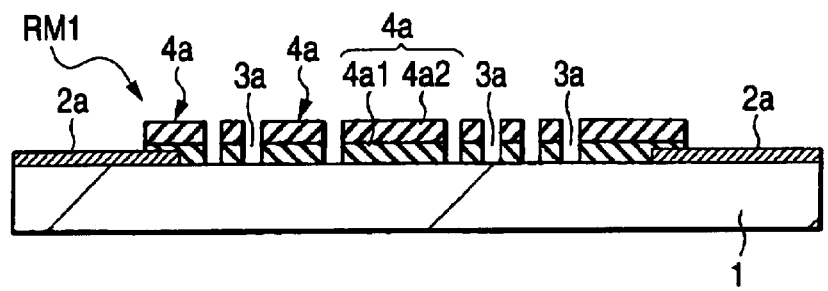
Figure 5:
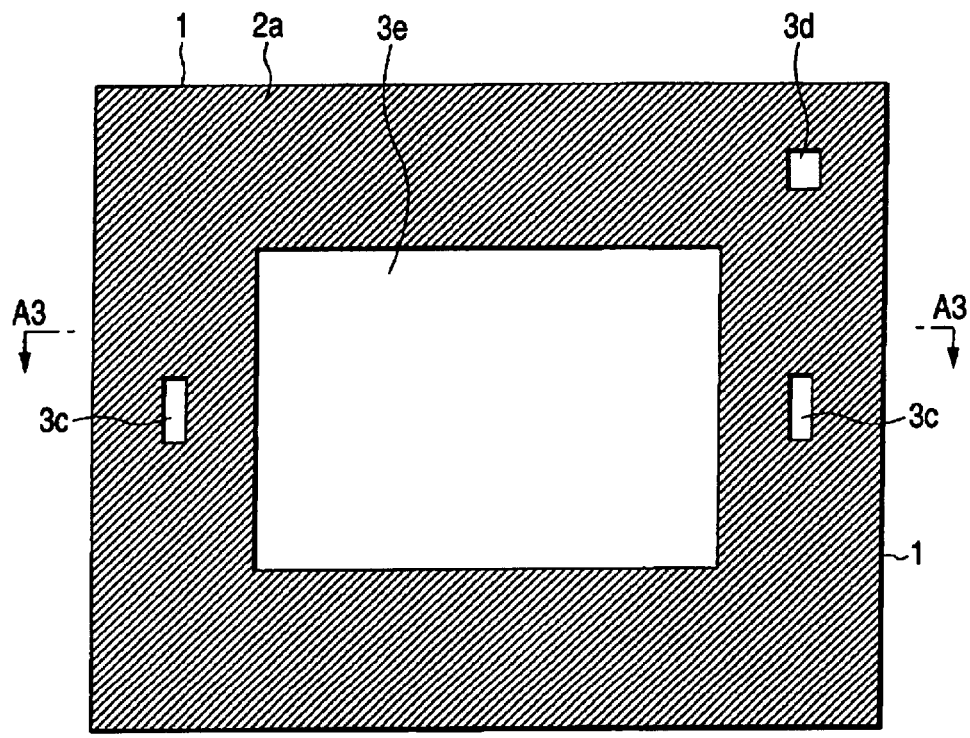
FIG. 5(a) is a plan view illustrating a mask substrate when a light shielding body comprised of an organic film of the photomask shown in FIG. 4(a) is removed.
FIG. 5(b) is a section of a line A3—A3 shown in FIG. 5(a)
Figure 5:
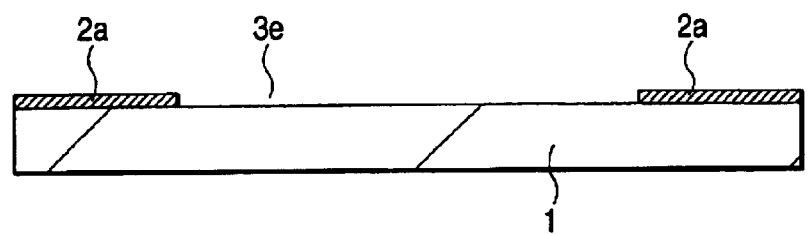
Figure 6:
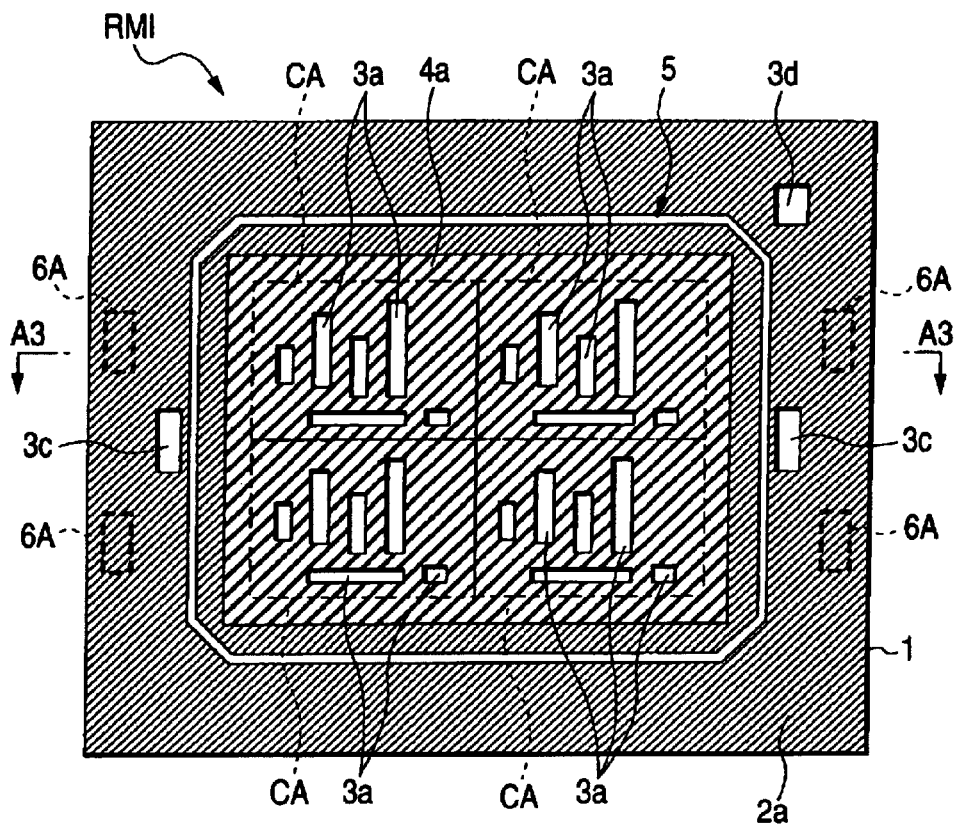
FIG. 6(a) depicts a plan view illustrating the photomask shown in FIG. 4(a) in a state that a pellicle is mounted thereon.
FIG. 6(b) is a section view taken along line A3—A3 shown in FIG. 6(a)
Figure 6:
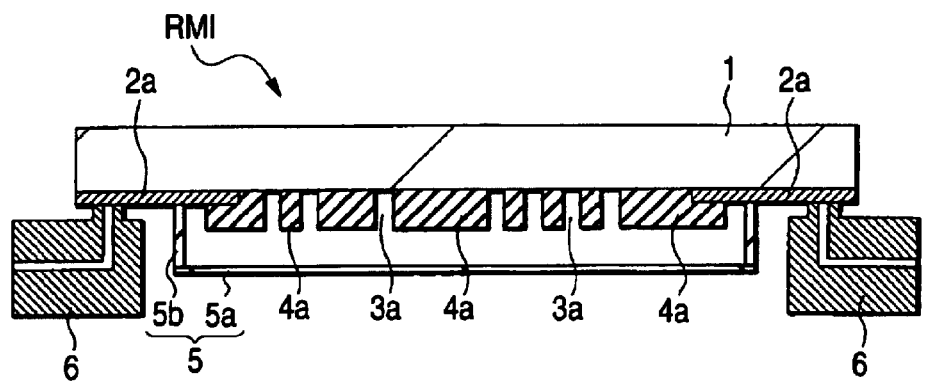
Figure 7:
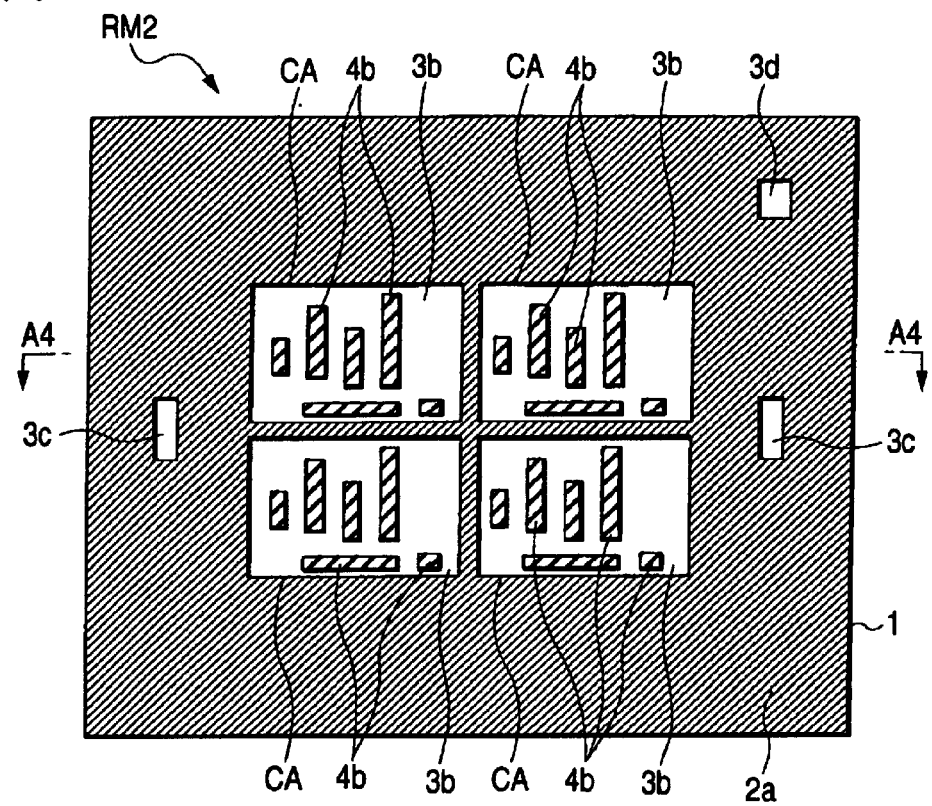
FIG. 7(a) is a plan view illustrating a photomask for use in the process for fabricating the semiconductor integrated circuit device shown in FIG. 1.
FIG. 7(b) is a section view taken along line A4—A4 shown in FIG. 7(a)
Figure 7:
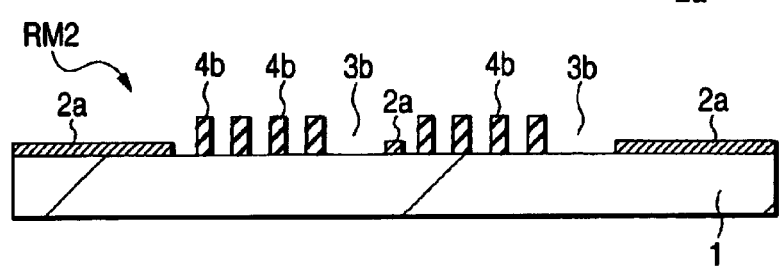
Figure 7:
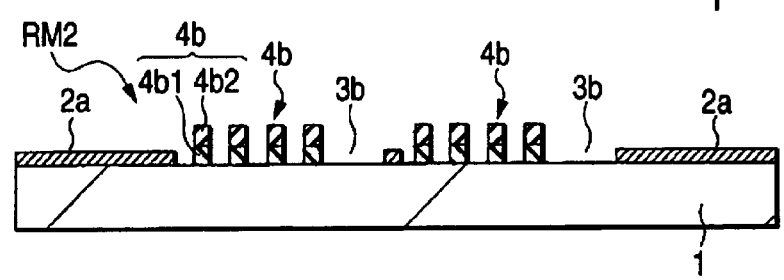
Figure 8:
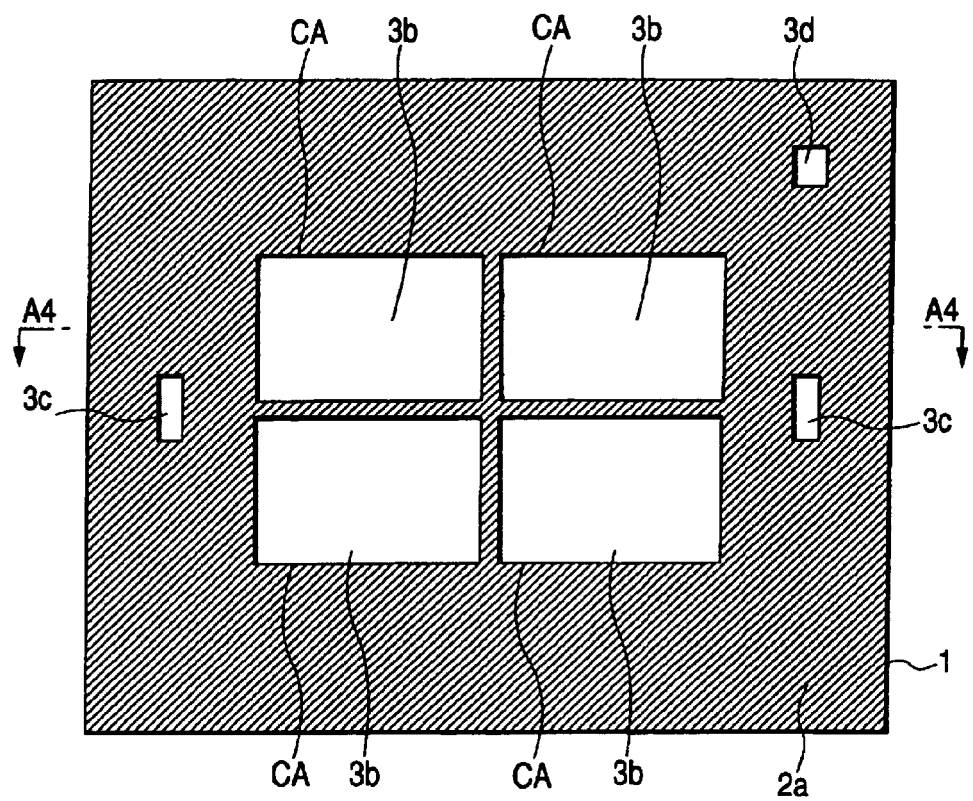
FIG. 8(a) is a plan view illustrating a mask substrate when a light shielding body comprised of an organic film of the photomask shown in FIG. 7(a) is removed.
FIG. 8(b) is a section view taken along line A4—A4 shown in FIG. 8(a)
Figure 8:
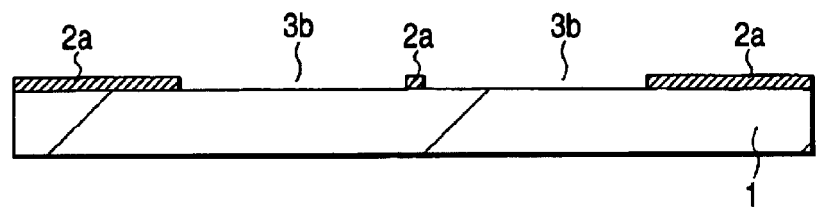
Figure 9:
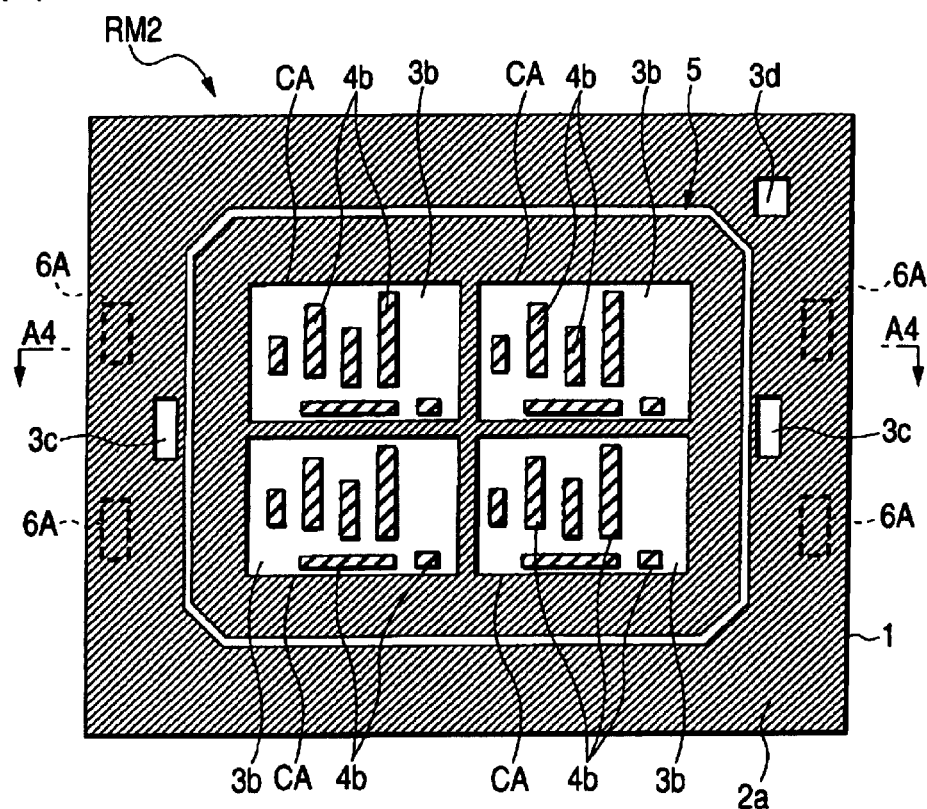
FIG. 9(a) is a plan view illustrating the photomask shown in FIG. 7(a) in a state that a pellicle is mounted thereon.
FIG. 9(b) depicts a section of a line A4—A4 shown in FIG. 9(a)
Figure 9:
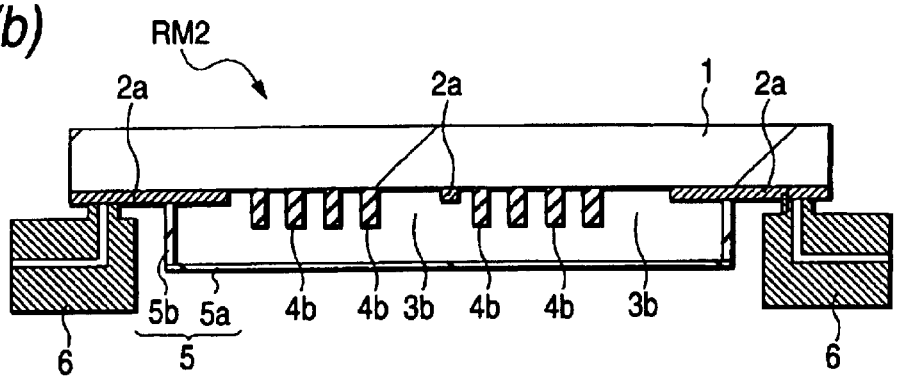
Figure 10:
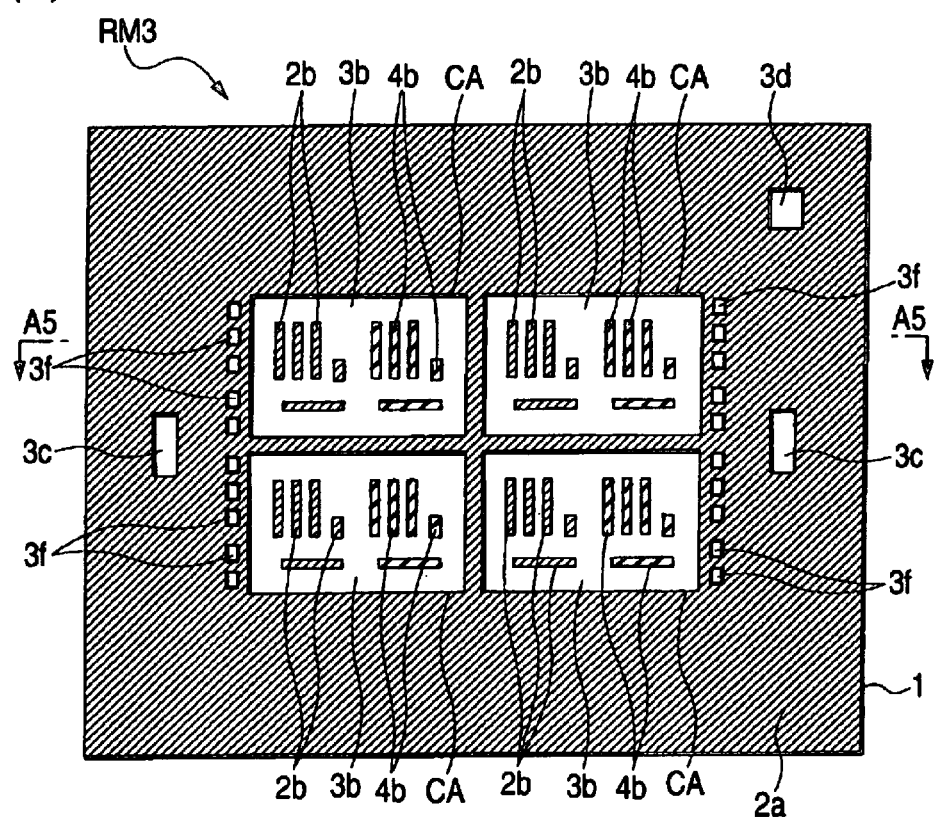
FIG. 10(a) is a plan view illustrating a photomask for use in the process for fabricating the semiconductor integrated circuit device shown in FIG. 1.
FIG. 10(b) is a section of a line A5—A5 shown in FIG. 10(a)
Figure 10:
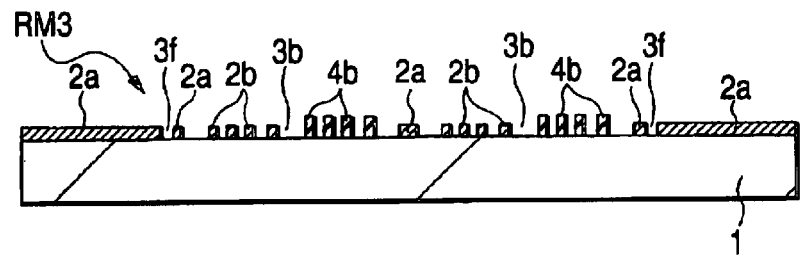
Figure 11:
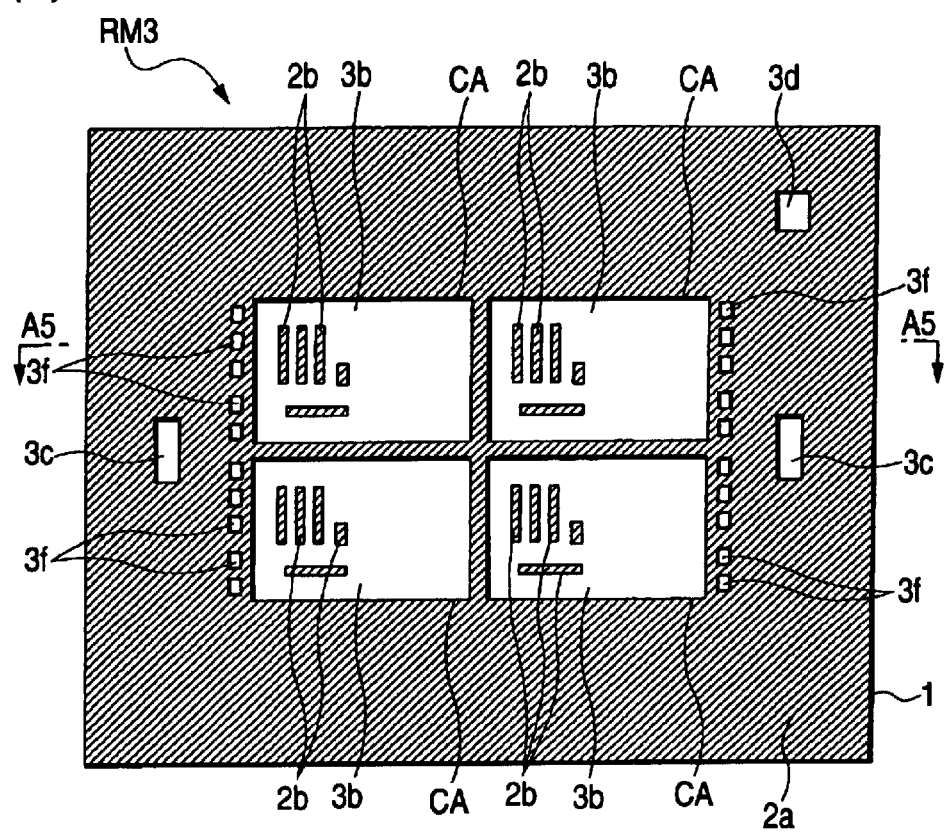
FIG. 11(a) is a plan view illustrating a mask substrate when a light shielding body comprised of an organic film of the photomask shown in FIG. 10(a) is removed and FIG. 11(b) is a section of a line A5—A5 shown in FIG. 11(a)
Figure 11:
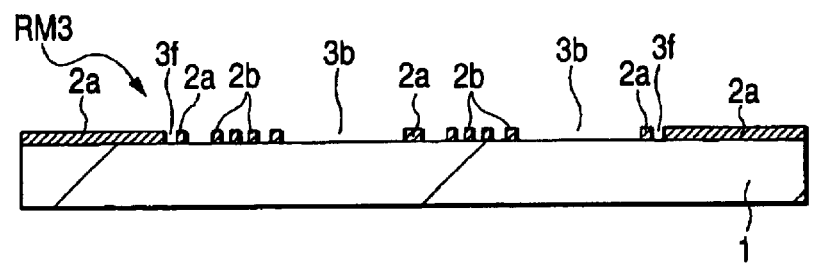
Figure 12:
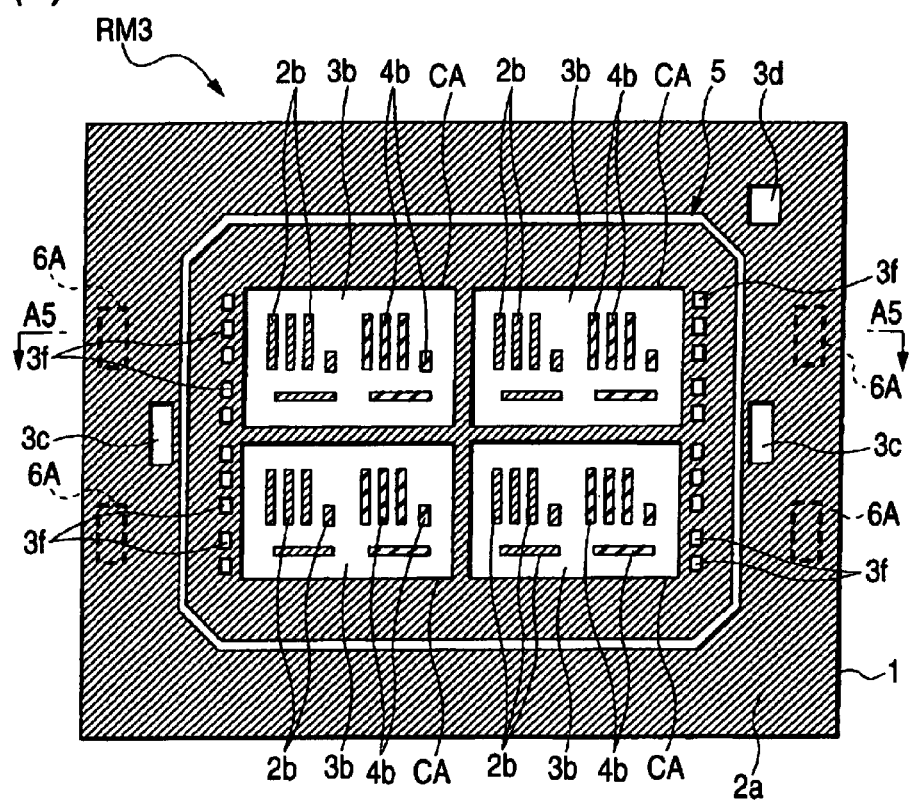
FIG. 12(a) is a plan view illustrating the photomask shown in FIG. 10(a) in a state that a pellicle is mounted thereon.
FIG. 12(b) is a section view taken along line A5—A5 shown in FIG. 12(a)
Figure 12:
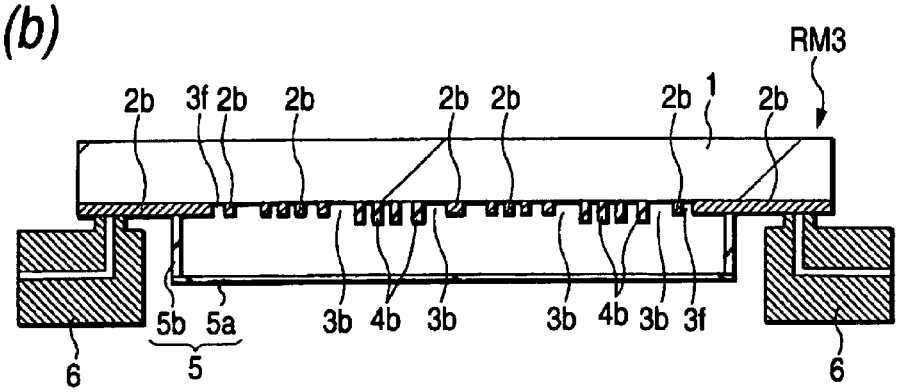
Figure 13:
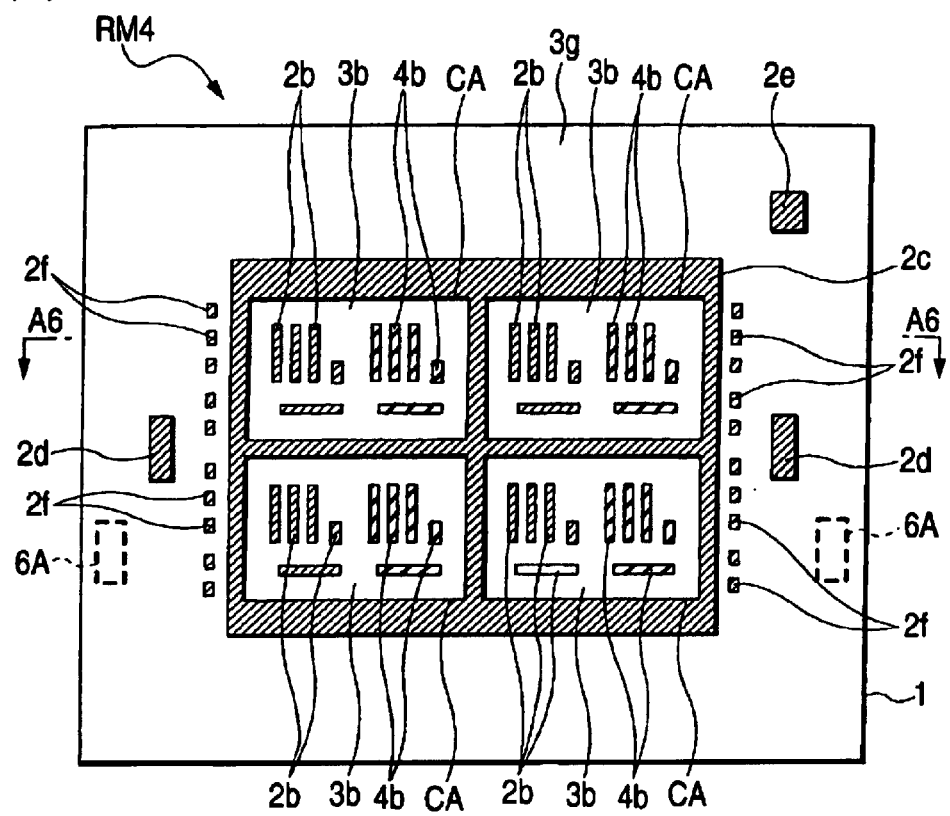
FIG. 13(a) is a plan view illustrating a photomask for use in the process for fabricating the semiconductor integrated circuit device shown in FIG. 1
FIG. 13(b) is a section view taken along line A6—A6 shown in FIG. 13(a)
Figure 13:
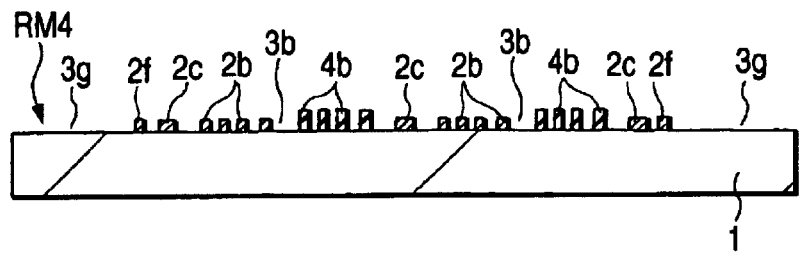
Figure 14:
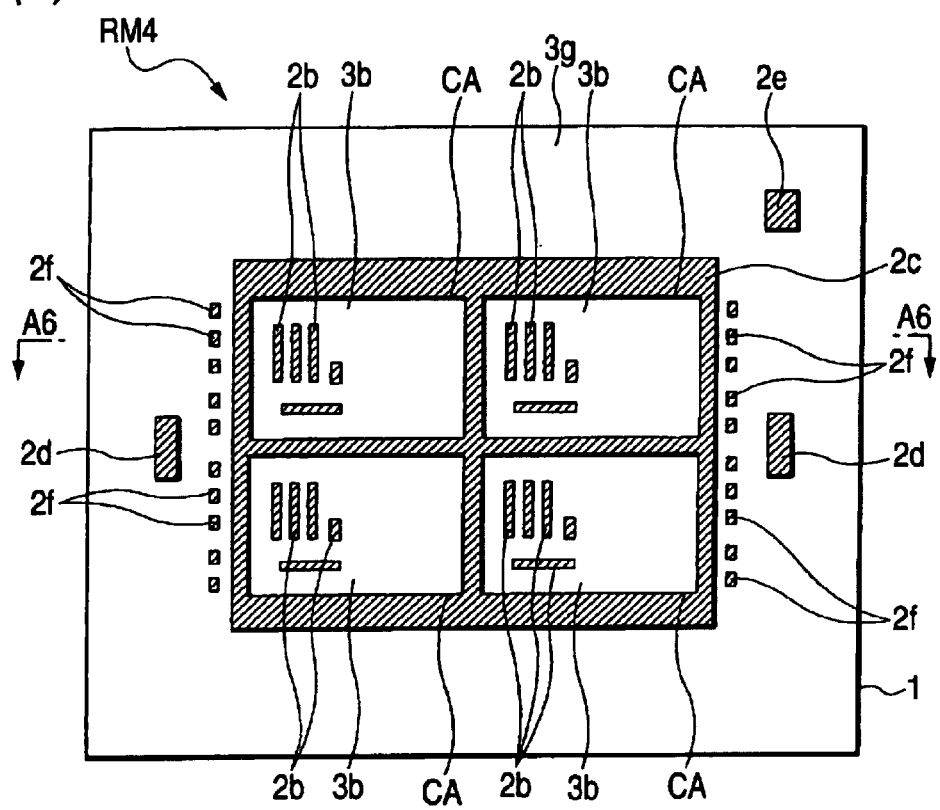
FIG. 14(a) is a plan view illustrating a mask substrate when a light shielding body comprised of an organic film of the photomask shown in FIG. 13(a) is removed.
FIG. 14(b) is a section view taken along line A6—A6 shown in FIG. 14(a)
Figure 14:
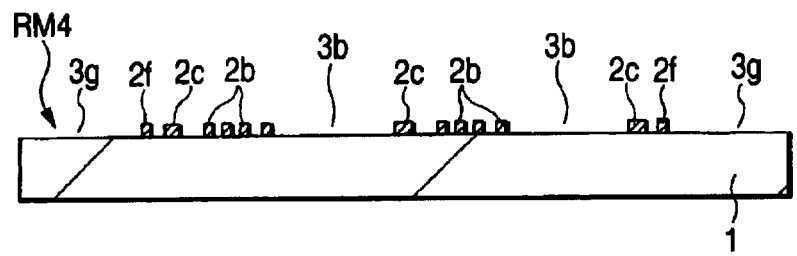
Figure 15:
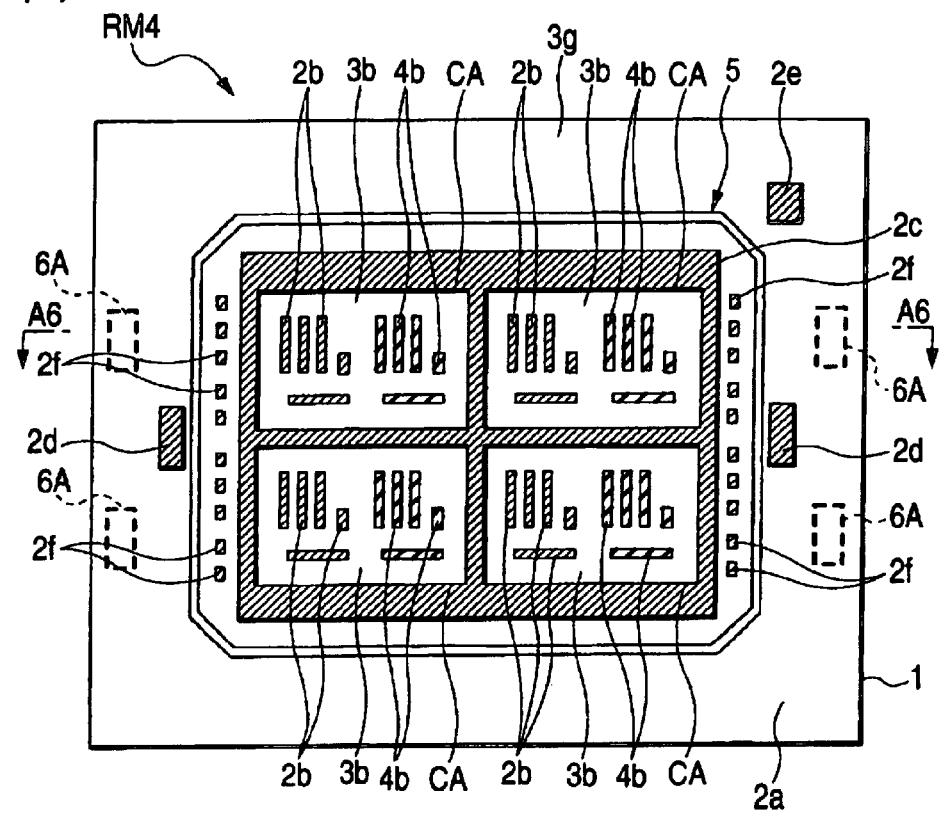
FIG. 15(a) is a plan view illustrating the photomask shown in FIG. 13(a) in a state that a pellicle is mounted thereon.
FIG. 15(b) is a section view taken along line A6—A6 shown in FIG. 15(a)
Figure 15:
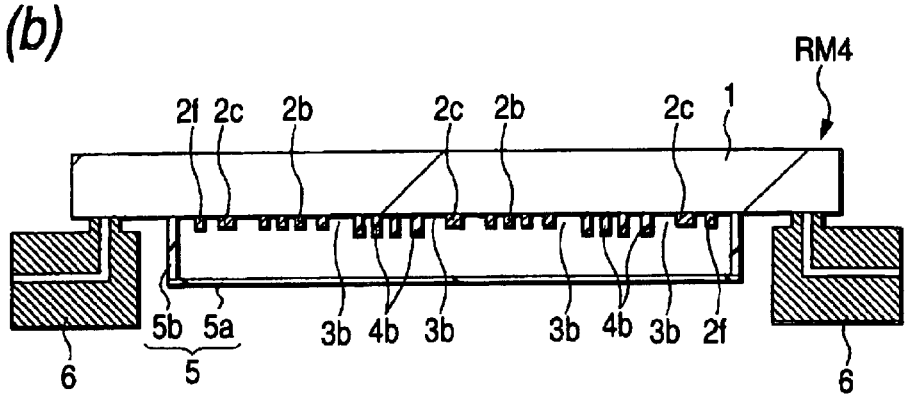

FIGS. 2(a) to 3(b) depict one example of normal masks NM1 and NM2. FIGS. 2(a) and 3(a) depict whole plan views of the masks NM1 and NM2. FIGS. 2(b) and 3(b) are sections taken along line A1—A1 in FIG. 2(a) and a line A2—A2 shown in FIG. 3(b), respectively.

The masks NM1 and NM2 exemplify those where light transparent areas and light shielding areas are reversed with respect to each other in the chip areas CA. In addition, the case is shown here in which a pattern to be transferred by using the mask NM1 is identical to a pattern to be transferred by using the mask NM2. However, a negative resist film is used on a wafer when the mask NM1 is used, whereas a positive resist film is used on a wafer when the mask NM2 is used.

A mask substrate 1 configuring the masks NM1 and NM2 is comprised of a transparent synthetic silica glass substrate having a thickness of about 6 mm formed into a planar rectangular shape. A first main surface of the mask substrate 1 of the masks NM1 and NM2 is mainly covered with a light shielding film 2a comprised of a metal film, such as chromium (Cr) or a chromium/chromium oxide ($CrO_x$) layered film. However, in the chip areas CA in the mask NM1, a part of the light shielding film 2a is removed to dispose a plurality of light transparent patterns 3a. The light transparent pattern 3a is a pattern to be transferred onto the wafer as a line pattern. On the other hand, in the chip areas CA in the mask NM2, the light shielding film 2a is removed to dispose light transparent areas 3b having a chip area shape. Then, inside the light transparent areas 3b, a plurality of light shielding patterns 2b, having the same materials as the light shielding film 2a, are disposed. The light shielding pattern 2b is a pattern to be transferred onto the wafer as the line pattern. In the peripheral area of such the masks NM1 and NM2, a part of the light shielding film 2a is removed to form light transparent patterns 3c and 3d. The light transparent patterns 3c and 3d are patterns for use in aligning the masks NM1 and NM2 with the wafer or with an exposure system.

FIGS. 4(a) to 4(c) depict a mask RM1, which is one example of a resist mask. FIG. 4(a) is a whole plan view of the mask RM1. FIG. 4(b) is a section of a line A3—A3 in FIG. 4(a). FIG.4(c) is a section view taken along line A3—A3 in FIG. 4(a), which is a modified example of FIG. 4(b).

When the mask RM1 is used, a negative resist film is used on a wafer. At the center of a first main surface of the mask RM1, a light shielding film 4a comprised of an organic film is patterned into a planar rectangular shape so as to cover four chip areas CA. Then, a part of the light shielding film 4A is removed to form a plurality of light transparent patterns 3a. The light shielding film 4A has characteristics that absorb exposing light, such as a g-ray (a wavelength of 436 nm), an i-ray (a wavelength of 365 nm), KrF excimer laser light (a wavelength of 248 nm), ArF excimer laser light (a wavelength of 193 nm) or an $F_2$ laser light (a wavelength of 157 nm), which has light shielding functions almost the same as a light shielding body comprised of metal.

FIG. 4(b) is the case where the light shielding film 4A is configured of a single film of a photosensitive resin film (resist film). As materials for the photosensitive resin film, those having main components of a copolymer of (-methyl styrene and α-chloroacrylate, a novolac resin and quinonediazide, a novolac resin and polymethylpentene-1-sulfone, and chloromethylated polystyrene were used. A so-called chemically amplified resist in which a phenol resin such as a polyvinyl phenol resin or novolac resin is mixed with an inhibiter and an acid-forming agent can be used. As materials for the light shielding resist film used here, those may have light shielding properties to a light source of a projection aligner and have properties sensitive to a light source of a pattern drawing system in the mask fabrication process, such as an electron beam or light of 230 nm or above. They are not limited to the aforesaid materials, which can be modified variously. When a polyphenol-based resin or a novolac-based resin is formed to have a thickness of about 100 nm, it has transmittance of about zero at wavelengths of about 150 to 230 nm; it has a sufficient mask effect to the ArF excimer laser light (a wavelength of 193 nm) and the $F_2$ laser light (a wavelength of 157 nm), for example. Here, an object was subjected to ultraviolet light having a wavelength of 200 nm or under, but it is not limited thereto. Exposing light having wavelengths longer than 200 nm, such as the KrF excimer laser light (a wavelength of 248 nm) or the i-ray (a wavelength of 365 nm) may be used. In this case, other photosensitive resin film materials are used, or absorbent materials having light absorption properties to exposing light or light shielding materials having light shielding properties need to be added to a photosensitive resin film. Thereby, even though the light shielding film 4A is a single film of a photosensitive resin, it is allowed to have sufficient light reducing properties or light shielding properties to exposing light having wavelengths of 200 nm or above, such as the g-ray, the i-ray and the KrF excimer laser light.

FIG. 4(c) is the case in which the light shielding film 4A is configured of a layered film where a photosensitive resin film is deposited over a light absorbing organic film. The light absorbing organic film is comprised of an antireflection film, such as a polyimide resin, which is made of materials having light absorbing, light reducing or light shielding properties relative to the exposing light having wavelengths of 200 nm or above. Thereby, it is possible to have sufficient light reducing or light shielding properties to the exposing light having wavelengths of 200 nm or above.

In the case of this resist mask, the etching process in the integrated circuit pattern areas (chip areas CA) can be eliminated. Additionally, the light shielding body comprised of the organic film can be removed easily without damaging the mask substrate 1. Furthermore, a new mask pattern for transferring an integrated circuit pattern can be formed easily for a short time. Thereby, QTAT (Quick Turn Around Time) in a mask can be realized. Moreover, the fabrication costs for a mask can be reduced. Besides, dimension errors of patterns due to etching can be eliminated because etching is not performed in the integrated circuit pattern areas in pattern work of the light shielding body. Thus, the dimensional accuracy of the transferred patterns can be enhanced by that amount. In addition, etching is not performed in the integrated circuit pattern areas, and therefore the defect rate can also be reduced drastically. Accordingly, a mask having high reliability can be provided. Furthermore, a technique of forming a light shielding pattern with an organic film is described in Japanese Patent Application No. 185221/1999 (filed on Jun. 30, 1999) by the inventors of the application. Moreover, a technique in which a light shielding film is formed into a layered film formed of a light absorbing organic film and a photosensitive organic film is described in Japanese Patent Applications No. 328159/2000 and No. 328160/2000 (both applications are filed on Oct. 27, 2000) by the inventors of the present application.

FIGS. 5(a) and 5(b) depict a state after the light shielding film 4A of the mask NM1 is removed. FIG. 5(a) is a plan view of the mask substrate 1. FIG. 5(b) is a section view taken along line A3—A3 shown in FIG. 5(a). In this case, a light transparent area 3e having a planar rectangular shape is deposited at the center of the first main surface of the mask substrate 1 so as to cover four chip areas. The periphery of the light transparent area 3e is surrounded by the light shielding film 2a. Materials for the light shielding film 2a of the mask RM1 are not limited to chromium as described above, but may be high melting point metals, such as tungsten, molybdenum, tantalum or titanium, nitrides such as tungsten nitride, high melting point metal silicides (compounds) such as tungsten silicide ($WSi_x$) or molybdenum silicide ($MoSi_x$), or a layered film of these may be used. In the case of the resist mask, the high melting point metals, such as tungsten, having a high oxidation resistance, abrasion resistance and peeling resistance are preferable as materials for the light shielding film 2a because there may be the case where the light shielding film 4A comprised of an organic film is removed and then the mask substrate 1 is cleaned for reuse (reproduction).

In addition, FIGS. 6(a) and 6(b) depict the case where a pellicle 5 is mounted on the mask RM1 shown in FIG. 4(a). FIG. 6(a) is a whole plan view of the mask RM1. FIG. 6(b) is a section of a line A3—A3 shown in FIG. 6(a), which illustrates a state that the mask RM1 is mounted on an exposure system.

The pellicle 5 is a construct having a transparent protecting film 5a, which is joined to the first main surface side of the mask substrate 1 through a pellicle frame 5b. The protecting film 5a of the pellicle 5 is disposed so as to cover four chip areas CA in plan, and is spaced from the first main surface or first and second main surfaces of the mask substrate 1 at a constant distance in section. The constant distance is designed not to transfer particles that are attached on the surface of the protecting film 5a onto the wafer. The protecting film 5a has a function of preventing particles caused by the light shielding body comprised of an organic film from attaching to the wafer in exposure, other than the function of preventing external particles from attaching to the resist mask RM1.

A base of the pellicle frame 5b is joined as it is directly in contact with the light shielding film 2a made of metal. When the pellicle frame 5b is joined in a state of being directly contacted on the light shielding film 4A comprised of an organic film, the organic film (light shielding film 4A) having a mechanical strength lower than metal is removed. Consequently, the pellicle 5 might be removed as well. Additionally, particles might be generated because the light shielding film 4A comprised of the organic film is peeled or scraped in dismounting the pellicle 5 after the resist mask RM1 is used. The base of the pellicle frame 5b is joined as it is directly contacted to the light shielding film 2a made of metal, and thereby those problems can be prevented. Furthermore, in view of avoiding the problem of particle generation, a mask mounting part 6 of the exposure system is allowed to contact the light shielding film 2a (areas 6A indicated by broken lines shown in FIG. 6(a)) comprised of metal of the mask RM1 when the resist mask RM1 is mounted on the exposure system. Moreover, as a method of holding the mask in the mask mounting part 6 here, a vacuum is used, for example.

FIGS. 7(a) to 7(c) depict a mask RM2, representing another example of the resist masks. FIG. 7(a) is a whole plan view of the mask RM2. FIG. 7(b) is a section view taken along line A4—A4 shown in FIG. 7(a). FIG. 7(c) is a section view taken along line A4—A4 shown in FIG. 7(a), which shows a modified example of FIG. 7(b).

The mask RM2 exemplifies that the configuration of the light transparent areas and the light shielding areas in the chip areas of the mask RM1 is reversed. The case where the pattern to be transferred by using the mask RM1 is identical to the pattern to be transferred by using the mask RM2 is shown. However, when the mask RM2 is used, a positive resist film is used on a wafer.

In the mask RM2, a light shielding film 2a of the chip areas CA is removed at the center of the first main surface of the mask substrate 1 and four light transparent areas 3b having a chip area shape are disposed. Then, a plurality of light shielding patterns 4b, comprised of an organic film, are disposed inside each of the light transparent areas 3b. The light shielding pattern 4b is a pattern to be transferred onto a wafer as the line pattern. The structure of the light shielding pattern 4b (including materials) is the same as the light shielding film 4A, for example. FIG. 7(b) depicts the case where the light shielding pattern 4b is configured of a single film of a photosensitive resin film, for example. Additionally, FIG. 7(c) depicts the case where the light shielding pattern 4b is configured by depositing a photosensitive resin film 4b1 over a light absorbing organic film 4b2, as described above.

FIGS. 8(a) and 8(b) depict a state that the light shielding patterns 4b of the mask RM2 are removed. FIG. 8(a) is a plan view of the mask substrate 1. FIG. 8(b) is a section view taken along line A4—A4 shown in FIG. 8(a). In this case, four light transparent areas 3b having a planar rectangular shape are disposed at the center of the first main surface of the mask substrate 1. Each of the light transparent areas 3b corresponds to the chip area. The periphery of each of the light transparent areas 3b is surrounded by the light shielding film 2a made of metal. Materials for the light shielding film 2a of the mask RM2 are the same as the light shielding film 2a of the mask RM1. In addition, FIGS. 9(a) and 9(b) depict the case where a pellicle 5 is mounted on the mask RM2 shown in FIG. 7(a). FIG. 9(a) depicts a whole plan view of the mask RM2. FIG. 9(b) is a section view taken along line A4—A4 shown in FIG. 9(a), showing a state that the mask RM2 is mounted on an exposure system. In this regard, it is the same as the mask RM1 described with reference to FIGS. 6(a) and 6(b) and thus a description thereof is omitted. The mask RM2 can produce the same effect as the mask RM1.

FIGS. 10(a) and 10(b) depict a mask RM3, which is still another example of a resist masks. FIG. 10(a) is a whole plan view of the mask RM3. FIG. 10(b) is a section view taken along line A5—A5 in FIG. 10(a).

The mask RM3 exemplifies a partial resist mask. When the mask RM3 is used, a positive resist film is used on a wafer. Four light transparent areas 3b are disposed at the center of a first main surface of a mask substrate 1 in the mask RM3, as similar to the mask RM2 shown in FIG. 7(a). In each of the light transparent areas 3b, light shielding patterns 2b comprised of metal and light shielding patterns 4b comprised of an organic film are disposed. The light shielding patterns 2b and 4b are patterns to be transferred onto a wafer as line patterns. The structure of the light shielding pattern 2b (including materials) is the same as the light shielding film 2a of the masks RM1 and RM2. Additionally, the structure of the light shielding pattern 4b (including materials) is the same as the mask RM2. In patterning the light shielding film 2a of the peripheral area of the mask RM3, a positive resist film is used. Thereby, areas to be drawn can be reduced in drawing patterns of the light shielding film 2a of the mask RM3 by electron beams. Thus, time for drawing the patterns can be shortened. Furthermore, light transparent patterns 3f disposed near the light transparent areas 3b are patterns for directly detecting the position of the mask RM3 when the patterns are formed on the mask RM3 by using an electron beam drawing system. Thereby, the positional accuracy of the pattern drawing by the electron beam drawing system can be enhanced.

FIGS. 11(a) and 11(b) depict a state that the light shielding patterns 4b of the mask RM3 are removed. FIG. 11(a) is a plan view of the mask substrate 1. FIG. 11(b) is a section of a line A5—A5 shown in FIG. 11(a). In this case, the light shielding patterns 2b made of metal are left in each of the light transparent areas 3b. The periphery of each of the light transparent areas 3b is surrounded by the light shielding film 2a made of metal. Materials for the light shielding film 2a and the light shielding patterns 2b of the mask RM3 are the same as the light shielding film 2a of the mask RM1. In addition, FIGS. 12(a) and 12(b) depict the case where a pellicle 5 is mounted on the mask RM3 shown in FIG. 10(a). FIG. 12(a) is a whole plan view of the mask RM3. FIG. 12(b) is a section of a line A5—A5 shown in FIG. 12(a), showing a state that the mask RM3 is mounted on an exposure system. On this, it is the same as the mask RM1 described in FIGS. 6(a) and 6(b) and thus a description thereof will be omitted.

In the mask RM3, the following effects can be obtained in addition to the effects provided by the mask RM1. Only a part of the light shielding patterns for transferring an integrated circuit pattern is configured of the organic film. Thereby, it is possible to substantially shorten the time for drawing the light shielding patterns 4b comprised of the organic film as compared with the case where all the light shielding patterns are configured of an organic film. Thus, the time for fabricating and reproducing a mask can be reduced drastically. Accordingly, time for developing and fabricating a semiconductor integrated circuit device can be curtailed. Additionally, a partial resist mask technique is described in Japanese Patent Applications No. 206728/2000 and No. 206729/2000 by the inventors of the application (both are filed on Jul. 7, 2000).

FIGS. 13(a) and 13(b) depict a mask RM4, representing yet still another example of the resist masks. FIG. 13(a) is a whole plan view of the mask RM4. FIG. 13(b) is a section view taken along line A6—A6 shown in FIG. 13(a). The mask RM4 exemplifies a partial resist mask. In the mask RM4, a light shielding pattern 2c is disposed so as to encompass the periphery of light transparent areas 3b, and a light shielding film is removed from the rim thereof to the outer region of the mask substrate 1 for providing a light transparent area 3g. In this case, instead of the light transparent patterns 3c, 3d and 3f for alignment, light shielding patterns 2d, 2e and 2f serve that function. In patterning the light shielding patterns 2c to 2f in the peripheral area of the mask RM4, a negative resist film is used. Thereby, areas to be drawn can be reduced in drawing the light shielding patterns 2c to 2f of the mask RM4 by electron beams. Therefore, the time for drawing patterns can be shortened. It is the same as the mask RM3 shown in FIG. 10(a), except for that. The structure of the peripheral area of the mask RM4 can be adapted to the masks NM1, NM2, RM1, and RM2. Furthermore, the structure of the integrated circuit pattern area of the mask RM1 may be adapted to the resist masks RM3 and RM4.

FIGS. 14(a) and 14(b) depict a state in which the light shielding patterns 4b of the mask RM4 are removed. FIG. 14(a) is a plan view of the mask substrate 1. FIG. 14(b) is a section of a line A6—A6 shown in FIG. 14(a). In this case, the light shielding patterns 2b, 2c, 2d, 2e and 2f made of metal are left on the mask substrate 1. Materials for the light shielding patterns 2b, 2c, 2d, 2e and 2f of the mask RM4 are the same as the light shielding film 2a of the mask RM1. In addition, FIGS. 15(a) and 15(b) depict the case where a pellicle 5 is mounted on the mask RM4 shown in FIG. 13(a). FIG. 15(a) is a whole plan view of the mask RM4. FIG. 15(b) is a section of a line A6—A6 shown in FIG. 15(a), showing a state that the mask RM4 is mounted on an exposure system. A base of a pellicle frame 5b of the pellicle 5 and a mask mounting part 6 of the exposure system are directly contacted to the mask substrate 1. The reason therefor is the same as that described in the mask RM1 shown in FIGS. 6(a) and 6(b). Except that, it is the same as the mask RM1 shown in FIGS. 6(a) and 6(b) and thus a description thereof will be omitted. The mask RM4 can produce the same effects as those attained by the masks RM1 to RM3.

Figure 16:
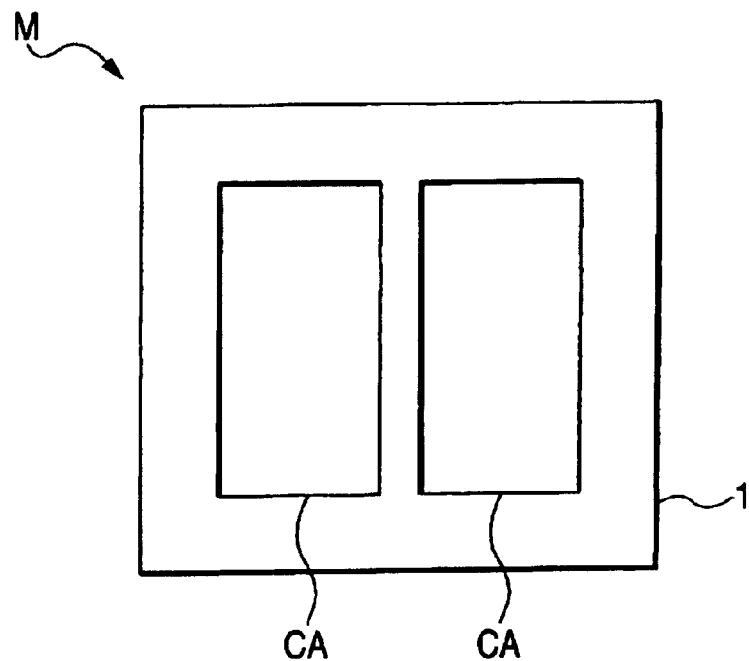
FIG. 16 is a plan view illustrating a photomask for use in the process for fabricating the semiconductor integrated circuit device shown in FIG. 1.
Figure 17:
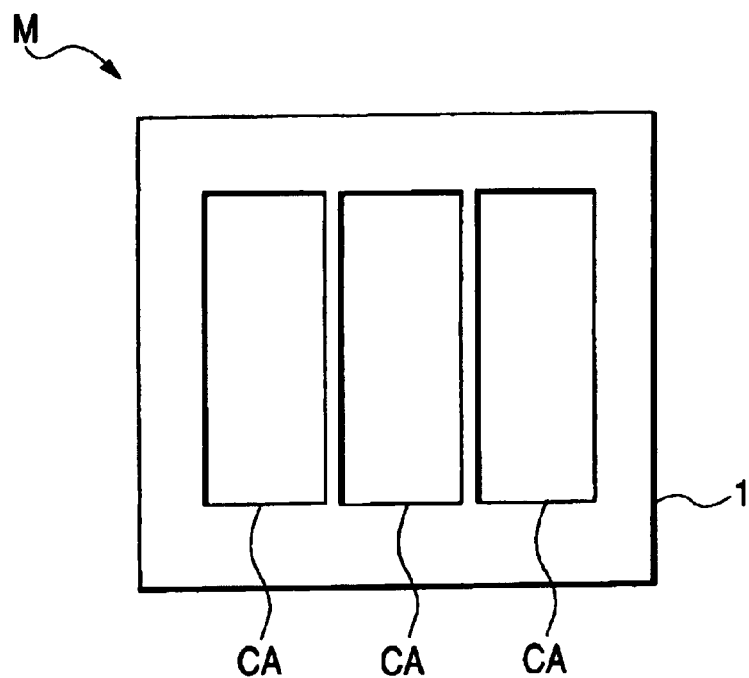
FIG. 17 is a plan view illustrating a photomask for use in the process for fabricating the semiconductor integrated circuit device shown in FIG. 1.

Each of the examples described above exemplifies the case of four chip areas CA, but the embodiment is not limited thereto and can be modified variously. FIGS. 16 and 17 depict modified examples of layouts of the chip areas CA. A mask M includes both normal masks and resist masks. A mask M shown in FIG. 16 is the case of two chip areas CA and a mask M shown in FIG. 17 is the case of three chip areas CA. The specific structure is the same as that described in reference to the masks NM1, NM2, and RM1 to RM4. Furthermore, the entire light shielding body on the mask may be configured of the organic film described above.

Figure 18:
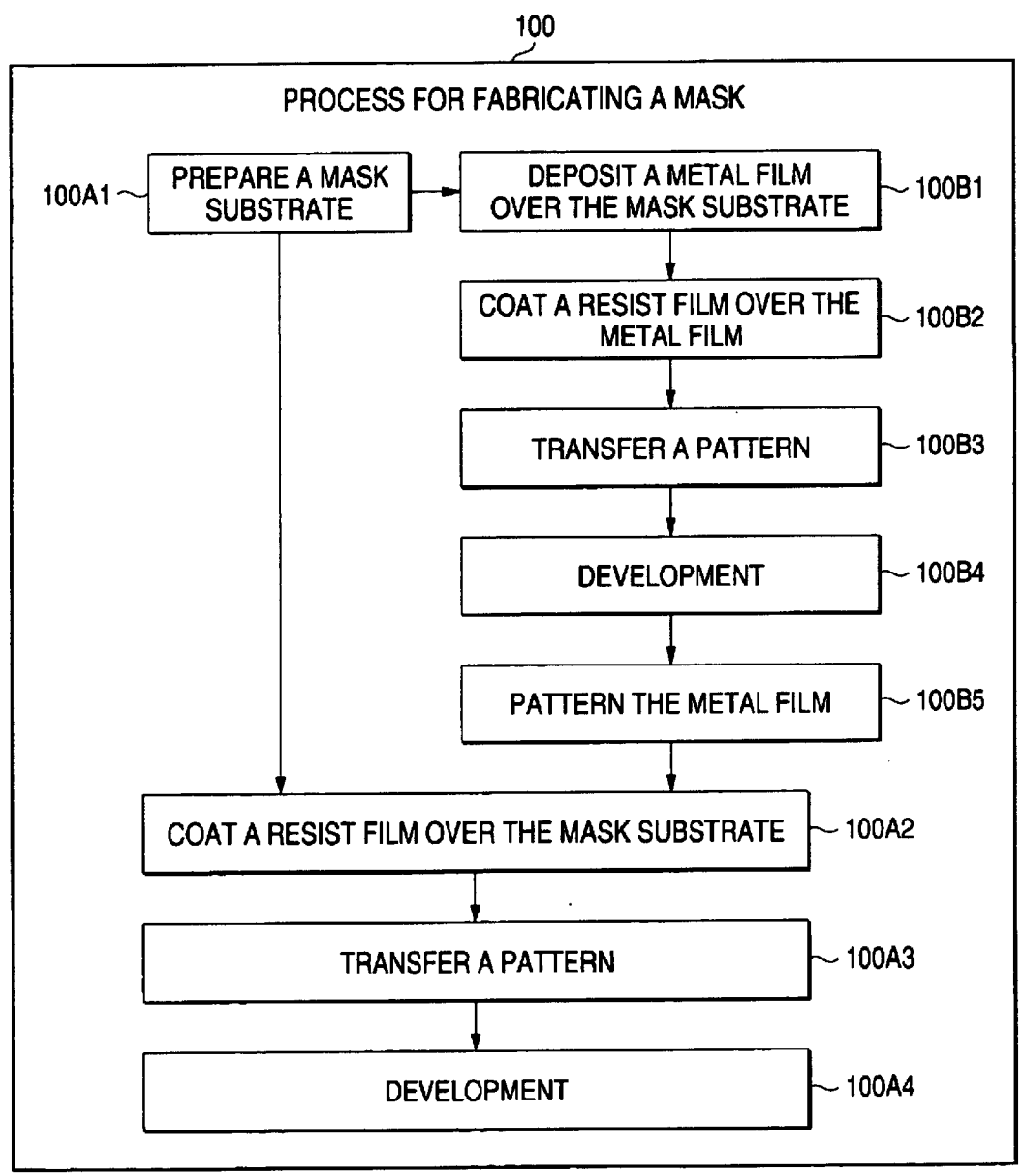
FIG. 18 is a detailed flow chart illustrating a process for fabricating a photomask shown in FIG. 1.
Figure 19:
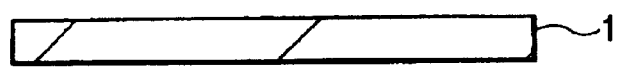
FIGS. 19(a) to 19(c) are section views illustrating a principal part during the process for fabricating a photomask.
Figure 19:
Figure 19:
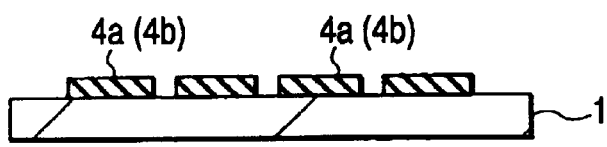
Figure 20:
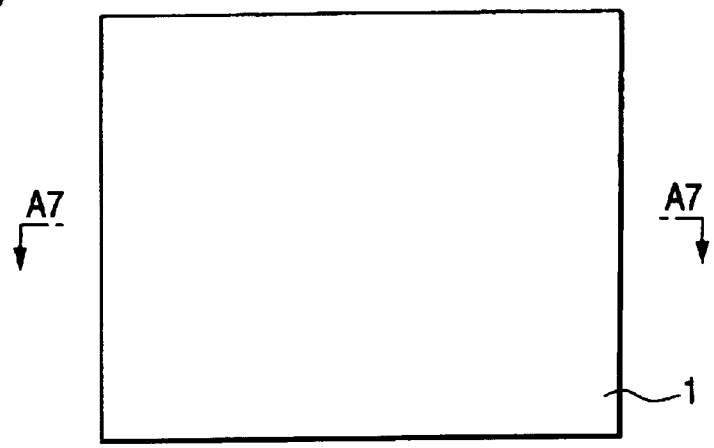
FIG. 20(a) is a whole plan view illustrating a mask substrate during the process for fabricating a photomask.
FIG. 20(b) is a section view taken along line A7—A7 shown in FIG. 20(a)
Figure 20:
Figure 21:
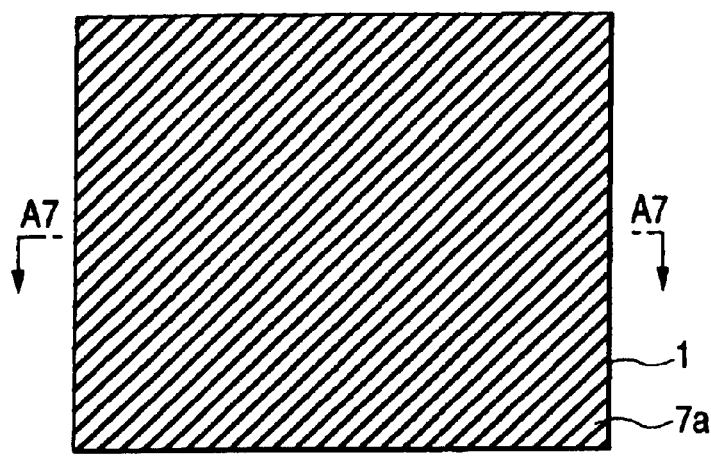
FIG. 21(a) is a whole plan view illustrating the mask substrate during the process for fabricating the photomask following the steps of FIGS. 20(a) and 20(b)
FIG. 21(b) is a section view taken along line A7—A7 shown in FIG. 21(a)
Figure 21:
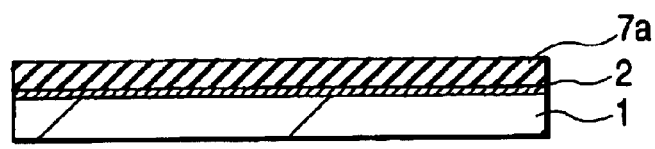
Figure 22:
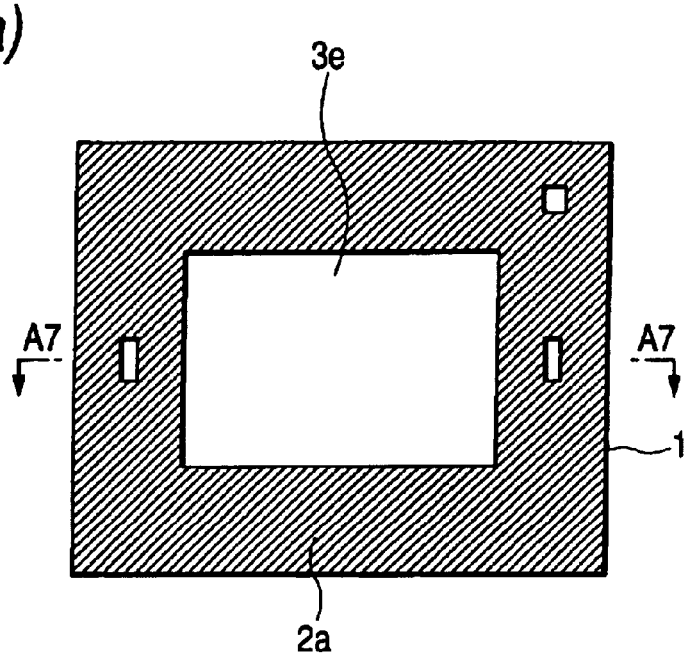
FIG. 22(a) is a whole plan view illustrating the mask substrate during a step in the process for fabricating the photomask following the steps of FIGS. 21(a) and 21(b)
FIG. 22(b) is a section view taken along line A7—A7 shown in FIG. 22(a)
Figure 22:
Figure 23:
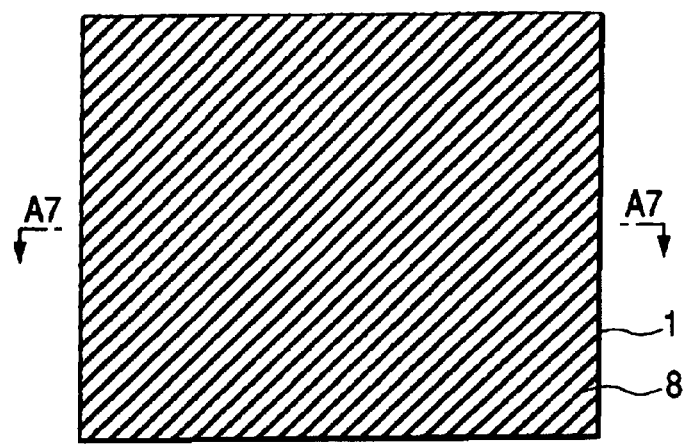
FIG. 23(a) is a whole plan view illustrating the mask substrate during a step in the process for fabricating the photomask following the steps of FIGS. 22(a) and 22(b)
FIG. 23(b) is a section view taken along line A7—A7 in FIG. 23(a)
Figure 23:
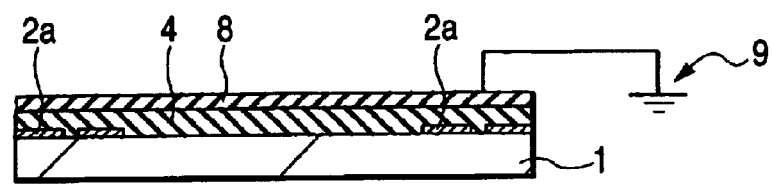

Next, one example of a method for fabricating such masks will be described with reference to FIGS. 18 to 23(b). FIG. 18 is one example of a flow chart for a method of fabricating a resist mask. FIGS. 19(a) to 19(c) are section views illustrating a principal part of a mask substrate in a basic process for fabricating a resist mask. Additionally, a method for fabricating a normal mask is the same as the general fabricating method, and thus the description thereof will be omitted.

First, as shown in FIG. 19(a), a mask substrate 1 is prepared (step 100A1). Subsequently, an organic film 4 is applied to a first main surface of the mask substrate 1 as shown in FIG. 19(b). Materials for the organic film 4 are the same as the light shielding film 4A, which is comprised of a single film of a photosensitive resin or a layered film of a photosensitive resin film deposited over a light absorbing organic film, for example (step 100A2). Then, a desired pattern is transferred into the organic film 4 by an electron beam drawing system (step 100A3). After that, the organic film 4 is developed and thereby a light shielding film 4a or light shielding pattern 4b comprised of the organic film 4 is patterned as shown in FIG. 19(c) (step 100A4).

Additionally, a modified example of the method of fabricating the resist mask will be described with reference to FIGS. 18 and 20(a) to 23(b). Here, it will be directed to a method of fabricating the mask RM1 shown in FIG. 4(a). FIGS. 20(a), 21(a), 22(a) and 23(a) are plan views showing steps during a process for fabricating a resist mask having metal. FIGS. 20(b), 21(b), 22(b) and 23(b) depict sections of a views taken along lines A7—A7 shown in FIGS. 20(a), 21(a), 22(a) and 23(a), respectively.

First, as shown in FIGS. 20(a) and 20(b), the mask substrate 1 is prepared (step 100A1). Subsequently, a metal film 2 is deposited over a first main surface of the mask substrate 1 by spattering as shown in FIGS. 21(a) and 21(b). Materials for the metal film 2 are the same as that for the light shielding film 2a (step 100B1). After that, a resist film 7a is applied to the metal film 2 (step 100B2), and then a desired pattern is drawn into the resist film 7a by using an electron beam drawing system (step 100B3).

Subsequently, the resin film 7a is developed, and thereby the pattern of the resin film 7a is formed (step 100B4). Then, this is used as an etching mask to pattern the underlying metal film 2 by etching. Thereby, a light shielding film 2a made of metal is patterned, as shown in FIGS. 22(a) and 22(b). The mask substrate 1 in this stage is the same as that shown in FIGS. 5(a) and 5(b). Additionally, in the case of the masks RM3 and RM4 described with reference to FIGS. 10(a) and 10(b) and 13(a) and 13(b), the light shielding patterns 2b made of metal inside the chip areas CA are also patterned simultaneously in this stage (step 100B5).

Then, as shown in FIGS. 23(a) and 23(b), an organic film 4 is applied to the first main surface of the mask substrate 1. Materials for the organic film 4 are the same as the light shielding film 4A, which is comprised of a single film of a photosensitive resin or a layered film of a photosensitive resin film deposited over a light absorbing organic film, for example. Subsequently, an antistatic water-soluble conductive organic film 8 is applied to the organic film 4. As the water-soluble conductive organic film 8, ESPACER (produced by Showa Denko K. K.) or aquaSAVE (produced by Mitsubishi Rayon Co., Ltd.), for example, was used (step 100A). After that, electron beam drawing for drawing patterns was performed as the water-soluble conductive organic film 8 is electrically connected to an earth (earth potential) 9. Thereby, micropatterns could be drawn with high accuracy (step 100A3). Subsequently, the organic film 4 is developed, and thereby a light shielding film 4A (or a light shielding pattern 4b) comprised of the organic film 4 is patterned as shown in FIGS. 4(a) and 4b (FIGS. 7(a) and 7(b), 10(a) and 10(b), and 13(a) and 13(b)) (step 100A4). The water-soluble conductive organic film 8 was removed in developing the organic film 4.

Pattern drawing of the organic film 4 or resist film 7a is not defined to electron beam drawing; for example, pattern drawing by ultraviolet rays of 230 nm or above may be adapted. Additionally, it is also effective to perform so-called hardening of resist film where heat treatment is added or ultraviolet rays are irradiated intensely for enhancing the resistance to exposing light irradiation after the light shielding film 2a or light shielding pattern 2b comprised of such the organic film 4 is formed. Furthermore, in order to prevent the light shielding film 2a or light shielding pattern 2b comprised of the organic film from being oxidized, it is also effective to maintain the pattern surface in an inert gas atmosphere such as nitrogen (N2).

Figure 24:
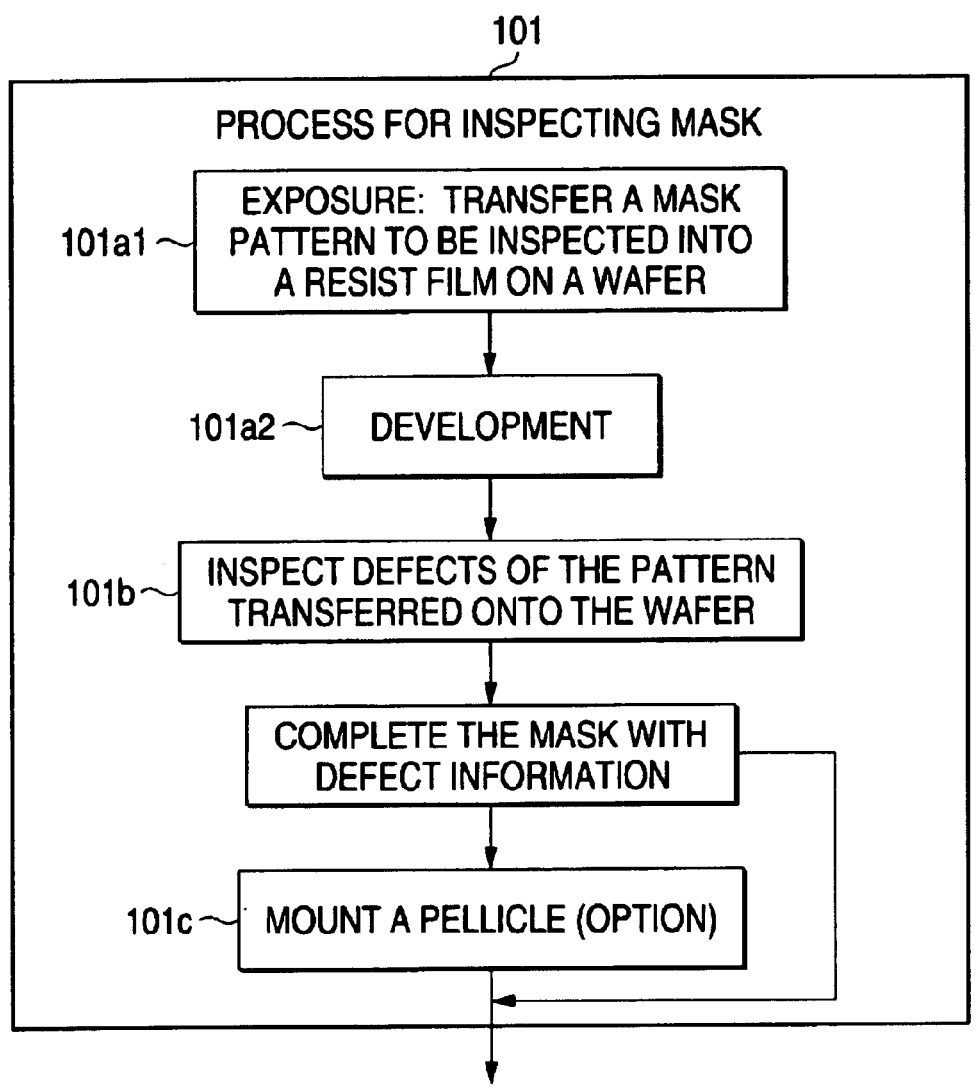
FIG. 24 is a detailed flow chart illustrating the process for inspecting a photomask shown in FIG. 1.

Next, a method for inspecting the masks (masks shown by masks M, NM1, NM2 and RM1 to RM4) will be described. FIG. 24 is a flow chart illustrating the process 100 for inspecting a mask shown in FIG. 1 in detail. In the embodiment, a pattern on a mask to be inspected is transferred into a resist film on a wafer using a reduced projection exposure system, such as a stepper or scanner, as described above (step 101a1 and step 101a). Subsequently, the resist film on the wafer is developed, and thereby a pattern of the resist film is formed on the wafer (step 101a2 and step 101a). Then, the pattern transferred onto the wafer is inspected for defects using a pattern defect inspection system. Here, as a defect inspecting method, a method in which the topology of patterns in different chip areas on the same wafer are compared with each other using the chip area CA is a unit, for example, (step 101b). According to this inspection, defect information on the mask is obtained. In this manner, in the embodiment, the mask is completed with defect information. After that, a first main surface of the inspected mask has a pellicle mounted thereon (step 101c), and the process proceeds to the subsequent process 102 for transferring a pattern into a resist film on a wafer shown in FIG. 1.

Figure 25:
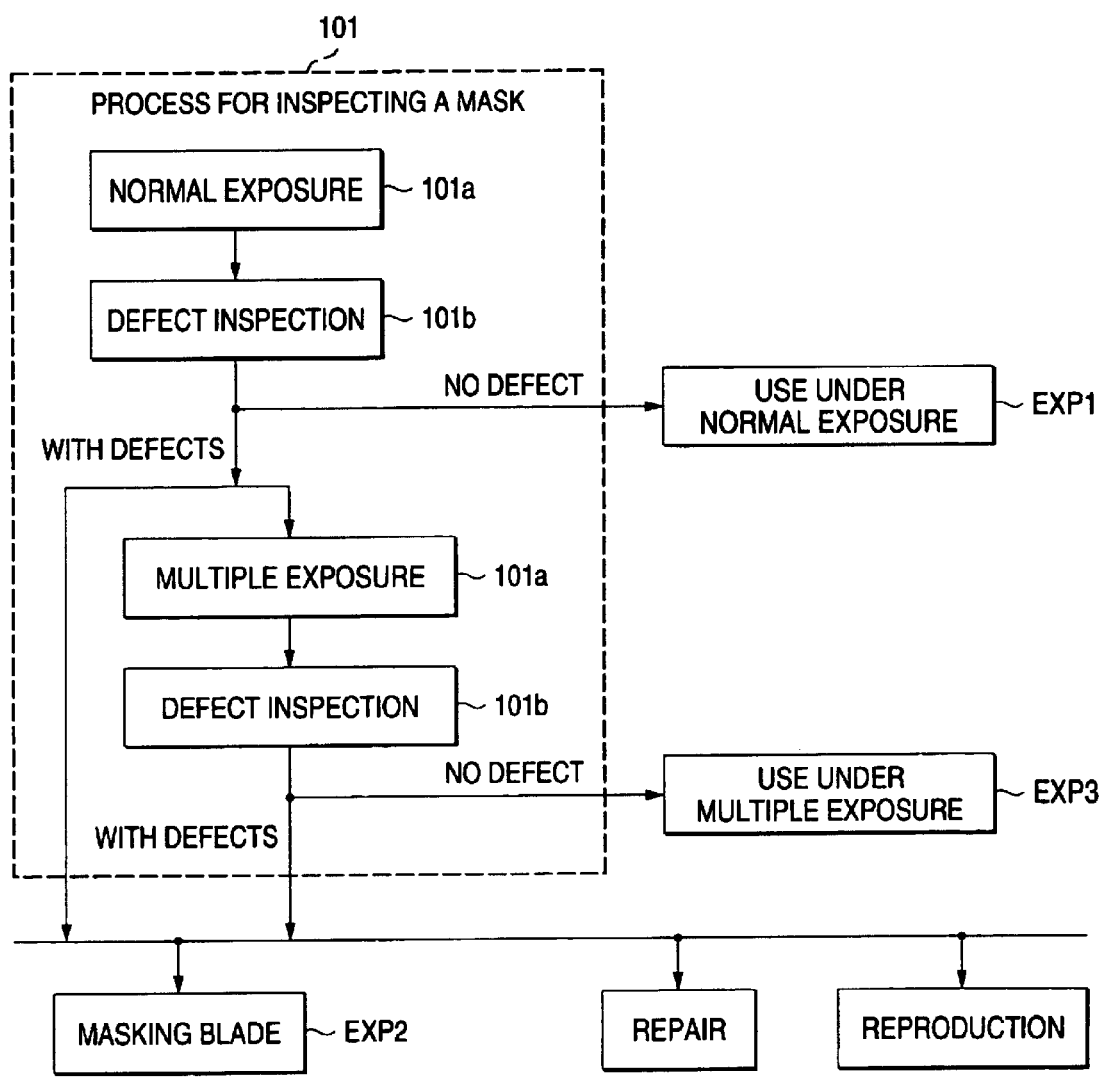
FIG. 25 is a specific flow diagram of the process for inspecting a photomask shown in FIG. 24 and an exposure process using the inspection result.

Next, one specific example of the method for inspecting the masks (masks shown by the masks M, NM1, NM2 and RM1 to RM4) and a method for exposing an integrated circuit pattern based on the inspected result will be described with reference to a flow chart shown in FIG. 25.

First, a resist film on a test wafer is normally exposed using the mask to be inspected and then is developed, and thereby a resist pattern is formed on the test wafer (step 101a). Additionally, normal exposure referred to here is a term in contrast with multiple exposures, which means that it is not multiple exposures.

Subsequently, topology of the patterns in the different chip areas on the test wafer is compared by the defect inspection system and thereby the acceptability of the transferred resist pattern is inspected. When it is determined that there are no defects here, the mask is used to expose a resist film on a wafer for actual product, and thereby an integrated circuit pattern is transferred into the resist film (step EXP1). On the other hand, when it is determined that there are defects, mask fabrication time, reliability, costs or some of those are considered to select the best one from an exposure method using a masking blade that will be described later (step EXP2), a multiple exposure method, mask repair or mask reproduction. However, accordance with the concept of the invention, a technique is selected by a priority in which defects are not transferred onto a wafer substantially even though a mask having the defects is used in transferring an actual integrated circuit pattern onto the wafer, and thereby the mask is not repaired or reproduced as much as possible. Accordingly, mask fabrication time can be shortened. In addition, mask costs can be reduced.

The multiple exposure method is a technique utilizing the fact that performing multiple exposures eliminates or reduces defects. In this case, the resist film on the test wafer is processed into multiple exposures using the mask to be inspected (step 101a) and then is developed, and the resist pattern formed on the wafer undergoes defect inspection (step 101b). As the result of the inspection, when it is determined that there is no defect, the mask is used to apply multiple exposure that has been performed in the inspection to a resist film on a wafer for actual products and thereby the integrated circuit pattern is transferred into the resist film. Multiple exposure processing performed in the inspection means that double exposure is performed in exposure processing for transferring an actual integrated circuit pattern when double exposure has been performed in the inspection, and triple or quadruple exposure is performed in exposure processing for transferring an actual integrated circuit pattern when triple or quadruple exposure has been performed in the inspection (step EXP3). On the other hand, when defects on the wafer are not eliminated even with multiple exposure processing, such factors as mask fabrication time, reliability, costs or some of these are considered to select the best one from the exposure method using the masking blade (step EXP2), mask repair or mask reproduction. Here, also in view of the shortening of the mask fabrication time and reducing mask costs, a technique is selected by priority that defects are not transferred onto a wafer substantially even though a mask having the defects is used in transferring an actual integrated circuit pattern onto the wafer. Thereby, a mask is not repaired or reproduced as much as possible.

Next, the exposure method using the masking blade, the multiple exposure method, mask repair and mask reproduction will be described.

Figure 26:
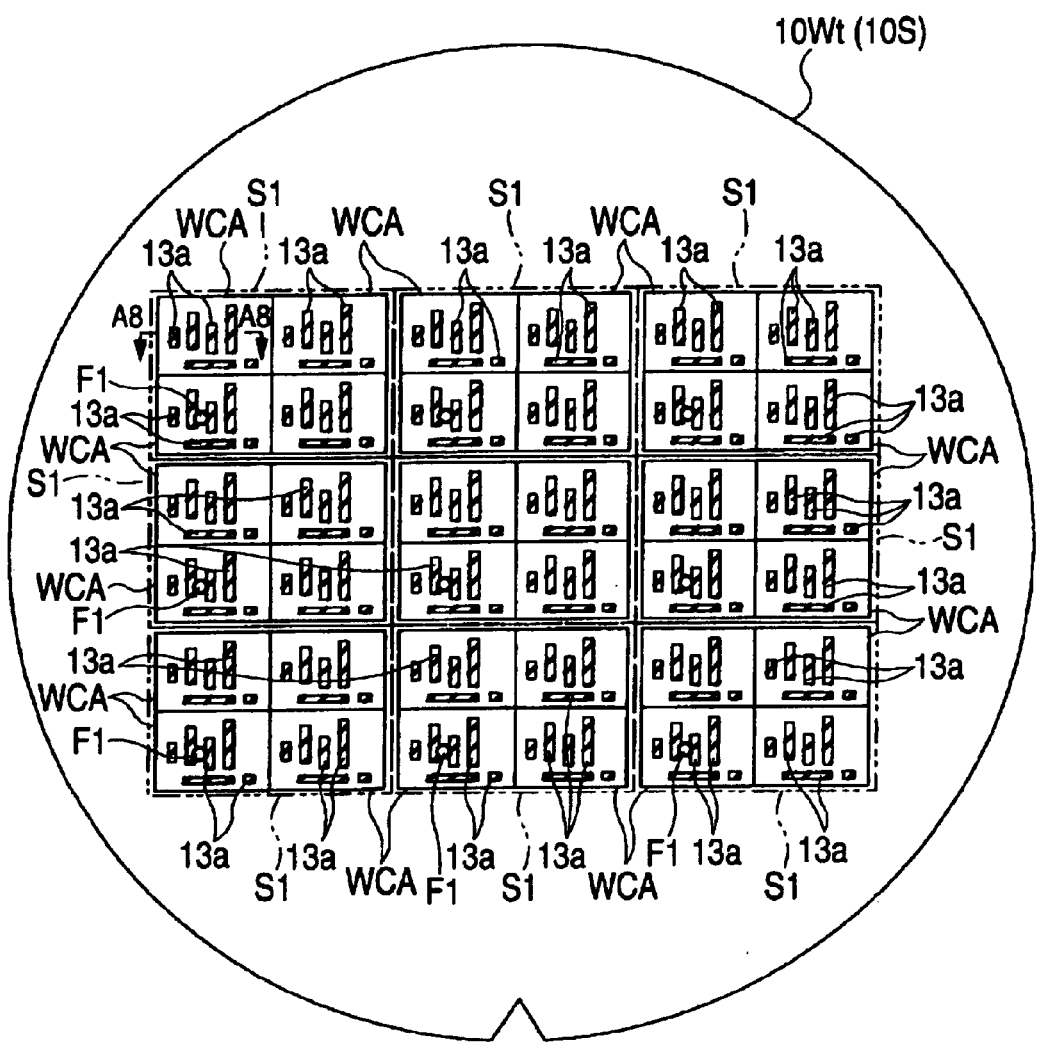
FIG. 26 is a whole plan view illustrating a test semiconductor wafer during the process for inspecting a photomask.
Figure 27:
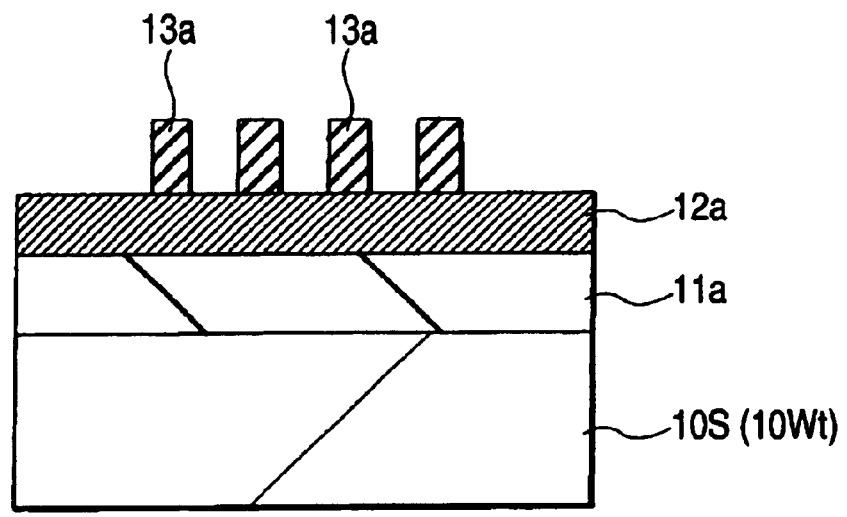
FIG. 27 is a section view taken along line A8—A8 shown in FIG. 26.

First, the exposure method using the masking blade will be described. FIG. 26 is one example of a whole plan view illustrating a test wafer 10Wt after exposed and developed in the inspection stage described above. In addition, FIG. 27 is a section view taken along line A8—A8 in FIG. 26. A semiconductor substrate 10S configuring the wafer 10Wt is made of silicon single crystal, for example. Over the device surface thereof, an insulating film 11a comprised of a silicon oxide film, for example, is deposited. Over the insulating film 11a, a conductive film 12a made of metal or polycrystalline silicon is deposited. On the conductive film 12a, resist patterns 13a, transferred by a mask to be inspected are formed. Here, the case where only one mask to be inspected is used to expose the entire main surface of the wafer 10Wt is shown. Additionally, the case of using a mask having four chip areas thereon is exemplified here. Furthermore, chain double-dashed lines around four chip areas WCA on the wafer 10Wt indicate a one-shot transfer area S1.

Here, it is shown that the defect inspection has detected defects F1 on the wafer 10Wt. The defect F1 is located at the same position in each shot S1. Thus, it is known that the source exists at the same position on the mask to be inspected. Then, in exposure processing for transferring an actual integrated circuit pattern, the resist film on the wafer is exposed as chip areas on the mask with the source of the defect F1 being shielded with a masking blade.

Figure 28:
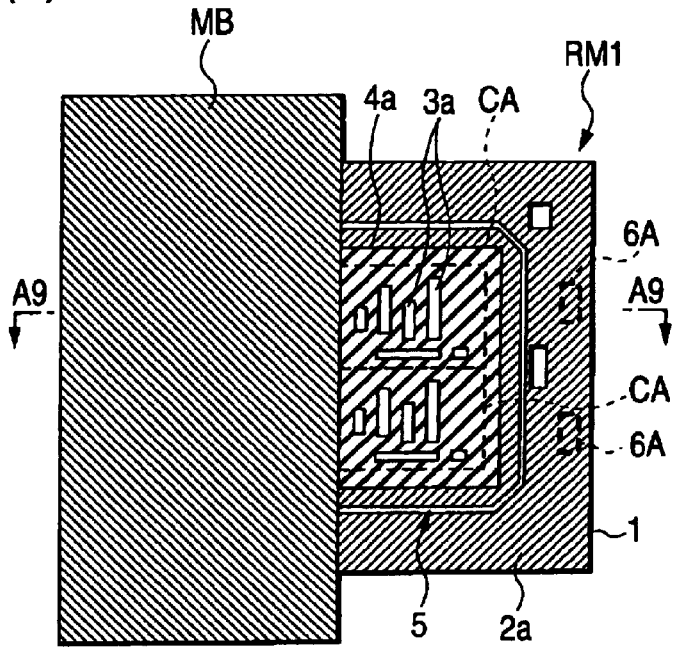
FIG. 28(a) is a top plan view and 28(b) is a side sectional view illustrating the apparatus during the exposure process of semiconductor integrated circuit devices according to one embodiment of the invention.
Figure 28:
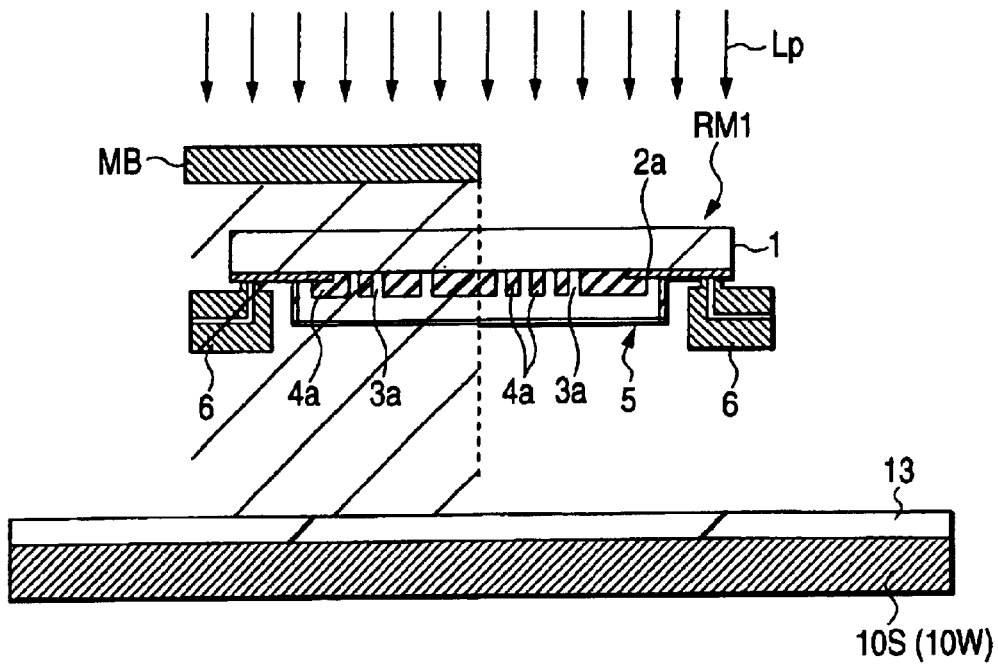

FIGS. 28(a) and 28(b) schematically depict the process. FIG. 28(a) is a plan view schematically illustrating the process. FIG. 28(b) is a schematic section view taken along line A9—A9 in FIG. 28(a). Here, optical systems of an exposure system are not shown for ease of understanding of the drawings. Additionally, the mask RM1 shown in FIG. 4(a) is shown as a mask, but is not limited thereto; the masks NM1, NM2, RM2 to RM4 and M can also be used.

A resist film 14A is applied to the main surface of a wafer 10W. As the result of the mask inspection, it was found that a source of the defects exists in a chip area CA on the bottom left side of the mask RM1. Thus, the area is covered with a masking blade MB and a resist film on the main surface of the wafer 10W is exposed as exposing lights Lp indicated by arrows shown in FIG. 28(b) are shielded so as not to transfer the area covered by the blade MB onto the main surface of the wafer 10W. In addition, what the masking blade MB is to cover is an internal area where the chip areas in the one-shot area are not extended over the periphery of the wafer, that is, the areas to be transferred as complete chip areas in the main surface of the wafer 10W.

In this manner, exposure is performed as the chip areas CA having the defects in the mask RM1 are covered, that is, chip areas CA having no defects in the mask RM1 are selected and exposed. Thereby, the mask RM1 having the defects is used as it is without repairing the defects on the mask RM1, or reproducing the mask RM1 and exposure processing for transferring an actual integrated circuit pattern onto a wafer can be performed. Thereby, time for defect repair or reproduction can be saved and thus delay in a delivery period of the mask RM1 could be eliminated and QTAT in the semiconductor integrated circuit device could be realized. According to the study by the inventors, in the case of exposure processing using the masking blade, the exposure time for a wafer is increased by about one and half times, but defect repair work is not needed. Thus, slowdown of semiconductor integrated circuit device manufacture could be prevented and semiconductor integrated circuit devices could be manufactured substantially in QTAT. Accordingly, it is particularly effective for products having a problem of reducing time that a client provides mask data to complete semiconductor integrated circuit devices such as ASICs. In addition, it has an excellent feature that masks can be fabricated in QTAT because the etching process is not needed in resist masks. However, according to this method, defect repair of a mask can be eliminated and time losses due to the defect repair become unnecessary. Therefore, the excellent features of the resist mask can be exerted sufficiently. Furthermore, a defect repair system for masks (normal masks and resist masks) can be eliminated and equipment investment for mask fabrication can be suppressed to the minimum. Thus, mask costs can be reduced. Accordingly, costs for a semiconductor integrated circuit device can be curtailed.

Figure 29:
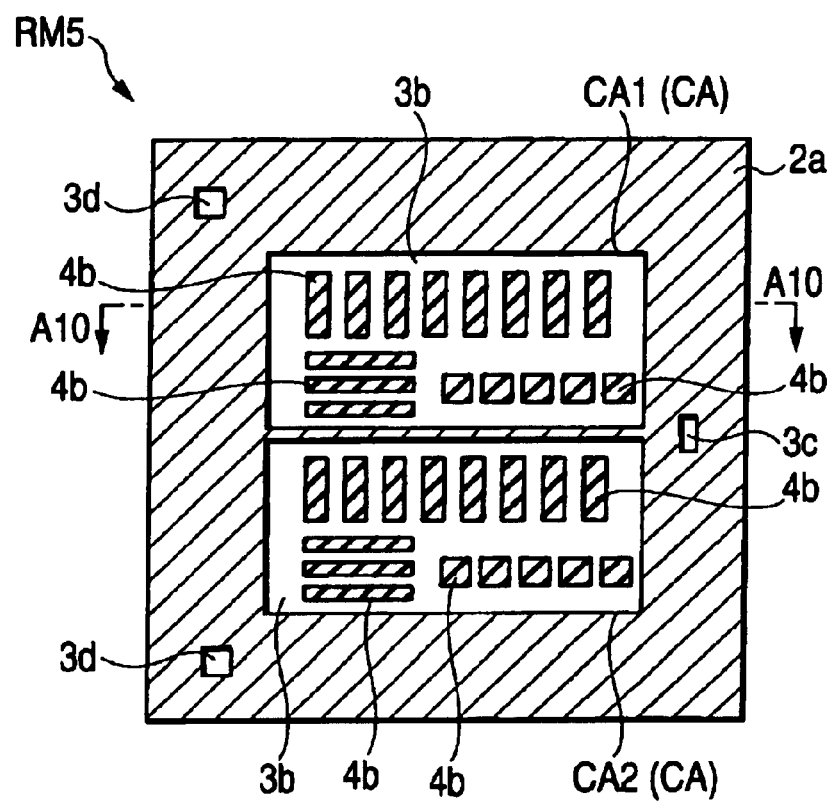
FIG. 29(a) is a plan view illustrating a photomask for use in the exposure process of semiconductor integrated circuit devices of one embodiment of the invention.
FIG. 29(b) is a section view taken along line A10—A10 in FIG. 29(a)
Figure 29:
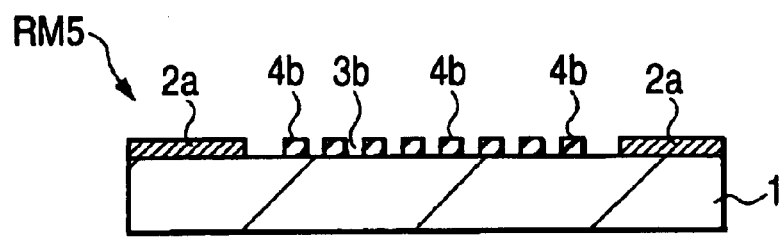

Next, the multiple exposure method will be described. Here, the case where a resist mask is used for multiple exposures will be described. FIG. 29(a) is a whole plan view illustrating a mask RM5. FIG. 29(b) is a section view taken along line A10—A10 shown in FIG. 29(a).

The mask RM5 shows the chip areas CA thereof being a type shown in FIG. 16(a). At the center of a first main surface of a mask substrate 1, two planar rectangular chip areas CA1 and CA2 (CA), for example, are spaced with a light shielding film 2a so as to arrange the long sides in parallel with each other. The chip areas CA1 and CA2 are formed with a mask pattern having the same shape, alignment positions and dimensions. The mask pattern is a pattern for transferring a predetermined integrated circuit pattern, which is configured of a light transparent area 3b and light shielding patterns 4b disposed in the area. In addition, the predetermined integrated circuit pattern also includes patterns that are not actually used to configure an integrated circuit, such as a mark pattern for use in overlay, a mark pattern for use in overlay inspection or a mark pattern for use in electric characteristic inspection, other than patterns for configuring the actual integrated circuit.

Figure 30:
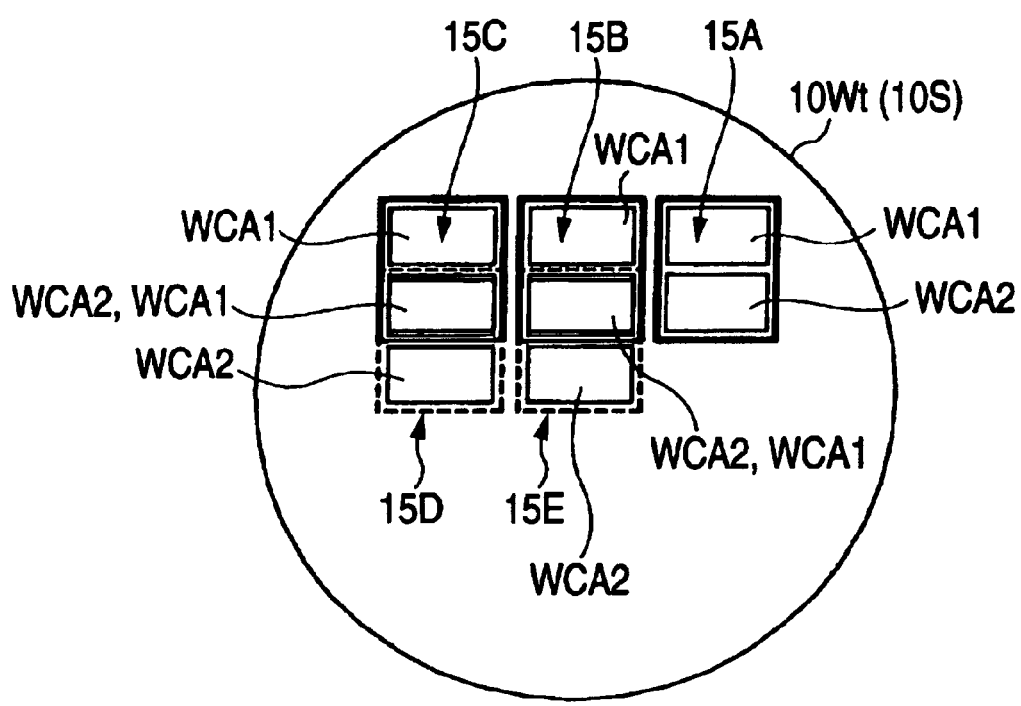
FIG. 30 is a plan view of a wafer being subjected to multiple exposures during the exposure process shown in FIGS. 29(a) and 29(b)

Next, the multiple exposure method will be described, exemplifying the case where the mask RM5 is used for double exposure. FIG. 30 is a whole plan view illustrating a wafer 10Wt (10W) in exposure processing using the mask RM5.

As the exposure method, a step-and-scan exposure method was adopted, for example. The exposure conditions were as follows. That is, KrF excimer laser light having an exposing wavelength of about 248 nm is used as exposing light, the numerical aperture NA of an optical lens was 0.65, the shape of illumination is circular, and the value of coherency (σ: sigma) was 0.7. The exposing light is not limited to that described above, which can be modified variously; for example, ArF excimer laser having a wavelength of about 193 nm may be used.

Over the main surface of the wafer 10Wt, a positive resist film having a thickness of about 500 nm, for example, is deposited. In the case of double exposure, the amount of a first time exposure is set a half time the amount of exposure required, so that the full amount of exposure required is secured by performing double exposure. Here, the amount of the first time exposure is set to 25 mJ/cm$^2$, for example; it was adjusted to be 50 mJ/cm$^2$ by double exposure, for example. The minimum pattern inside the mask RM5 is a line-and-space of 150 nm converted on the wafer 10Wt, for example.

First, the chip areas CA1 and CA2 on the mask RM5 are transferred onto an area 15A on the main surface of the wafer 10Wt by scanning exposure processing described above. That is, the mask RM5 and the wafer 10Wt are moved in the relatively opposite direction (the vertical direction of FIG. 30) as the main surfaces thereof are kept in parallel and a slit-like exposure area is moved in the main surface of the wafer 10Wt. Thereby, a mask pattern (integrated circuit pattern) inside the chip areas CA1 and CA2 on the mask RM5 is transferred onto chip areas WCA1 and WCA2 in the area 15A on the main surface of the wafer 10Wt. Subsequently, the wafer 10Wt is moved in parallel in the right direction of FIG. 30 and areas 15B and 15C are sequentially exposed in a manner similar to that described above. The amount of exposure time in these areas 15A, 15B and 15C is set to about a half the required amount.

Subsequently, the wafer 10Wt is moved by an amount corresponding to one of the chip areas WCA1 and WCA2 in the upper direction of FIG. 30 and then an area 15D is exposed as similar to that described above. At this time, in the embodiment, a chip area WCA1 in the area 15D is to overlay a chip area WCA2 previously transferred in the area 15C two-dimensionally. That is, the chip area CA1 in the same mask RM5 is two-dimensionally overlaid and transferred onto the chip area WCA2, where the chip area CA2 in the mask RM5 has been transferred.

Then, the wafer 10Wt is moved in parallel in the left direction of FIG. 30 and an area 15E is sequentially exposed as similar to that described above. Here, a chip area WCA1 in the area 5E is to overlay a chip area CA2 previously transferred in the area 15B two-dimensionally. That is, the chip area CA1 in the same mask RM5 is two-dimensionally overlaid and transferred onto the chip area WCA2, where the chip area CA2 in the mask RM5 has been transferred. The exposure amount in the areas 15D and 15E is set to about a half of the required amount. Accordingly, the exposed amount is the required amount in the area where the areas 15A to 15E are overlaid. Such multiple exposure processing is repeated in the entire main surface of the wafer 10Wt, and thereby a plurality of chip areas are transferred onto the wafer 10Wt.

Additionally, in the above-mentioned description, the chip areas WCA1 of the outermost transfer areas 15A, 15B and 15C are not processed into double exposure. However, these portions were processed into double exposure in a state in which the chip area CA1 of the mask RM5 is shielded with a masking blade and the chip area CA2 of the mask RM5 is overlaid with the chip areas WCA1 of the wafer 10Wt of FIG. 30 two-dimensionally for exposure, for example.

According to such double exposure processing, defects can be prevented from being transferred onto the wafer 10Wt (10W) even though the mask RM5 has the defects. This occurs for the following reason. For example, in the case of double exposure, the amount of exposure at one time is set to a half time the amount of required exposure that is needed for transferring a pattern onto the wafer 10Wt (10W), as described above. On the other hand, at the current level of defect generation, the probability of occurrence that defects exist at the same positions in different chip areas on a mask (a position to be the same when overlaid) is nearly zero. More specifically, defects rarely exist on the same positions in the different chip areas on the mask. Accordingly, when the different chip areas CA on the mask RM5 are overlaid each other and exposed, defect portions where overlay is not generated on the mask RM5 cannot obtain the amount of exposure required, and thus they are not transferred onto the wafer 10Wt (10W). The principle of defect transfer prevention is the same in the cases of triple and quadruple exposures. If anything, as the number of overlay is increased, the amount of exposure at one time is reduced. Thus, the performance of defect transfer prevention can be enhanced.

In addition, even though defects are transferred, they can be detectable, larger defects. For example, defects of 0.2 μm or greater on the mask RM5 were transferred by a stepper, whereas much greater defects of 0.4 μm or greater on the mask RM5 are transferred in the embodiment. More specifically, defects less than 0.4 μm on the mask RM5 are eliminated in exposure onto the wafer 10Wt (10W), and thus they can be ignored. Therefore, the defect inspection and defect repair of the mask RM5 can be facilitated.

In the embodiment under the exposure conditions described above, patterns of 0.25 μm, for example, could be formed excellently on the entire surface of the chip areas on the wafer 10Wt (10W) with the accuracy of 0.25±0.02 μm. The generation of short-circuit failure between patterns due to defects on the mask RM5 was not recognized. On the other hand, patterns of 0.25 μm, for example, were formed on the entire surface of the chip areas on the wafer 10Wt (10W) with an accuracy of 0.25±0.025 μm in a technique in which double exposure is not performed under the same conditions. Furthermore, it was found that short-circuit failure between the patterns had been generated at two locations in the chip on the wafer 10Wt (10W).

Figure 31:
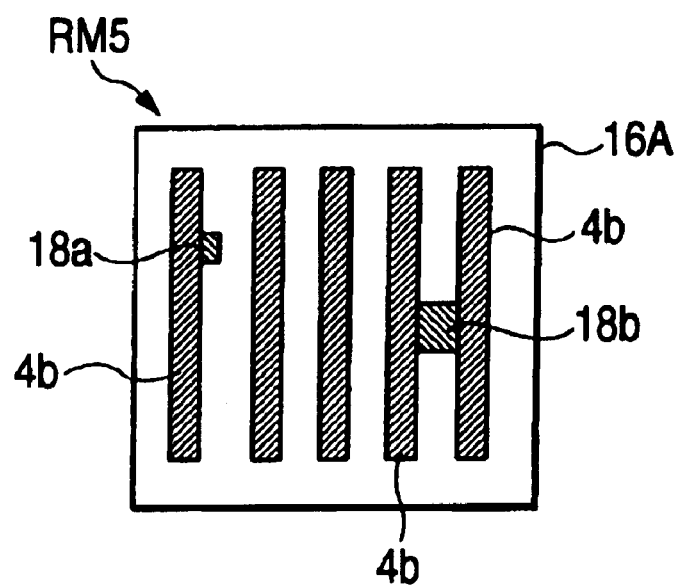
FIG. 31(a) is a plan view illustrating a principal part of a chip area of a photomask.
FIG. 31(b) is a plan view illustrating a photoresist pattern when the photomask shown in FIG. 31(a) is exposed one time in exposure processing using a scanner.
Figure 31:
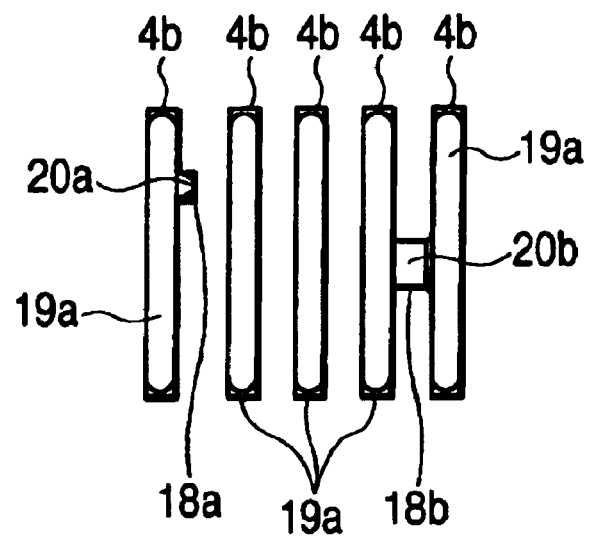
Figure 32:
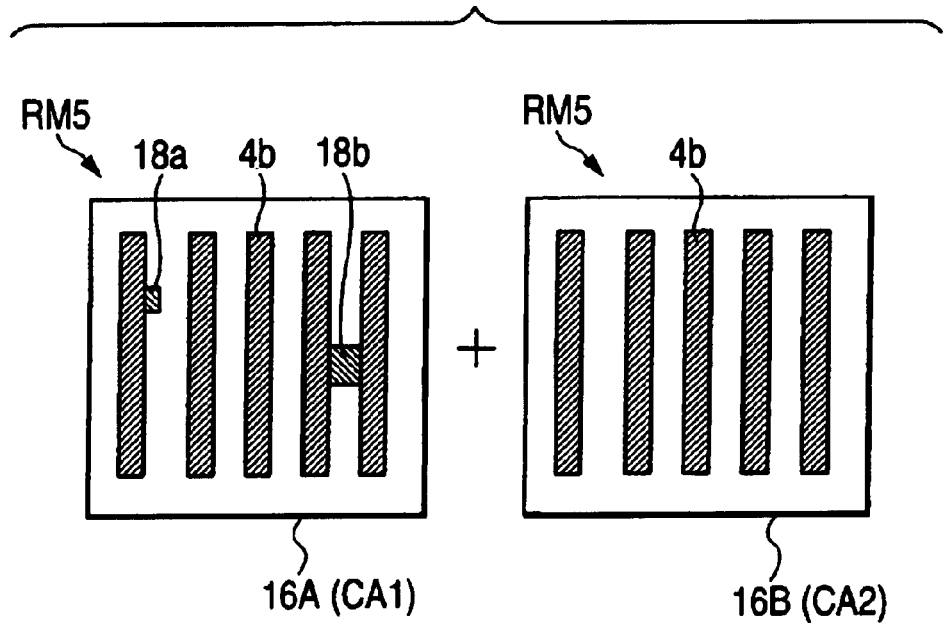
FIG. 32(a) is plan views of principal parts of two chip areas on a photomask.
FIG. 32(b) is a plan view illustrating a photoresist pattern when the two chip areas shown in FIG. 32(a) are overlaid and exposed using a scanner.
Figure 32:
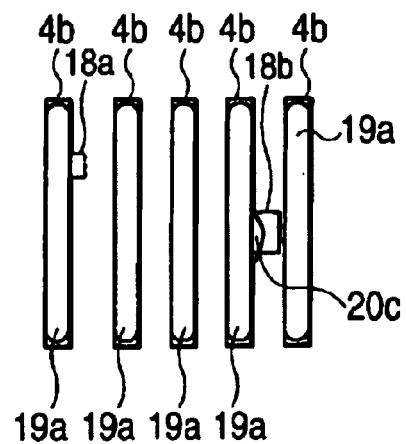

The result studying the portions of short-circuit failure will be described with reference to FIGS. 31(a) to 32(b). FIG. 31(a) is a plan view illustrating a principal part of the mask RM5. In an area 16A, light shielding patterns 4b of 0.25 μm are disposed at a space of 0.25 μm, for example. Defects 18a and 18b exist in the area 16(a). The defect 18b is relatively greater than the defect 18a in planer dimensions, which is arranged so as to bridge between the adjacent light shielding patterns 4b. FIG. 31(b) depicts a result showing that such the area 16A was exposed by a scanner without double exposure processing (that is, exposed at one time). In this case, resist remnants 20a and 20b caused by the defects 18a and 18b on the mask RM5 were transferred, in addition to normal resist patterns 19a. Among these, the resist remnant 20b caused a short-circuit failure between the patterns. Besides, FIG. 31(b) also depicts light shielding patterns 4b and the defects 18a and 18b in order to understand relative locations of the resist patterns 19a and the resist remnant 20b to the light shielding patterns 4b and the defects 18a and 18b on the mask RM5.

On the other hand, in the double exposure method described above, results shown in FIGS. 32(a) and 32(b) were obtained. FIG. 32(a) is a plan view illustrating a principal part of the mask RM5. Areas 16A and 16B have the same patterns, where light shielding patterns 4b similar to that described above are arranged at a space of 0.25 μm, for example. In exposure processing of the embodiment, the areas 16A and 16B are overlaid and exposed by a half amount of exposure, and thereby portions with defects and portions with no defects are processed into double exposure. Thus, transferring defects onto a wafer is reduced or completely eliminated. FIG. 32(b) is the transfer result. At the location corresponding to a defect 18a in the area 16A of the mask RM5, a deformation of a resist pattern 19a was not recognized. On the other hand, at the location corresponding to a defect 18b in the area 16A of the mask RM5, a deformation of a resist pattern 19a (a resist remnant 20c) was recognized, but it was found that it does not cause short-circuit failure between the patterns. According to the inspection result, such pattern defects on a wafer may be repaired by repair processing using energy beams such as an FIB (Focused Ion Beam), if necessary. In this case, an amount of pattern that is deformed can be made relatively smaller, and thus the repair can be made easily. In addition, FIG. 32(b) depicts the light shielding patterns 4b and the defects 18a and 18b in order to understand relative locations of the resist patterns 19a and the resist remnant 20c to the light shielding patterns 4b and the defects 18a and 18b on the mask RM5.

Figure 33:
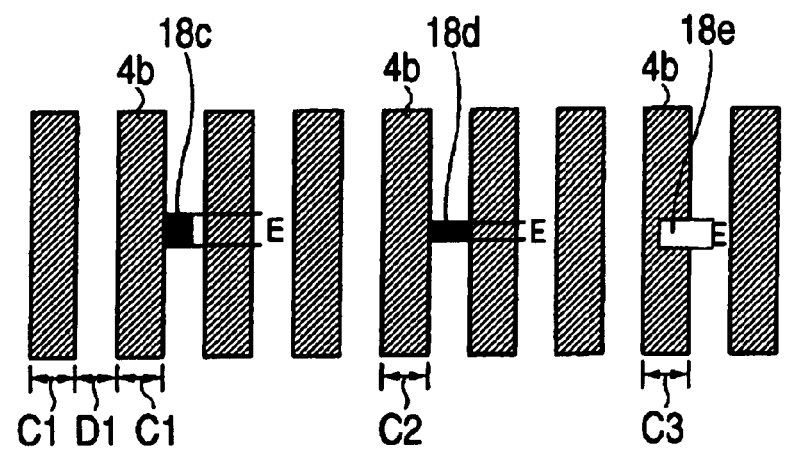
FIG. 33(a) is a plan view illustrating a principal part of a chip area having defects in a photomask.
FIG. 33(b) is a plan view illustrating a principal part of a chip area having no defects in a photomask.
Figure 33:
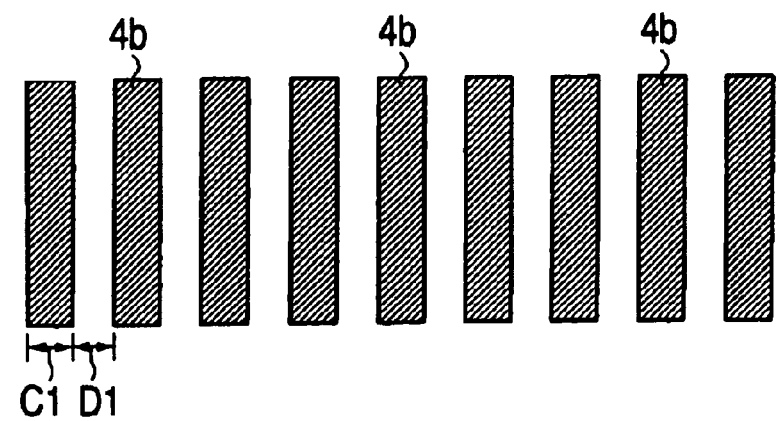
Figure 34:
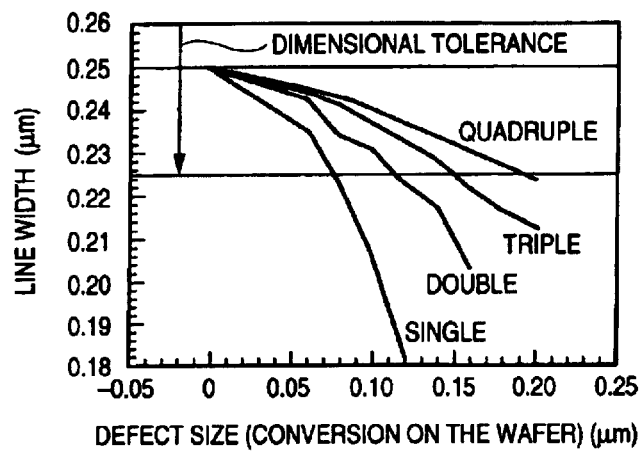
FIGS. 34(a) to 34(c) are graphs illustrating evaluation results from measurements of transferred patterns in the cases of using only the photomask shown in FIG. 33(a) and of overlaying and exposing the photomasks shown in FIGS. 33(a) and 33(b) twice or more in exposure processing by a scanner.
Figure 34:
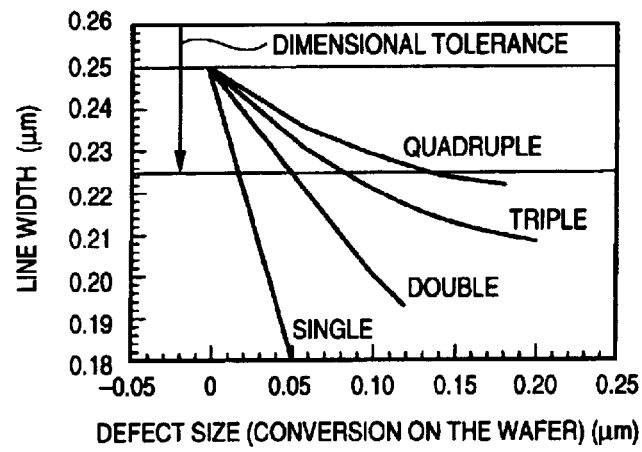
Figure 34:
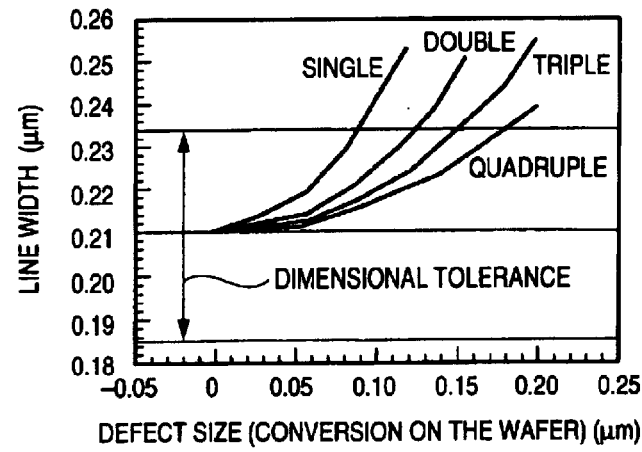

Furthermore, the inventors investigated the influence of defects on a mask upon the dimensions of transferred patterns when the number of multiple exposures is increased. Exposure conditions in this case are as follows. KrF excimer laser light having a wavelength of 248 nm is used as an exposing light source of a scanner and the numerical aperture NA of a projection optical lens part was 0.65, for example. In addition, FIGS. 33(a) and 33(b) depict plan views illustrating a principal part of a transfer area of masks used this time. FIG. 33(a) is a plan view illustrating a principal part of a transfer area (chip area) with defects. FIG. 33(b) is a plan view illustrating a principal part of a transfer area (chip area) of masks with no defects. The transfer areas in FIGS. 33(a) and 33(b) are arranged with a plurality of planar rectangular light shielding patterns 4b. In each of the transfer areas, a width C1 of the light shielding pattern 4b and a space dimension D1 between adjacent ones are about 0.25 μm, for example. FIG. 33(a) exemplifies three kinds of defects 18c to 18e. The defect 18c is a light shielding defect of a planar square shape, whose one side is smaller than the space dimension D1. Additionally, the defect 18d is a light shielding defect of a planar rectangular shape, whose long side is equal to the space dimension D1. Furthermore, the defect 18e is a transparent defect of a planar square shape, whose one side is smaller than the width C1. The size of a defect was indicated by a variable E. In exposure processing, patterns with defects of FIG. 33(a) and patterns with no defects of FIG. 33(b) were overlaid several times for exposure. Then, dimensions of the transferred patterns to dimensions C1 to C3 of the light shielding patterns 4b were evaluated. FIGS. 34(a) to 34(c) depict the evaluation results thereof. FIGS. 34(a) to 34(c) depict measurement results of the dimensions C1 to C3, respectively. In FIGS. 34(a) to 34(c), single denotes the case where only a mask with defects of FIG. 33(a) is used for exposure, double denotes the case where a mask with the defects of FIG. 33(a) is overlaid with a mask with no defects as in FIG. 33(b) for exposure, triple denotes the case where a photomask with no defects of FIG. 33(b) is further overlaid with the double exposure, and quadruple denotes the case where the mask with no defects of FIG. 33(b) is further overlaid with the triple exposure. In each defect, it is known that the influence of defects is reduced as the number of the pattern with no defects overlaid is increased. Moreover, the case of evaluation focused on the dimensions of the patterns was described here. However, as the result of evaluating breakage and short circuits of patterns, it was found that triple exposure or more could prevent the generation of breakage and short circuits despite the dimensions of defects. Besides, according to the exposure method of the invention, the dimensions are averaged and thus the distribution accuracy of pattern dimensions could be enhanced as well. Here, the difference between the maximum dimensions and the minimum dimensions was 0.036 μm, for example. That is, variations in dimensions could be reduced to about a half. Accordingly, in the case of the resist mask, it does not have the etching process for forming a mask pattern, and thus it has a characteristic that enhances the dimensional accuracy of patterns by that amount. However, the use of multiple exposures can further improve the characteristic.

Figure 35:
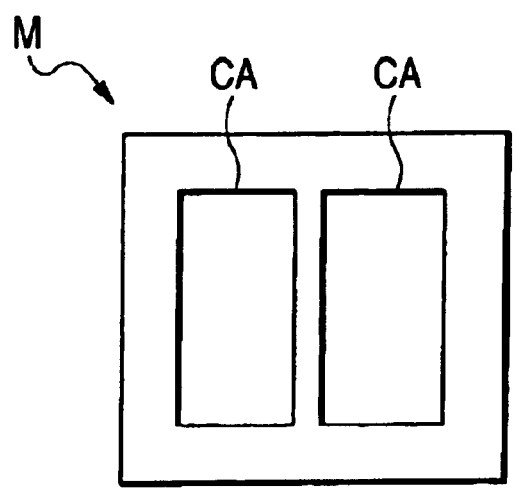
FIGS. 35(a) to 35(c) are plan views showing multiple exposures selectable according to the arrangement of chip areas on a photomask.
Figure 35:
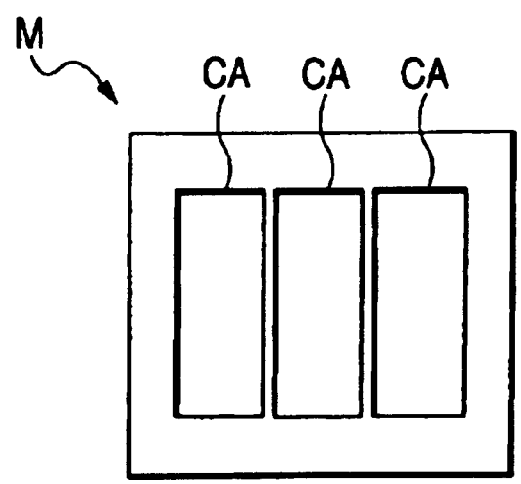
Figure 35:
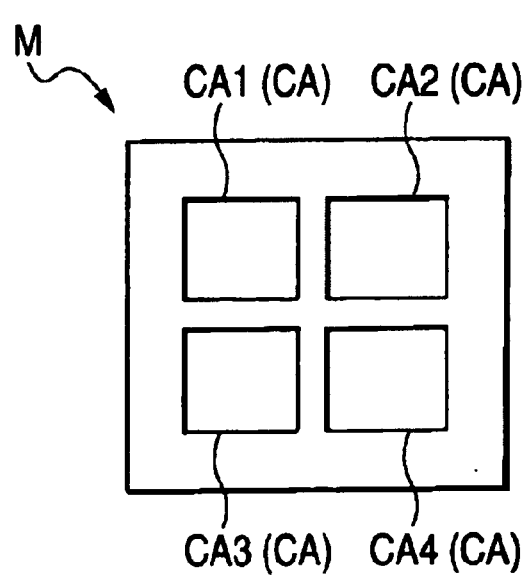

FIGS. 35(a) to 35(c) depict the number of multiple exposures selectable according to the number of chip areas CA in a mask M (a mask exemplified by the masks NM1, NM2 and RM1 to RM4). In the mask M shown in FIG. 35(a), it possible to undergo double exposure by overlaying two chip areas CA and CA in exposure. In the mask M shown in FIG. 35(b), it is possible to undergo triple exposure by overlaying three chip areas CA, CA and CA in exposure. In addition, in the mask M shown in FIG. 35(c), it is possible to undergo double exposure and quadruple exposure. In the case of double exposure, there are methods of overlaying chip areas CA1 with CA3 and chip areas CA2 with CA4, and of overlaying chip areas CA1 with CA2 and chip areas CA3 with CA4. In the case of quadruple exposure, it can be realized by overlaying chip areas CA1 to CA4 each other. The number of exposures is selected according to the conditions of defects (size or number). Furthermore, a multiple exposure technique is described in Japanese Patent Application No. 58359/2000 (filed on Mar. 3, 2000) and Japanese Patent Application No. 39706/2000 (filed on Feb. 17, 2000) by the inventors of the application.

In this manner, the exposure method according to multiple exposures is adopted, that is, defects are prevented from being transferred onto a wafer even though defects exist on the mask. Thereby, a mask with the defects can be used as it is without repairing the defects on the mask or reproducing the mask, and exposure processing for transferring an actual integrated circuit pattern onto a wafer can be performed. Thereby, time for defect repair or reproduction can be saved. Thus, delay in the delivery period of masks could be eliminated and QTAT in semiconductor integrated circuit devices could be realized. Accordingly, also when the multiple exposure method is adopted, it is particularly effective for products having a problem of reducing time that a client provides mask data to complete semiconductor integrated circuit devices, such as ASICs, as similar to the masking blade. Furthermore, when a resist mask is used in the multiple exposure method, defect repair of the mask can be eliminated and time losses due to the defect repair can be unnecessary. Thus, the excellent characteristics of the resist mask can be exerted sufficiently. Moreover, a defect repair system for masks (normal masks and resist masks) can be eliminated, and equipment investment for mask fabrication can be reduced to a minimum. Therefore, mask costs can be reduced. Accordingly, costs for a semiconductor integrated circuit device can be curtailed.

Figure 36:
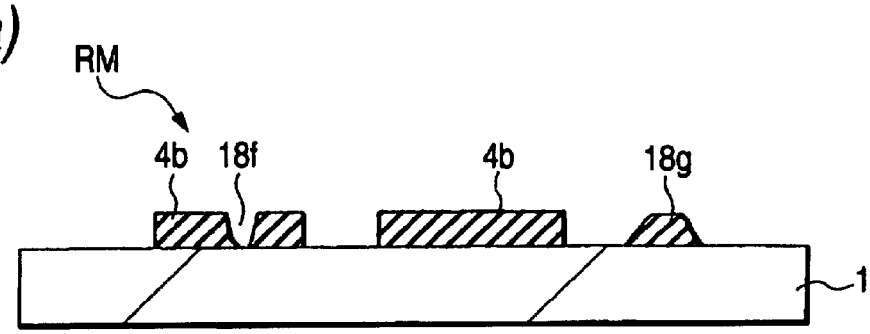
FIGS. 36(a) to 36(c) are sectional views showing steps in a method of repairing defects on a photomask.
Figure 36:
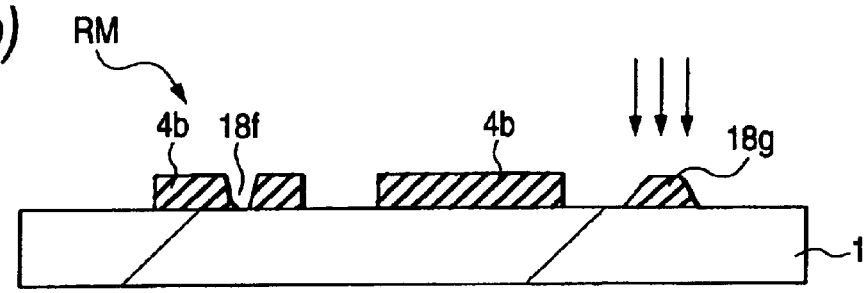
Figure 36:
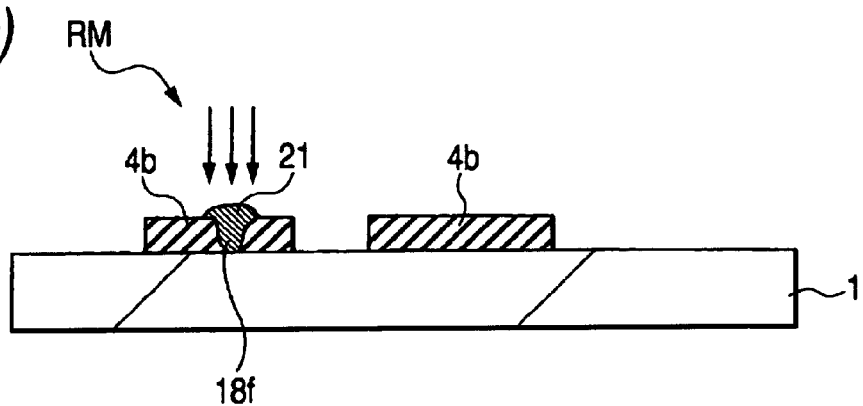

Next, the mask repair will be described. FIGS. 36(a) to 36(c) depict sections illustrating a principal part of a mask substrate 1 in repairing a mask RM (exemplified by the masks RM1 to RM5). FIG. 36(a) is the case of the mask RM with defects 18f and 18g. The defect 18f is a defect in which a light shielding pattern 4b comprised of an organic film is chipped. The defect 18g is a defect in which a light shielding film comprised of an organic film is left at a location which is supposed to be a light transparent area 3b basically. FIG. 36(b) is a manner in which the remnant defect is removed by irradiating energy beams, such as laser light or a Focused Ion Beam (FIB) onto the defect 18g. In addition, FIG. 36(c) is a manner that a light shielding film 21 comprised of an organic film, such as carbon or a metal film such as chromium, is selectably deposited over the portion of the defect 18f by irradiating energy beams, such as laser light or the Focused Ion Beam, in a reaction gas.

Furthermore, in the case of the resist mask (exemplified by the masks RM, and RM1 to RM5), the light shielding film 4a or light shielding pattern 4b comprised of an organic film is removed and then the resist mask fabrication processing is applied. Thereby, the mask can be reproduced. In the case where defects are detected on the mask as a result of the mask defect inspection, and reproduction is considered to be better than the use of the masking blade or the multiple exposure method at that time, the mask reproducing method can be used as well.

Figure 37:
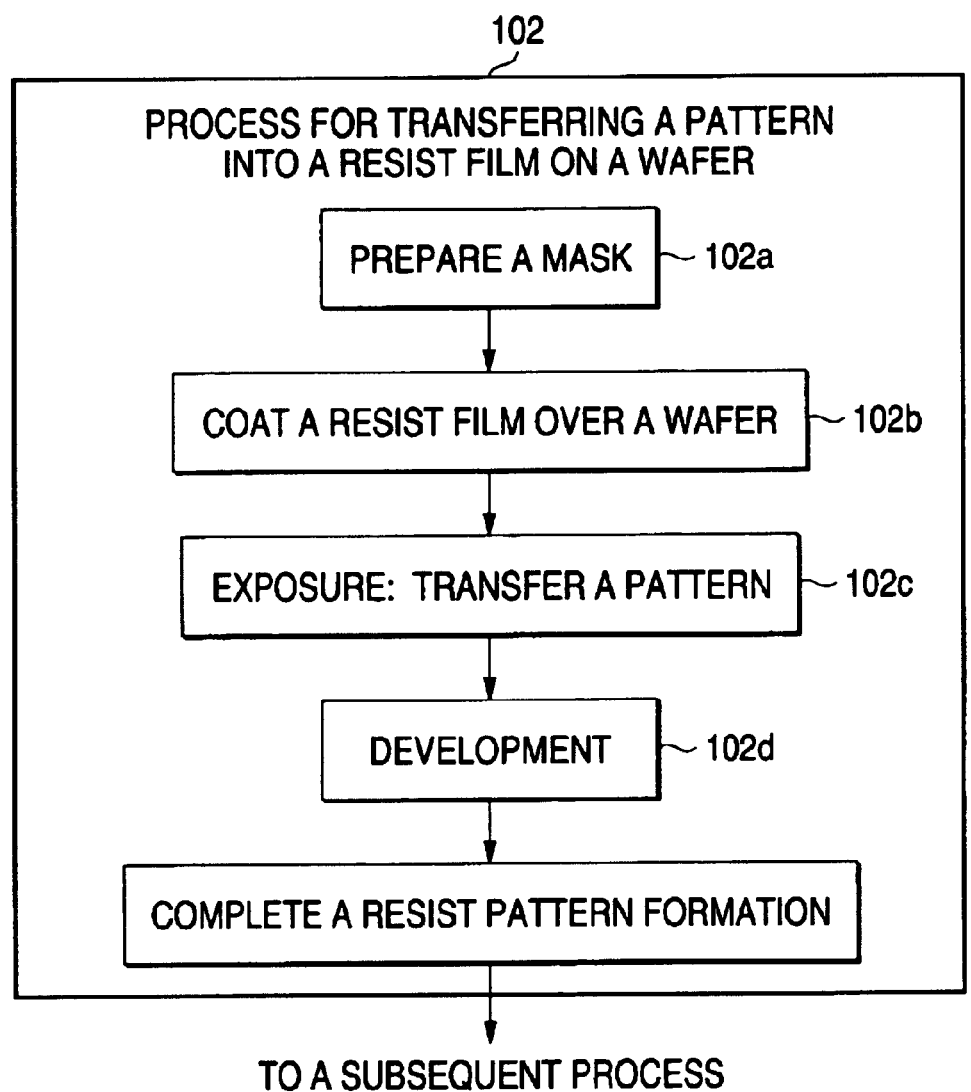
FIG. 37 is a flow chart detailedly illustrating a process for transferring a pattern into a resist film on the semiconductor wafer shown in FIG. 1.
Figure 38:
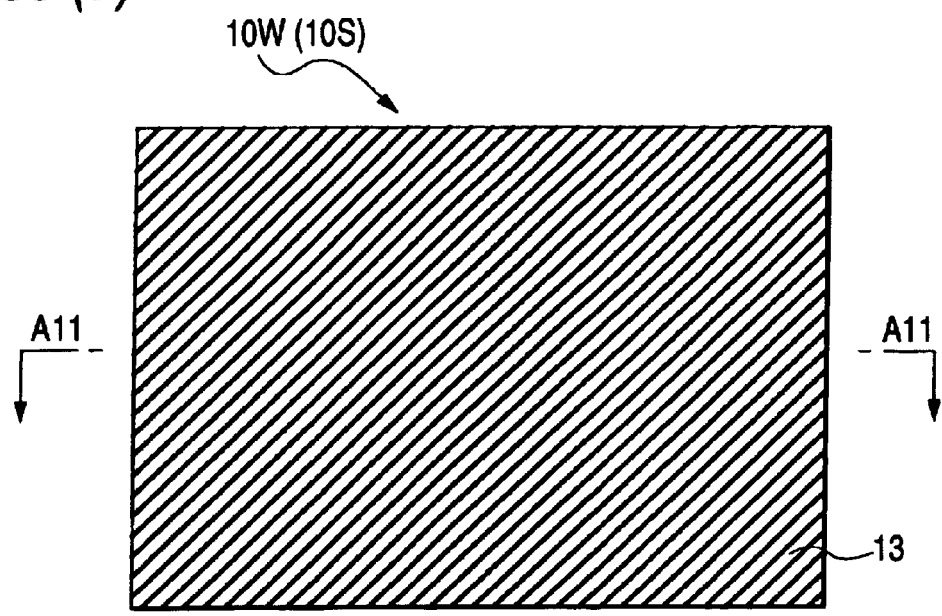
FIG. 38(a) is a plan view illustrating a principal part of a semiconductor wafer during the process for transferring a predetermined pattern onto a semiconductor wafer.
FIG. 38(b) is a section of a line A11—A11 shown in FIG. 38(a)
Figure 38:
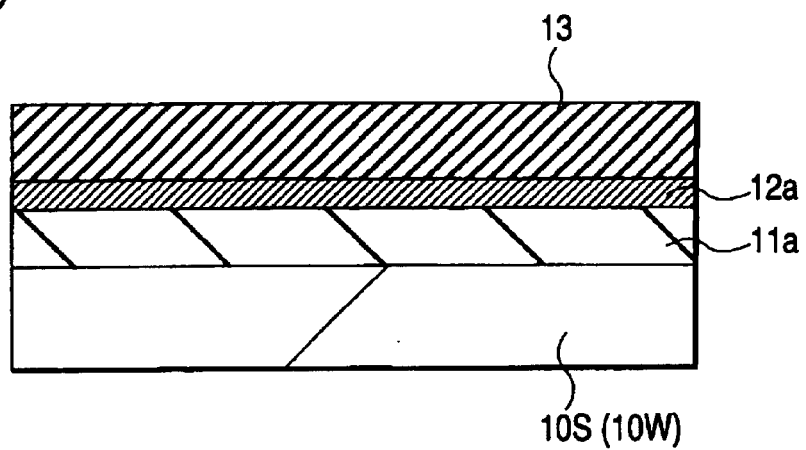

Next, a process for transferring an actual integrated circuit pattern into a resist film on a wafer using the mask (the mask exemplified by the masks NM1, NM2 and RM1 to RM4) will be described. Here, the process for transferring a pattern will be described with reference to FIGS. 38(a) to 42(b) in accordance with FIG. 37, which is a flow chart detailedly illustrating the process 102 for transferring a pattern into a resist film on a wafer shown in FIG. 1.

First, a mask is prepared. The mask has defect information (coordinates of defects and a method for eliminating them) obtained in the mask inspection process (step 102a). When the masking blade is used, the masking blade is set on an exposure system based on the defect information. In addition, when multiple exposures are used, an operation control program of the exposure system is set to perform multiple exposures. The stepper or scanner, for example, is used as the exposure system.

Subsequently, a wafer coated with a resist film over the main surface is prepared (step 102b) and it is set on the exposure system. FIG. 38(a) is a plan view illustrating a principal part of the wafer 10W. FIG. 38(b) is a section view taken along line A11—A11 shown in FIG. 38(a). A resist film 13 is applied to the main surface of the wafer 10W. Furthermore, the main surface of the wafer 10W is formed with integrated circuit elements, such as an MISFET (Metal Insulator Semiconductor Field Effect Transistor), for example, a p-channel MISFET or n-channel MISFET, a bipolar transistor, a diode, a resistor (a diffused resistor or resistor of polycrystalline silicon) or a capacitor.

After that, the resist film 13 on the main surface of the wafer 10W is exposed using the mask. When the masking blade is used, exposure processing is performed with an area in which there are defects on the mask is shielded by the masking blade (see FIGS. 28(a) and 28(b)). In multiple exposure processing, exposure processing is performed by overlaying the mask at the number of times that the mask inspection determined that defects are to be eliminated (step 102c).

Figure 39:
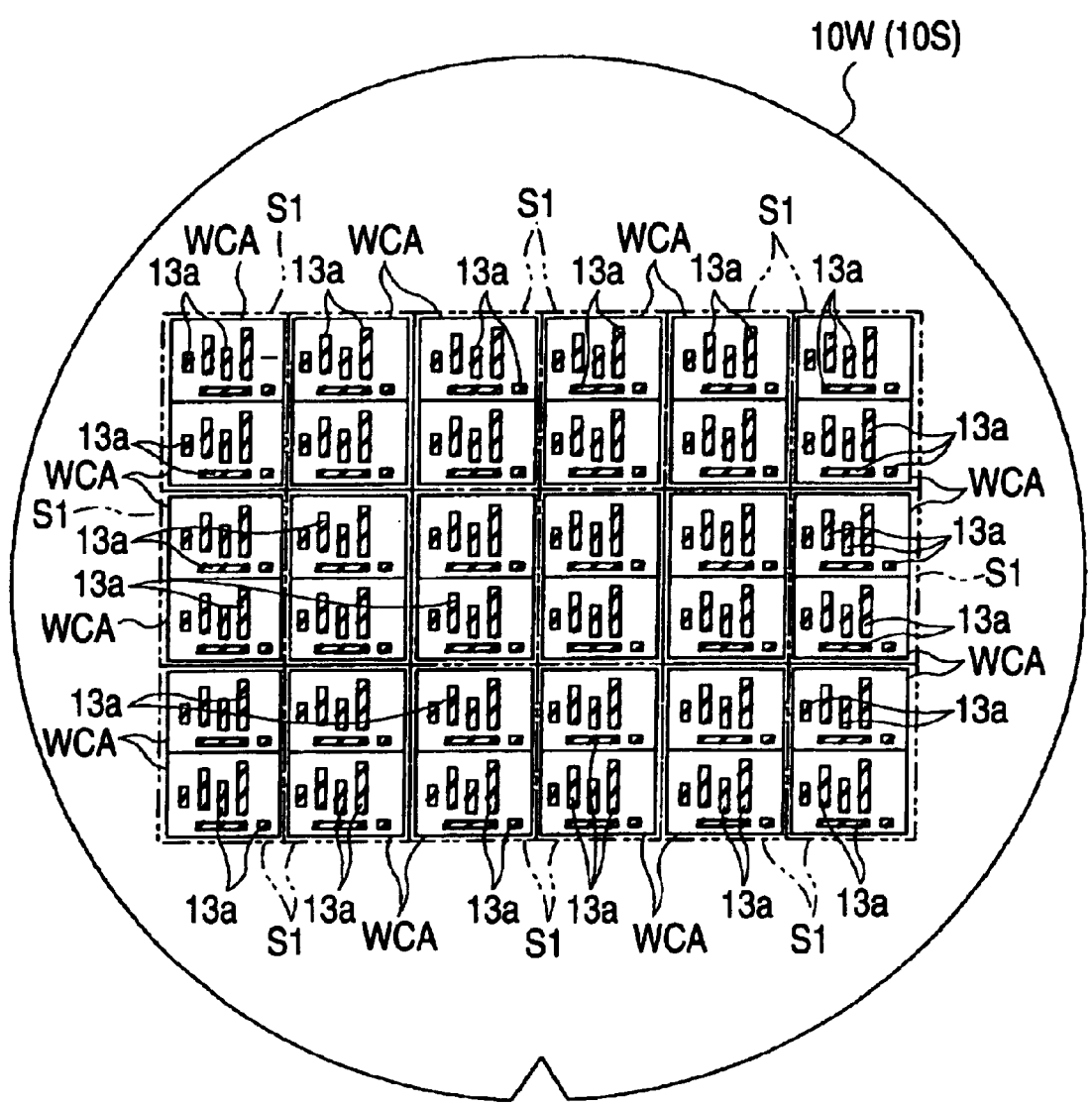
FIG. 39 is a whole plan view illustrating a semiconductor wafer after exposure processing using a masking blade.
Figure 40:
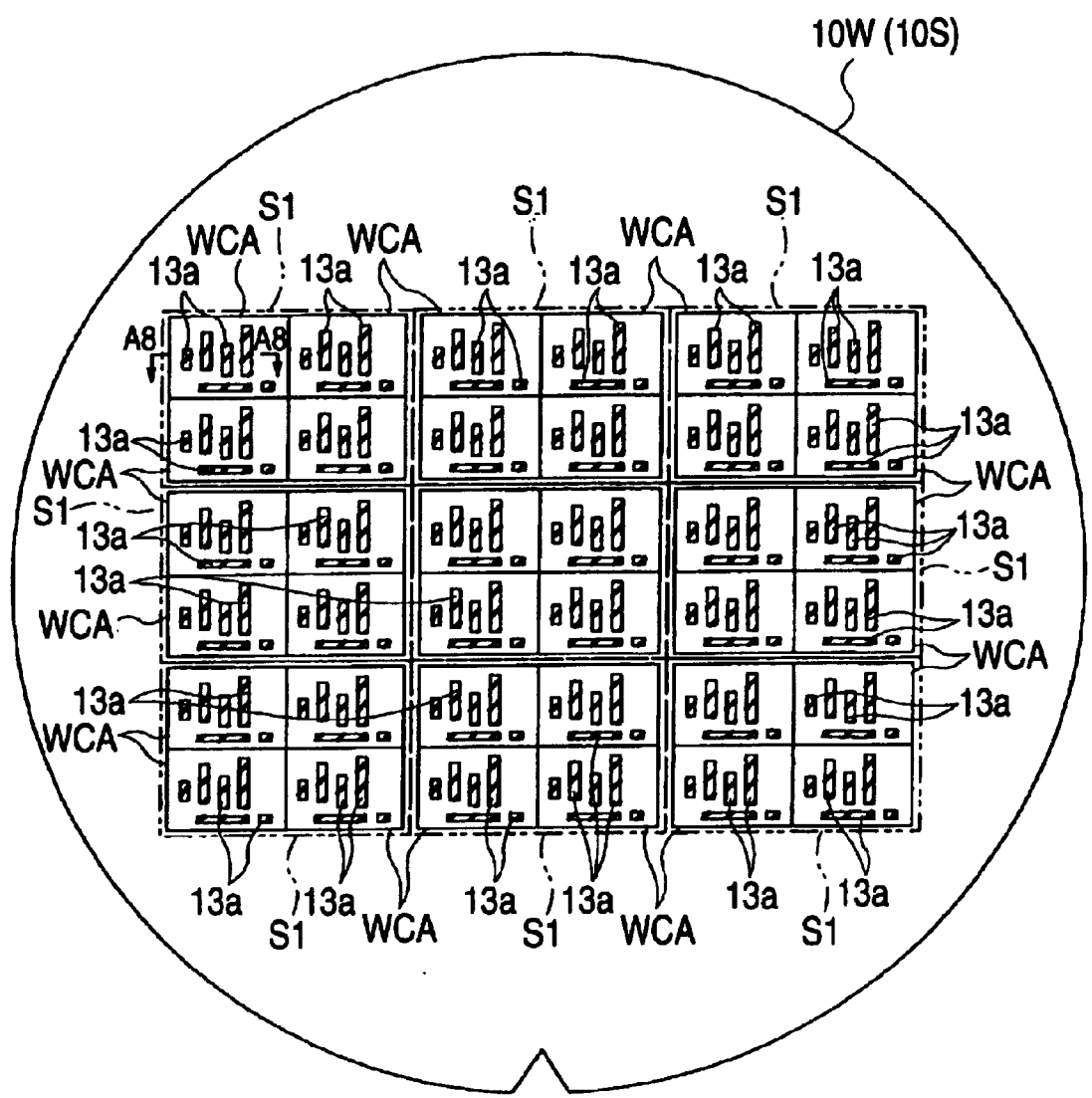
FIG. 40 is a whole plan view illustrating a semiconductor wafer after exposure processing using a multiple exposure method.
Figure 41:
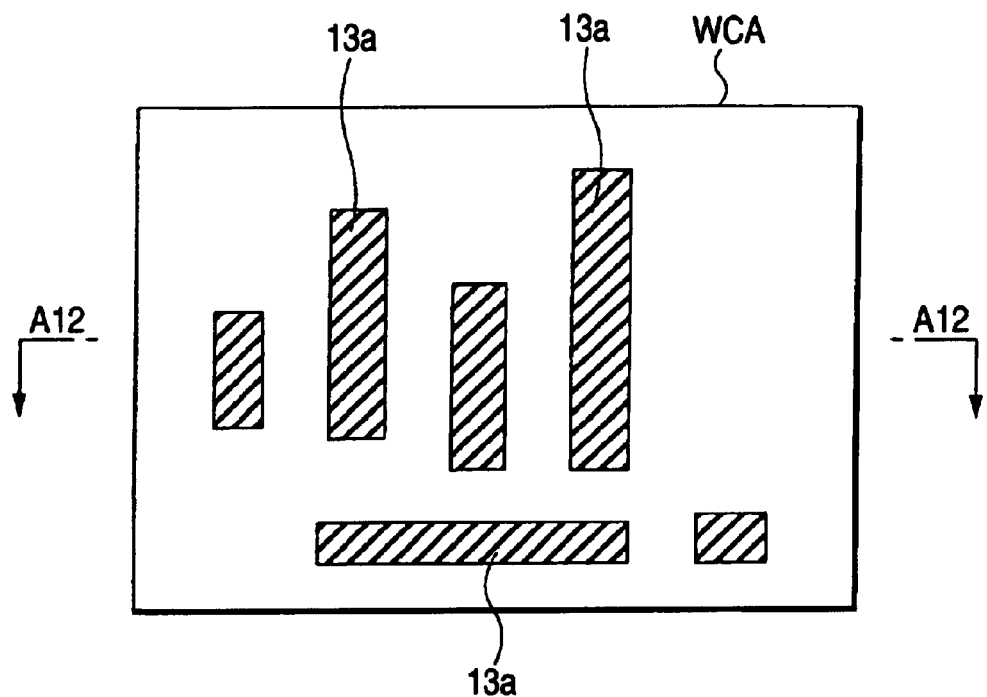
FIG. 41(a) is an enlarged plan view illustrating a principal part of FIG. 39(a) or 40(a)
FIG. 41(b) is a section of a line A12—A12 shown in FIG. 41(a)
Figure 41:
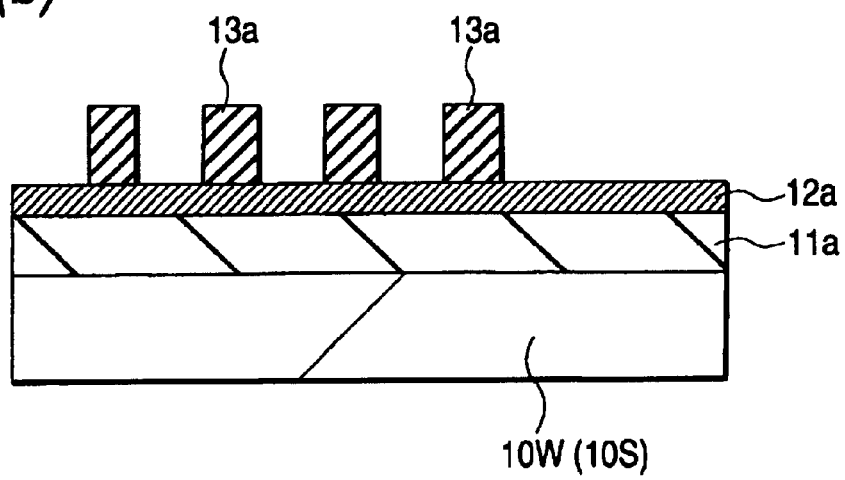
Figure 42:
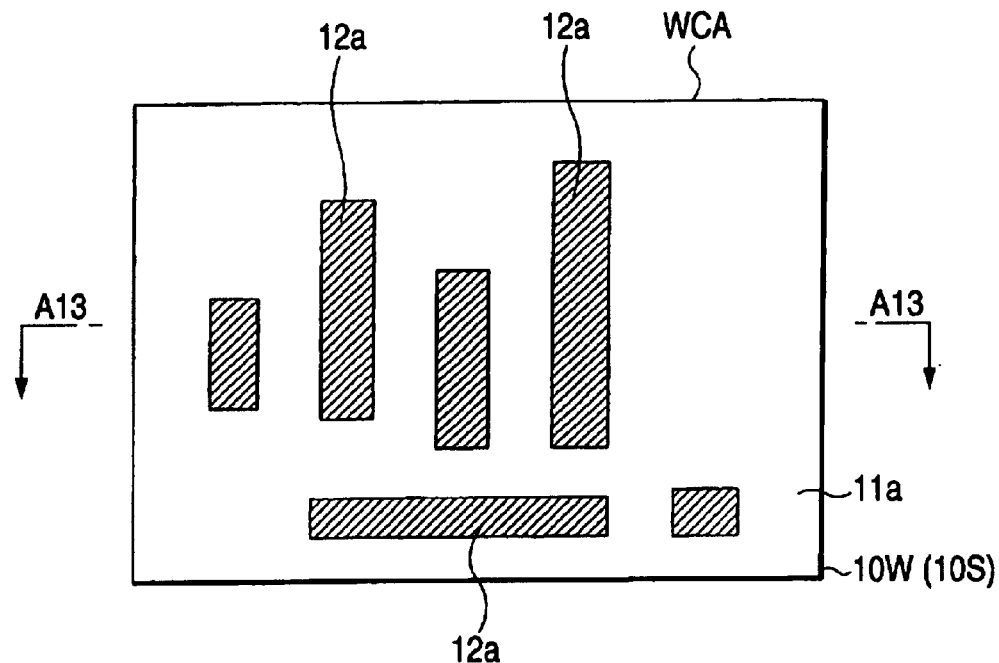
FIG. 42(a) is a plan view illustrating a principle part of the semiconductor wafer during the fabrication process following FIGS. 39(a) to 41(b) and FIG. 42(b) is a section view taken along line A13—A13 in FIG. 42(a)
Figure 42:
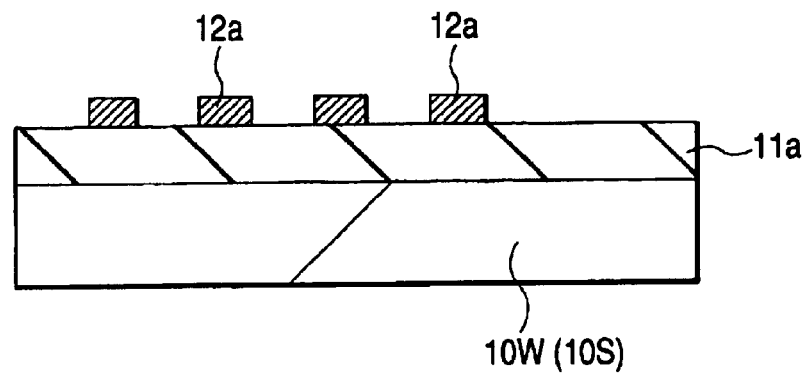

Subsequently, the resist film 13 on the main surface of the wafer is developed and thereby resist patterns 13a for transferring an integrated circuit pattern are formed on the wafer 10W as shown in FIGS. 39 to 41(b) (step 102d). FIG. 39 is a whole plan view illustrating the wafer 10W in the case of using a masking blade. FIG. 40 is a whole plan view illustrating a wafer 10W in the case of using the multiple exposure method. In addition, FIG. 41(a) is an enlarged plan view illustrating a principal part of the wafer 10W shown in FIGS. 39 and 40. FIG. 41(b) is a section view taken along line A12—A12 shown in FIG. 41(a).

When the masking blade is used, as shown in FIG. 28(a), there are two chip areas WCA to be exposed at one shot because two chip areas CA on the mask are shielded, for example. On the other hand, in the case of multiple exposures, there are four chip areas WCA to be exposed at one shot. Accordingly, it is more effective to select multiple exposures than the masking blade in terms of throughput. However, when there are defects that cannot be eliminated by multiple exposures, it is more effective to select the masking blade than to select mask repair or reproduction in terms of throughput.

Then, an underlying conductive film 12a is etched using the resist pattern 13a as an etching mask. Thereby, wirings comprised of the conductive film 12a are formed in the chip area WCA on the wafer 10W as shown in FIG. 42(a), which is a plan view illustrating a principal part of the wafer 10W. FIG. 42(b) is a section view taken along line A13—A13 in FIG. 42(a).

Next, one example of exposure systems used in the mask inspection and in exposure processing for forming the integrated circuit pattern will be described with reference to FIGS. 43 to 46. Additionally, only parts required for describing functions of the exposure system are shown in FIGS. 43 to 46, but parts necessary for other normal exposure systems (a scanner or stepper) are the same in a general range.

Figure 43:
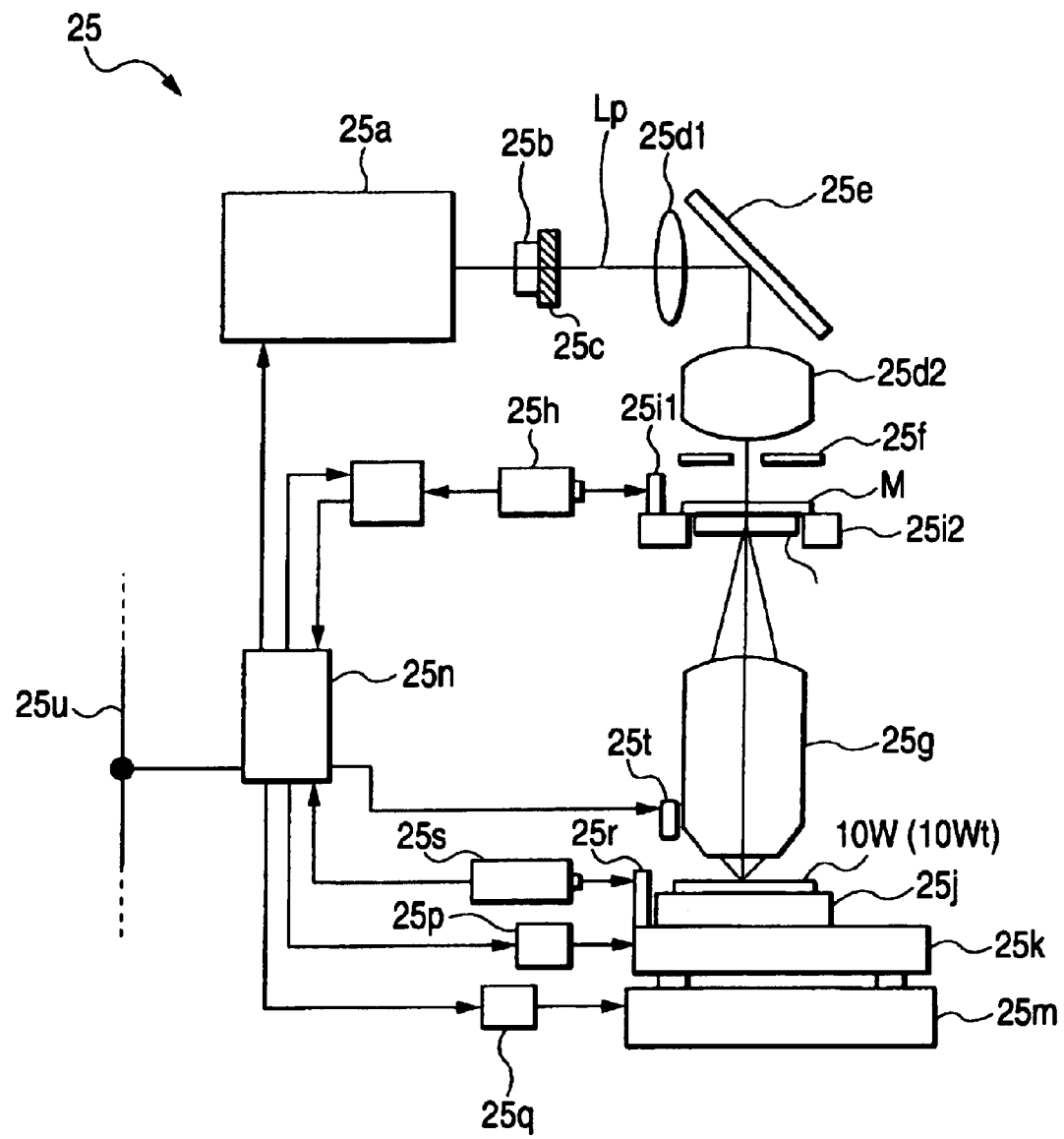
FIG. 43 is an schematic diagram showing one example of an exposure systems used in the processes for inspecting a mask and fabricating the semiconductor integrated circuit device shown in FIG. 1.

An exposure system 25 shown in FIG. 43 is a scanning reduced projection exposure system (hereafter called a scanner) of a reduction ratio of 4:1. The exposure conditions of the exposure system 25, for example, are as follows. More specifically, KrF excimer laser light having an exposing wavelength of about 248 nm is used as exposing light Lp, the numerical aperture NA of an optical lens is 0.65, the shape of illumination is circular, and the value of the coherency ($\sigma$: sigma) is 0.7, where the mask M is that exemplified in the masks NM1, NM2 and RM1 to RM5. However, the exposing light Lp is not limited to that described above, which can be modified variously; for example, an ArF excimer laser having a wavelength of about 193 nm may be used.

Light emitted from an exposing light source 25a illuminates a mask (a reticle here) M through a fly eye lens 25b, an aperture 25c, condensing lenses 25d1 and 25d2 and a mirror 25e. Among the optical conditions, the coherency was adjusted by changing dimensions of an opening of the aperture 25f. The mask M is mounted with a pellicle 5 for preventing pattern transfer failure due to attachment of foreign particles. A mask pattern drawn on the mask M is projected onto a wafer 10W (or a test wafer 10Wt, hereafter the same) to be a sample substrate through a projection lens 25g. Additionally, the mask M is placed on a mask stage 25i2 (including the mask mounting part 6) which is controlled by a mask position control unit 25h and a mirror 25i1, and the center thereof is accurately aligned with the optical axis of the projection lens 25g.

The wafer 10W is vacuum chucked on a sample stage 25j. The sample stage 25j is placed on a Z-stage 25k movable in the optical axis direction of the projection lens 25g, that is, the direction orthogonal to the wafer placing surface of the sample stage 25j (z-direction), which is further placed on an XY-stage 25m movable in the direction parallel to the wafer placing surface of the sample stage 25j. The Z-stage 25k and the XY-stage 25m are driven by respective driving units 25p and 25q in response to control instructions from a main control system 25n and thus they can be moved to desired exposure positions. The wafer position is monitored accurately by a laser measuring machine 25s as a position of a mirror 25r fixed to the Z-stage 25k. Furthermore, the position of the surface of the wafer 10W is measured by a focal point detecting unit of the type provided in a normal exposure system has. The Z-state 25k is moved according to the measurement results, and thereby the surface of the wafer 10W is allowed to match the imaging plane of the projection lens 25g all the time.

The mask M and the wafer 10W are synchronously driven in accordance with a reduction ratio, and the mask pattern is reduced and transferred onto the wafer 10W as exposure areas are scanned over the mask M. At this time, the surface position of the wafer 10W is also dynamically driven and controlled by the aforesaid unit to scanning the wafer 10W. When a circuit pattern formed on the wafer 10W is overlaid with a circuit pattern on the mask M for exposure, the positions of the mark patterns formed on the wafer 10W are detected using an alignment detecting optical system 25t, and the wafer 10W is positioned based on the detection result for overlay and transfer. The main control system 25n is electrically connected to a network unit 25u, which allows remotely supervising a state of the exposure system 25.

Figure 44:
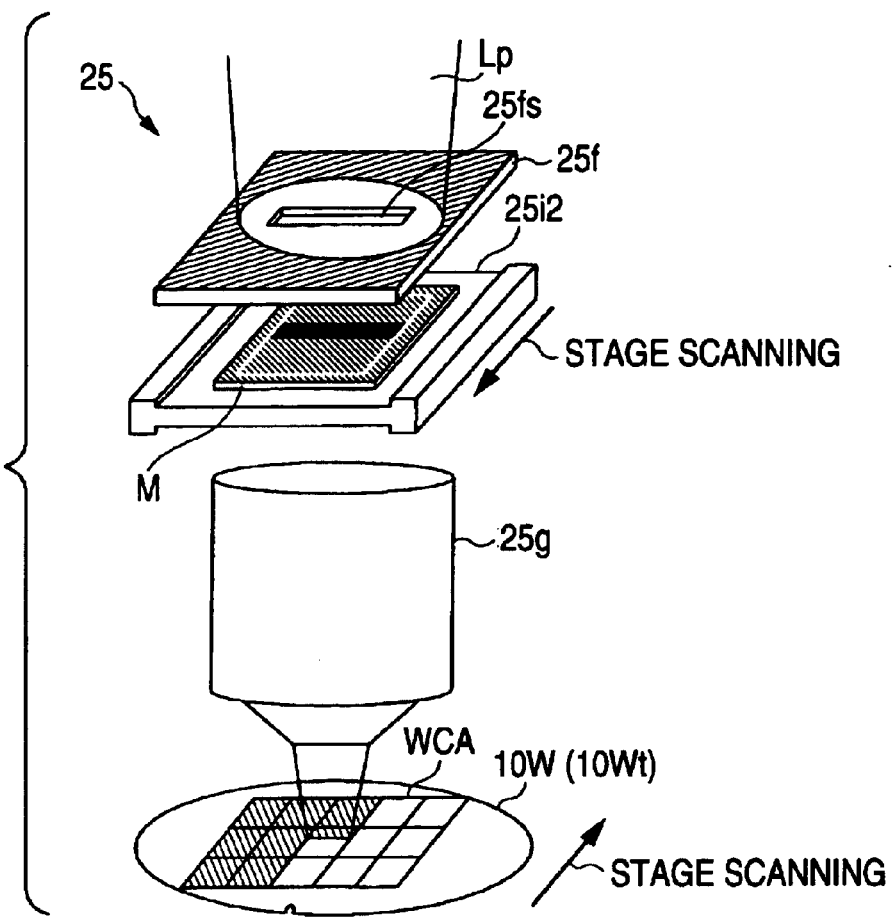
FIG. 44 is an diagram showing one example of an exposure method used in the exposure system shown in FIG. 43.

FIG. 44 is a diagram schematically illustrating the operation of scanning exposure of the exposure system 25. Since the mask M has a relationship of mirror symmetry with the wafer 10W, the direction of scanning the mask M is reverse to the direction of scanning the wafer 10W is scanned in the exposure processing, as indicated by directions of the arrows indicating stage scanning in FIG. 44. As the drive distance, the movement of the wafer 10W is one unit to the movement of the mask M of four units, when the reduction ratio is 4:1. At this time, exposing light Lp is irradiated onto the mask M through a slit 25fs and thereby a slit-like exposure area (exposure band) is formed. The slit-like exposure area is continuously moved (scanned) in the width direction of the slit 25fs, that is, in the direction orthogonal to or obliquely crossing the longitudinal direction of the slit 25fs on the mask M. It is further irradiated onto the main surface of the wafer 10W through an imaging optical system (projection lens 25g). Thereby, the mask pattern in the integrated circuit pattern area (chip area) of the mask M is transferred onto each of a plurality of chip areas WCA of the wafer 10W. Moreover, each of the chip areas WCA is an area for forming one semiconductor chip.

Figure 45:
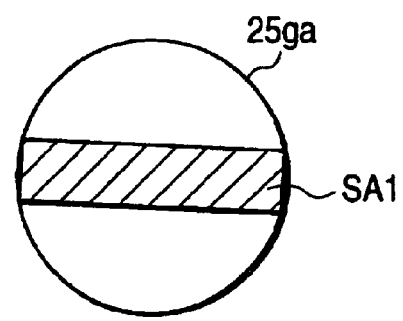
FIG. 45 is an diagram showing an exposure area of a scanner.

The aperture 25f is formed with the planar rectangular slit 25fs, and the exposing light Lp is irradiated onto the mask M through the slit 25fs. More specifically, in the exposure system 25, a slit-like exposure area (indicated by cross-hatching in FIG. 45 for easily understanding of the drawing) SA1 included in an effective exposure area 25ga of the projection lens 25g is used as an effective exposure area, as shown in FIGS. 44 and 45. Accordingly, in the exposure system (scanner) 25, the slit-like exposure area SA1 is to be exposed. Although not limited specifically, the width of the slit 25fs is about four to seven mm, for example, on the wafer 10W in general.

Figure 46:
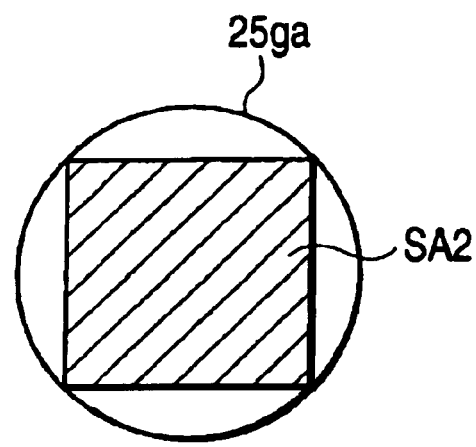
FIG. 46 is a diagram showing an exposure area of a stepper.

For comparison, FIG. 46 is an exposure area in a stepper. In the stepper, a planar square exposure area (it is indicated by cross-hatching in FIG. 46 for ease of understanding the drawing) SA2, whose four corners are abutted inside the effective exposure area 25ga of the projection lens is used as an effective exposure area. In the stepper, patterns in the mask M are to undergo block exposure. In addition, the stepper may be used as described above.

Figure 47:
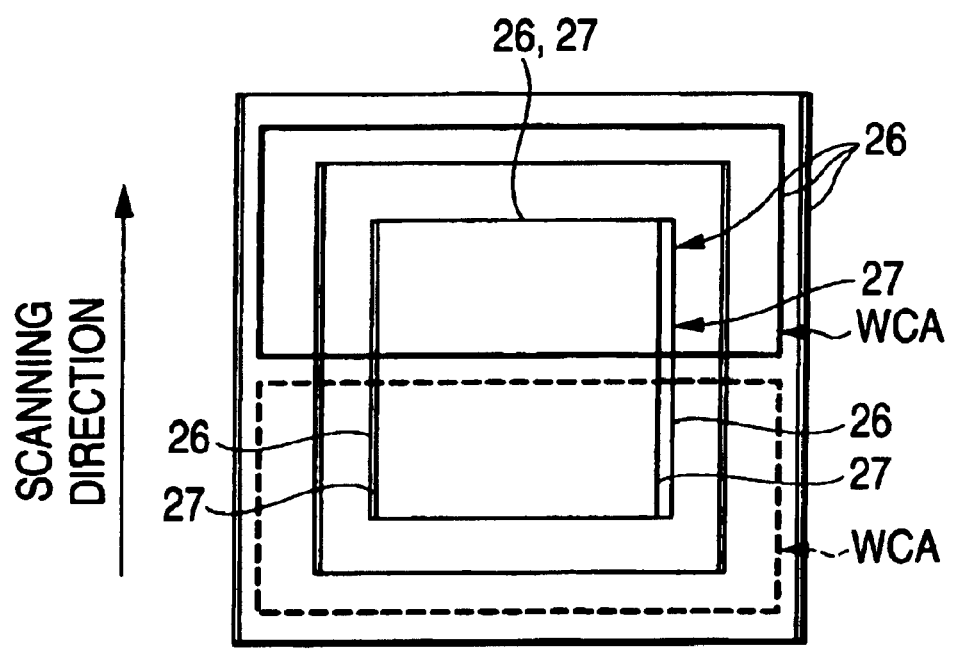
FIG. 47 is an diagram schematically showing a manner in which chip areas in different planar position coordinates on a photomask are transferred by using a scanner.

However, when the multiple exposures are performed, the scanner is preferably used. FIG. 47 depicts a state of pattern transfer when the scanner is used. A numeral 26 denotes a design pattern on an ideal grid, which is a rectangular pattern having no distortion. A numeral 26a denotes a side parallel to the scanning direction (the vertical direction in FIG. 47) in the design pattern 26. A numeral 26b denotes a side orthogonal to the scanning direction in the design pattern 26. In addition, the scanning direction here is the scanning direction of the projection lens, and a substrate to be exposed, such as a wafer, is to move in the direction opposite thereto. The numeral 27 denotes a transferred pattern actually transferred. The numeral 27a denotes a side parallel to the scanning direction in the in the transferred pattern 27. A numeral 27b denotes a side orthogonal to the scanning direction in the transferred pattern 27.

In exposure processing using the scanner, a misalignment is generated due to lens aberration in the direction orthogonal to the scanning direction (the transverse direction in FIG. 47), but the lens aberration becomes the same in the scanning direction, and thus the same shape can be held. For example, the side 27a parallel to the scanning direction in the transferred pattern 27 is noted in misalignment to the side 26a parallel to the scanning direction in the design pattern 26, but the amount of misalignment is equal in the scanning direction. Additionally, the side 27b orthogonal to the scanning direction in the transferred pattern 27 is almost overlaid with the side 26b orthogonal to the scanning direction in the design pattern 26, which is not noted in misalignment. That is, in exposure processing using the scanner, patterns in chip areas WCA and WCA have almost the same deformation in the direction orthogonal to the scanning direction and are formed into almost the same shape in the scanning direction. Accordingly, even though the chip areas WCA and WCA undergo double exposure onto the same areas on the substrate to be exposed, such as a wafer, patterns can be formed with high overlap accuracy.

Embodiment 2

In the embodiment, a method for fabricating a semiconductor integrated circuit device will be described using the result that a plurality of masks designed equally is produced and patterns are transferred onto a main surface of the same wafer using the plurality of masks for pattern inspection.

Figure 48:
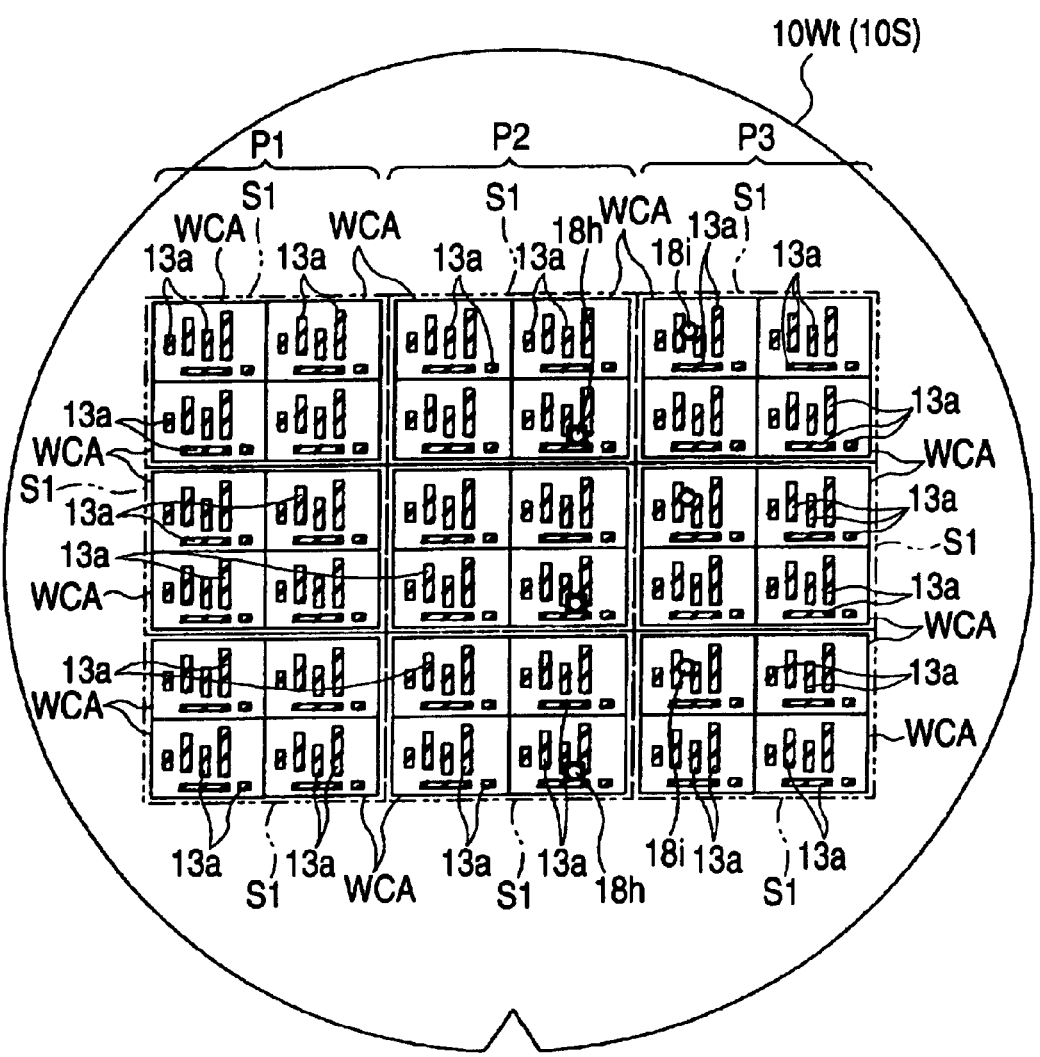
FIG. 48 is a whole plan view illustrating a test semiconductor wafer during a process for fabricating a semiconductor integrated circuit device according to another embodiment of the invention.

FIG. 48 is a state after patterns of a plurality (three, here) of masks equally designed are transferred onto a main surface of a test wafer 10Wt for development. The exposure method at this time may be the normal exposure method or multiple exposure method. In FIG. 48, a group of chip areas WCA in each of files P1 to P3 has been transferred using independent masks equally designed. In addition, when the multiple exposure method is used here, the number of overlay and exposure of each of the files P1 to P3 is set the same. A plurality of test wafers 10Wt are prepared and the number of overlay and exposure may be changed in every wafer 10Wt.

The acceptability of a resist pattern of the group of the chip areas WCA in each of the files P1 to P3 was inspected by comparing patterns in different chip areas WCA, similar to the embodiment 1. Consequently, defects 18h were detected in some chip areas WCA in the group of chip areas WCA in the file P2, and defects 18i were detected in some chip areas WCA in the group of chip areas WCA in the file P3.

Then, in the embodiment, a mask used for transferring patterns in the file P1 was adapted as a mask for product fabrication. Thereby, time for defect repair or reproduction of a mask can be saved as similar to the embodiment 1. Thus, delay in a delivery period of a mask can be eliminated and QTAT in the semiconductor integrated circuit device could be realized. Accordingly, also in this case, it is particularly effective for products having a problem of reducing time that a client provides mask data to complete semiconductor integrated circuit devices, such as ASICs. Additionally, when a resist mask is used, defect repair of a mask can be eliminated and time losses due to defect repair becomes unnecessary. Thus, the excellent characteristics of the resist mask can be exerted sufficiently. Furthermore, a defect repair system for masks (normal masks and resist masks) can be eliminated and equipment investment for mask fabrication can be suppressed to a minimum. Therefore, mask costs can be reduced. Accordingly, costs for a semiconductor integrated circuit device can be reduced.

Embodiment 3

In the embodiment, a method for fabricating a semiconductor integrated circuit device will be described using the result that the number of overlay and exposure processes is changed in every area in a main surface of the same wafer for exposure and the patterns are inspected when the multiple exposure method is used.

Figure 49:
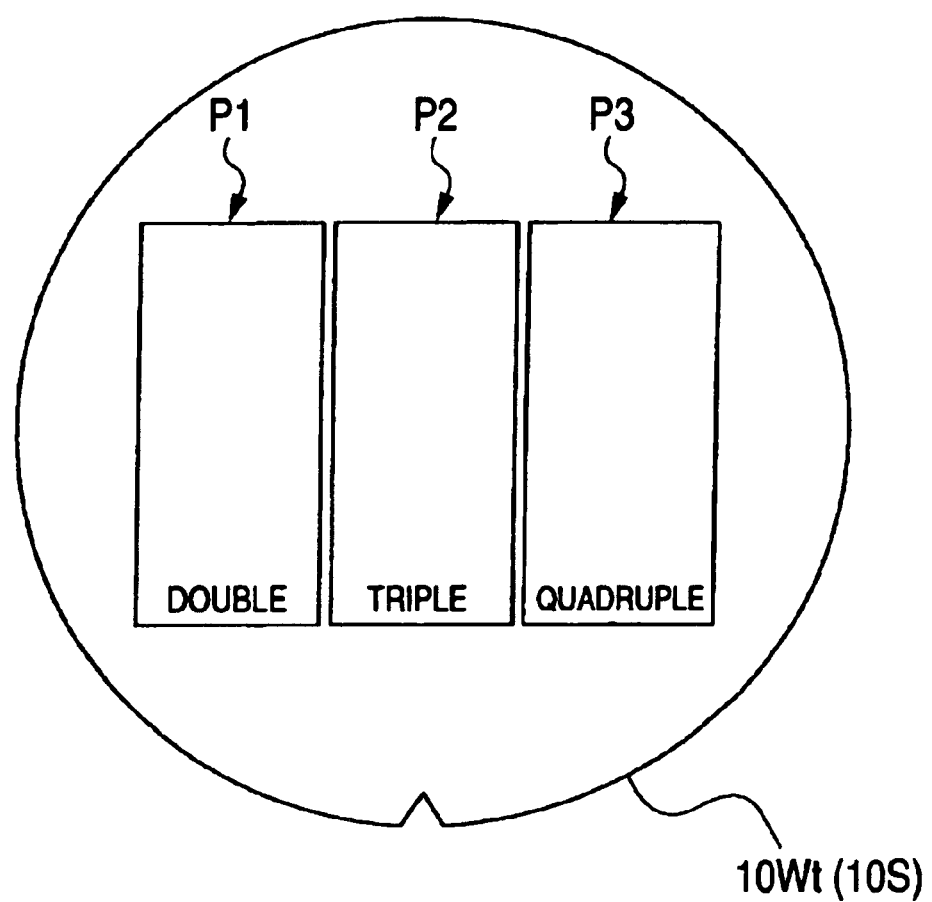
FIG. 49 is a whole plan view illustrating a test semiconductor wafer when a multiple exposure method is adopted during a process for fabricating a semiconductor integrated circuit device according to still another embodiment of the invention.

FIG. 49 is a state after the same mask has been exposed as the number of overlay and exposure processes was changed at each of files P1 to P3 in a main surface of a test wafer 10Wt for development. The file P1 underwent double exposure, the file P2 underwent triple exposure and the file P3 underwent quadruple exposure.

The acceptability of a resist pattern in a group of chip areas in each of the files P1 to P3 is to be inspected by comparison of patterns in different chip areas, as similar to the embodiment 1. Consequently, a type of multiple exposures that eliminates defects is selected and is adopted as an exposure processing condition in transferring an actual integrated circuit pattern onto a wafer.

According to the embodiment, the following effect can be obtained in addition to the effect attained in the embodiment 2. For example, when the number of overlay and exposure processes is changed in every test wafer 10Wt, three test wafers 10Wt are needed in the example mentioned above.

Then, each of the three test wafers 10Wt has to undergo multiple exposures, development and defect inspection. On the other hand, according to the embodiment, one test wafer 10Wt can undergo inspections for a plurality of kinds of multiple exposure results, and thus the inspection time can be curtailed drastically.

As described above, the invention made by the inventors has been described specifically reference t with various embodiments. However, it is needless to say that the invention is not limited to the embodiments, which can be modified variously within the scope of the teachings, and not deviating therefrom.

For example, in the embodiments 1 to 3, the case of forming wiring having a normal structure has been described, but the invention is not limited thereto. The invention can also be adapted to the case of forming a so-called damascene wiring structure where trenches or via holes, for example, are formed in an insulating film and a conductive film having a main component such as copper is embedded inside thereof to form wiring.

In the description mentioned above, the invention made by the inventors has been described mainly in the case where it is adapted to the method for fabricating ASICs, the background of the utilizing field. However, the invention is not limited thereto, but can be adapted to semiconductor integrated circuit devices having a memory circuit such as a DRAM (Dynamic Random Access Memory), an SRAM (Static Random Access Memory) or a flash memory (EEPROM: Electric Erasable Programmable Read Only Memory), semiconductor integrated circuit devices having a logic circuit such as a microprocessor, or combined semiconductor integrated circuit devices where a memory circuit and a logic circuit are disposed on the same semiconductor substrate.

The followings effects are obtained by representative aspects of the invention disclosed in this application.

(1) According to one embodiment of the invention, a pattern in a plurality of chip areas of a photomask is transferred onto an internal area of a semiconductor wafer and chip areas including defects among the plurality of chip areas of the photomask are shielded with a light shielding body. Thereby, defect repair of the photomask can be eliminated, and time for defect repair can be saved. Thus, time for fabricating semiconductor integrated circuit devices can be shortened.

(2) According to one embodiment of the invention, a pattern in a plurality of chip areas of a photomask is transferred onto an internal area of a semiconductor wafer and chip areas including defects among the plurality of chip areas of the photomask are shielded with a light shielding body. Thereby, defect repair of the photomask can be eliminated and a system or work for defect repair can be unnecessary. Therefore, costs for a semiconductor integrated circuit device can be curtailed.

What is claimed is:

1. A fabrication method of a semiconductor integrated circuit device, comprising the steps of:
   (a) forming a light shielding pattern having a light shielding property to exposing light in a plurality of chip areas of a photomask; and
   (b) transferring the pattern in the plurality of chip areas of the photomask onto an internal area of a semiconductor wafer as chip areas including defects among the plurality of chip areas of the photomask are shielded with a masking blade.

2. The fabrication method of the semiconductor integrated circuit device according to claim 1, wherein the light shielding pattern is comprised of a metal film.

3. The fabrication method of the semiconductor integrated circuit device according to claim 1, wherein the light shielding pattern is comprised of an organic film.

4. The fabrication method of the semiconductor integrated circuit device according to claim 3, wherein the photomask has a light shielding pattern comprised of a metal film in a peripheral area around the chip areas.

5. The fabrication method of the semiconductor integrated circuit device according to claim 3, wherein the organic film configuring the light shielding pattern includes a layered film of a first organic film and a second organic film having photosensitivity.

6. A fabrication method of a semiconductor integrated circuit device, comprising the steps of:
   (a) forming a light shielding pattern comprised of an organic film having a light shielding property to exposing light in a plurality of chip areas of a photomask, each of the plurality of chip areas having a same pattern;
   (b) transferring the pattern in the plurality of chip areas of the photomask onto a first semiconductor wafer and then inspecting the pattern transferred onto the first semiconductor wafer; and
   (c) performing exposure so as not to transfer defects onto a second semiconductor wafer even though the photomask has the defects, utilizing a result of the inspection in transferring the pattern onto the second semiconductor wafer using the photomask.

7. The fabrication method of the semiconductor integrated circuit device according to claim 6, wherein in the step (c), the pattern in the plurality of chip areas of the photomask is transferred onto an internal area of the second semiconductor wafer as chip areas including defects among the plurality of chip areas of the photomask are shielded with a light shielding body.

8. The fabrication method of the semiconductor integrated circuit device according to claim 7, wherein said light shielding body is a masking blade.

9. The fabrication method of the semiconductor integrated circuit device according to claim 6, wherein in the step (c), the plurality of chip areas of the photomask is overlaid with the same location of the second semiconductor wafer for exposure.

10. The fabrication method of the semiconductor integrated circuit device according to claim 6, wherein in the step (c), any one of units is selected according to the result of the inspection, the units of:
   transferring the pattern in the plurality of chip areas of the photomask onto an internal area of the second semiconductor wafer as chip areas including defects among the plurality of chip areas of the photomask are shielded with a light shielding body; or
   overlaying the plurality of chip areas of the photomask with the same location of the second semiconductor wafer for exposure.

11. The fabrication method of the semiconductor integrated circuit device according to claim 10, wherein said light shielding body is a masking blade.

12. The fabrication method of the semiconductor integrated circuit device according to claim 6, wherein in the step (c), any one of units is selected according to the result of the inspection, the units of:
   transferring the pattern in the plurality of chip areas of the photomask onto an internal area of the second semiconductor wafer as chip areas including defects among the plurality of chip areas of the photomask are shielded with a light shielding body;

overlaying the plurality of chip areas of the photomask with the same location of the second semiconductor wafer for exposure;

repairing defects of the pattern in the chip areas of the photomask; or removing the light shielding pattern comprised of the organic film over the photomask to reproduce a photomask.

13. The fabrication method of the semiconductor integrated circuit device according to claim 12, wherein said light shielding body is a masking blade.

14. The fabrication method of the semiconductor integrated circuit device according to claim 6, wherein in the step (b), the plurality of chip areas of the photomask is overlaid with the same location of the first semiconductor wafer for exposure.

15. The fabrication method of the semiconductor integrated circuit device according to claim 14, wherein in the step (b), the number of overlay and exposure is changed variously to perform the inspection.

16. The fabrication method of the semiconductor integrated circuit device according to claim 15, wherein in the step (b), areas having a different number of overlay and exposure are disposed in a main surface of the first semiconductor wafer and each of the areas undergoes the inspection.

17. The fabrication method of the semiconductor integrated circuit device according to claim 15, wherein in the step (c), as a result of the inspection, performing exposure processing of the number of overlay and exposure determined that defects in the photomask are not to be transferred onto the second semiconductor wafer.

18. The fabrication method of the semiconductor integrated circuit device according to claim 6, wherein the light shielding pattern comprised of the organic film includes a layered film of a first organic film and a second organic film having photosensitivity.

19. The fabrication method of the semiconductor integrated circuit device according to claim 6, wherein the photomask has a light shielding pattern comprised of a metal film in a peripheral area around the chip areas.

20. A fabrication method of a semiconductor integrated circuit device, comprising the steps of:

(a) preparing a photomask disposed with a light shielding pattern comprised of an organic film having a light shielding property to exposing light in a plurality of chip areas disposed over a mask substrate, each of the plurality of chip areas having a same pattern;

(b) transferring a predetermined pattern onto a first semiconductor wafer by normal exposure using the photomask and then inspecting the predetermined pattern;

(c) transferring the predetermined pattern onto a second semiconductor wafer by normal exposure using the photomask when a result of the inspection determines that the pattern over the photomask has no defects; and (d) performing exposure so as not to transfer defects onto a second semiconductor wafer even though the photomask has the defects, utilizing a result of the inspection in transferring the pattern onto the second semiconductor wafer using the photomask when the result of the inspection determines that the pattern over the photomask has defects.

21. The fabrication method of the semiconductor integrated circuit device according to claim 20, wherein in the step (d), the pattern in the plurality of chip areas of the photomask is transferred onto an internal area of the second semiconductor wafer as chip areas including defects among the plurality of chip areas of the photomask are shielded with a light shielding body.

22. The fabrication method of the semiconductor integrated circuit device according to claim 21, wherein said light shielding body is a masking blade.

23. The fabrication method of the semiconductor integrated circuit device according to claim 20, wherein in the step (d), the plurality of chip areas of the photomask is overlaid with the same location of the second semiconductor wafer for exposure.

24. The fabrication method of the semiconductor integrated circuit device according to claim 20, wherein in the step (d), any one of units is selected according to the result of the inspection, the units of:

transferring the pattern in the plurality of chip areas of the photomask onto an internal area of the second semiconductor wafer as chip areas including defects among the plurality of chip areas of the photomask are shielded with a light shielding body; or overlaying the plurality of chip areas of the photomask with the same location of the second semiconductor wafer for exposure.

25. The fabrication method of the semiconductor integrated circuit device according to claim 24, wherein said light shielding body is a masking blade.

26. The fabrication method of the semiconductor integrated circuit device according to claim 20, wherein in the step (d), any one of units is selected according to the result of the inspection, the units of:

transferring the pattern in the plurality of chip areas of the photomask onto an internal area of the second semiconductor wafer as chip areas including defects among the plurality of chip areas of the photomask are shielded with a light shielding body;

overlaying the plurality of chip areas of the photomask with the same location of the second semiconductor wafer for exposure;

repairing defects of the pattern in the chip areas of the photomask; or removing the light shielding pattern comprised of the organic film over the photomask to reproduce a photomask.

27. The fabrication method of the semiconductor integrated circuit device according to claim 26, wherein said light shielding body is a masking blade.

28. The fabrication method of the semiconductor integrated circuit device according to claim 20, wherein in the step (b), the plurality of chip areas of the photomask is overlaid with the same location of the first semiconductor wafer for exposure.

29. The fabrication method of the semiconductor integrated circuit device according to claim 28, wherein in the step (b), the number of overlay and exposure is changed variously to perform the inspection.

30. The fabrication method of the semiconductor integrated circuit device according to claim 29, wherein in the step (b), areas having a different number of overlay and exposure are disposed in a main surface of the first semiconductor wafer and each of the areas undergoes the inspection.

31. The fabrication method of the semiconductor integrated circuit device according to claim 29, wherein in the step (d), as a result of the inspection, performing exposure processing of the number of overlay and exposure determined that defects of the photomask are not to be transferred onto the second semiconductor wafer.

32. The fabrication method of the semiconductor integrated circuit device according to claim 20, wherein the light shielding pattern comprised of the organic film includes a layered film of a first organic film and a second organic film having photosensitivity.

33. The fabrication method of the semiconductor integrated circuit device according to claim 20, wherein the photomask has a light shielding pattern comprised of a metal film in a peripheral area around the chip areas.

34. A fabrication method of a semiconductor integrated circuit device comprising the steps of:
  (a) preparing a plurality of photomasks disposed with a light shielding pattern having a light shielding property to exposing light in a plurality of chip areas disposed over a mask substrate, the plurality of photomasks being equally designed, each of the plurality of chip areas having a same pattern;
  (b) transferring the pattern in each of the photomasks onto a main surface of a first semiconductor wafer by normal exposure using the plurality of photomasks equally designed and then inspecting each of the patterns transferred by each of the photomasks; and
  (c) transferring the pattern onto a second semiconductor wafer using a photomask determined that there are no defects among the plurality of photomasks equally designed as a result of the inspection.

35. The fabrication method of the semiconductor integrated circuit device according to claim 34, wherein the light shielding pattern is comprised of a metal film.

36. The fabrication method of the semiconductor integrated circuit device according to claim 34, wherein the light shielding pattern is comprised of an organic film.

37. The fabrication method of the semiconductor integrated circuit device according to claim 36, wherein the photomask has a light shielding pattern comprised of a metal film in a peripheral area around the chip areas.

38. The fabrication method of the semiconductor integrated circuit device according to claim 36, wherein the light shielding pattern includes a layered film of a first organic film and a second organic film having photosensitivity.

39. The fabrication method of the semiconductor integrated circuit device according to claim 34, wherein in the step (b), the plurality of chip areas of each of the photomasks is overlaid with the same location of the first semiconductor wafer for exposure in each exposure processing using each of the plurality of the photomasks equally designed.

40. The fabrication method of the semiconductor integrated circuit device according to claim 39, wherein in the step (b), the number of overlay and exposure is changed variously to perform the inspection.

* * * * *